US011995381B2

(12) United States Patent
Cai et al.

(10) Patent No.: US 11,995,381 B2
(45) Date of Patent: May 28, 2024

(54) TWO-TIER CAPACITY PLANNING

(71) Applicant: SPLUNK INC., San Francisco, CA (US)

(72) Inventors: Jie Cai, Yangpu District (CN); Yang Cao, Shanghai (CN); Ning He, Shanghai (CN); Bing Pei, Hangzhou (CN); Xiaolu Ye, Shanghai (CN); Chong Yu, Suzhou (CN); Aiping Zhang, Shanghai (CN); Zhou Zhou, Shanghai (CN)

(73) Assignee: Splunk Inc., San Francisco, CA (US)

( * ) Notice: Subject to any disclaimer, the term of this patent is extended or adjusted under 35 U.S.C. 154(b) by 1116 days.

(21) Appl. No.: 16/455,455

(22) Filed: Jun. 27, 2019

(65) Prior Publication Data

US 2020/0342068 A1    Oct. 29, 2020

Related U.S. Application Data

(63) Continuation of application No. PCT/CN2019/084625, filed on Apr. 26, 2019.

(51) Int. Cl.
*G06F 30/20* (2020.01)
*G06F 8/77* (2018.01)
(Continued)

(52) U.S. Cl.
CPC ............ *G06F 30/20* (2020.01); *G06F 8/77* (2013.01); *G06F 9/455* (2013.01); *G06F 11/3428* (2013.01); *G06F 11/3447* (2013.01)

(58) Field of Classification Search
None
See application file for complete search history.

(56) References Cited

U.S. PATENT DOCUMENTS 8,260,603 B2    9/2012  Cherkasova et al.
2007/0005323 A1*  1/2007  Patzer ............ G01R 31/318357
                                                     703/14
(Continued)

FOREIGN PATENT DOCUMENTS

CN        104798049        7/2015

OTHER PUBLICATIONS

International Search Report and Written Opinion dated Feb. 1, 2020 in International Patent Application No. PCT/CN2019/084625.

*Primary Examiner* — Lewis A Bullock, Jr.
*Assistant Examiner* — Mark A Gooray
(74) *Attorney, Agent, or Firm* — Shook, Hardy & Bacon L.L.P.

(57) ABSTRACT

Computing devices, computer-readable storage media, and computer-implemented methods are disclosed for prediction of capacity. In a central tier, central-tier benchmark values are generated from benchmark testing performed on different test configurations in a reference execution environment. In a deployment tier, deployment-tier benchmark values are generated from benchmark testing performed on a baseline deployed configuration in many execution environments. A sizing model is learned from the central-tier benchmark values to predict execution platform requirements given a set of workload input parameters. A performance model is learned from the deployment-tier and the central-tier benchmark values to predict a performance delta value reflecting relative performance between a particular execution environment and the reference execution environment. The performance delta value is used to adjust predicted execution platform requirements to tailor the prediction to a particular execution environment. The predicted execution platform requirements can be deployed and tested to validate or tune the performance model.

30 Claims, 33 Drawing Sheets

(51) Int. Cl.
    *G06F 9/455*     (2018.01)
    *G06F 11/34*     (2006.01)

(56) References Cited

U.S. PATENT DOCUMENTS

| | | | |
|---|---|---|---|
| 2014/0089509 A1* | 3/2014 | Akolkar | H04L 41/147 |
| | | | 709/226 |
| 2014/0215471 A1 | 7/2014 | Cherkasova et al. | |
| 2015/0347282 A1* | 12/2015 | Wingfors | G06F 11/3664 |
| | | | 717/124 |
| 2016/0321352 A1* | 11/2016 | Patel | G06F 16/1734 |
| 2018/0089328 A1* | 3/2018 | Bath | G06F 16/22 |

* cited by examiner

FIG. 6A

| Data Summary | | | |
|---|---|---|---|
| Hosts (5) | Sources (8) | Sourcetypes (3) | |
| filter | | | |
| Host ⌄ | | Count ⌄ | Last Update ⌄ |
| mailsv | ⌄ | 9,829 | 4/29/14 1:32:47.000 PM |
| vendor_sales | ⌄ | 30,244 | 4/29/14 1:32:46.000 PM |
| www1 | ⌄ | 24,221 | 4/29/14 1:32:44.000 PM |
| www2 | ⌄ | 22,595 | 4/29/14 1:32:47.000 PM |
| www3 | ⌄ | 22,975 | 4/29/14 1:32:45.000 PM |

FIG. 6B

INCIDENT REVIEW DATSHBOARD 910

Incident Review | Actions▼

| Status: | Urgency: | Owner: | Title: |
|---|---|---|---|
| | high | | |

| Security domain: | Governance: | | Search: |
|---|---|---|---|
| | pci | | |

INCIDENT ATTRIBUTE FIELDS 911

✓ 225 matching events

☒ Hide   ⊕ Zoom out   ⊕ Zoom to selection   [✗] Deselect

[×] [i] [⊞] [▦] Save ▼   Linear scale ▼   1 bar = 1 hour

120 — — — 120
60 — — — 60

TIME RANGE FIELD 912 → 24 hour window ▼
- Last 15 minutes
- Last 60 minutes
- Last 4 hours
- Last 24 hours
- Last 7 days
- Last 30 days
- Last year
- Real-time
- Other
- All time
- Custom time...

4:00 AM Sun Aug 26 2012    6:00 AM    8:00 AM

TIMELINE 913

[Create ▼]

225 events in a 24 hour window (real-time) (from 11:29:20 AM August 25 to 11:29:20 AM August 26, 2012)

« prev | 1 | 2 3 4 5 6 7 8 9 10 | next »    | Edit selected events | Edit all 225 matching Select all | Unselect all

EVENTS LIST 914

| Select | Options | Time | Security Domain | Title | Urgency | Status | Owner | |
|---|---|---|---|---|---|---|---|---|
| ☐ | ▶ | 8/26/12 11:11:03.000 AM | Access ▼ | Insecure Or Cleartext Authentication Detected ▼ | ⊙ High ▼ | New ▼ | unassigned ▼ | View details |
| ☐ | ▶ | 8/26/12 11:10:07.000 AM | Access ▼ | Insecure Or Cleartext Authentication Detected ▼ | ⊙ High ▼ | New ▼ | unassigned ▼ | View details |
| ☐ | ▶ | 8/26/12 11:00:39.000 AM | Access ▼ | Account (bheiry) Deleted On (PROD-POS-001) ▼ | ⊙ High ▼ | New ▼ | unassigned ▼ | View details |
| ☐ | ▶ | 8/26/12 11:00:39.000 AM | Access ▼ | Account (beu) Deleted On (COREDEV-006) ▼ | ⊙ High ▼ | New ▼ | unassigned ▼ | View details |
| ☐ | ▶ | 8/26/12 11:00:39.000 AM | Access ▼ | Account (combs) Deleted On (HOST-005) ▼ | ⊙ High ▼ | New ▼ | unassigned ▼ | View details |
| ☐ | ▶ | 8/28/12 | Access ▼ | Account (wisner) Deleted On (BUSDEV-005) ▼ | ⊙ High ▼ | New ▼ | unassigned ▼ | View details |

Cluster Calculator

Use your benchmark result as the reference to predict the capability of your target specs.

| | | |
|---|---|---|
| CPU Model | Intel(R) Xeon(R) CPU E5-2686 v4 @ 2.30GHz ▼ | |
| | This machine: Intel(R) Xeon(R) CPU E5-2686 v4 @ 2.30GHz | |
| Cores | 8 ◄ ► | |
| | This machine: 8 | |
| Virtual Cores | 16 ◄ ► | |
| | This machine: 16 | |
| Physical Memory (MB) | 120665 ◄ ► | |
| | This machine: 120665 | |

[ Predict ]

Latest Test

Index Throughput ............ 22225
Search Count Per Day ...... 48960

FIG. 23

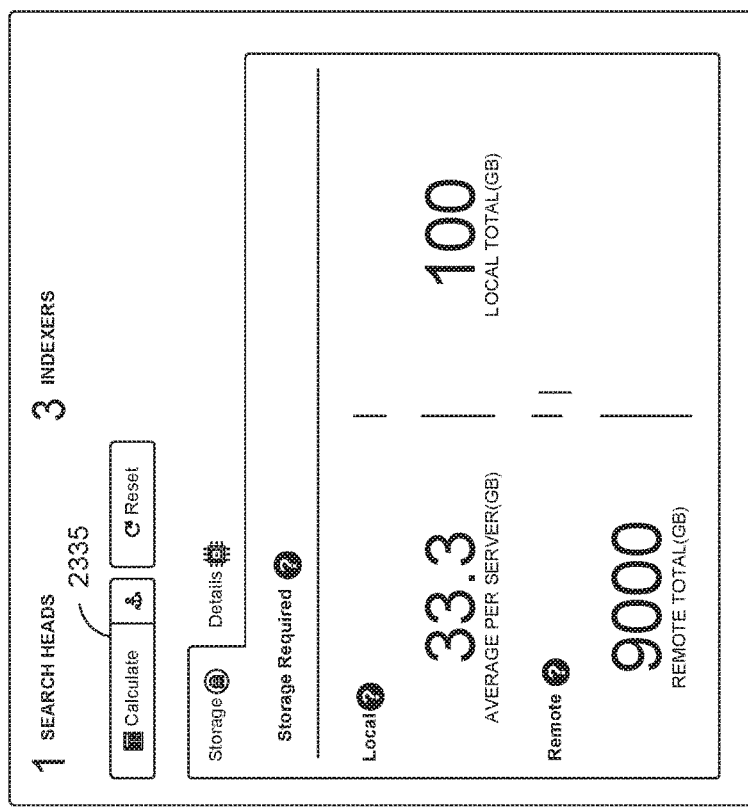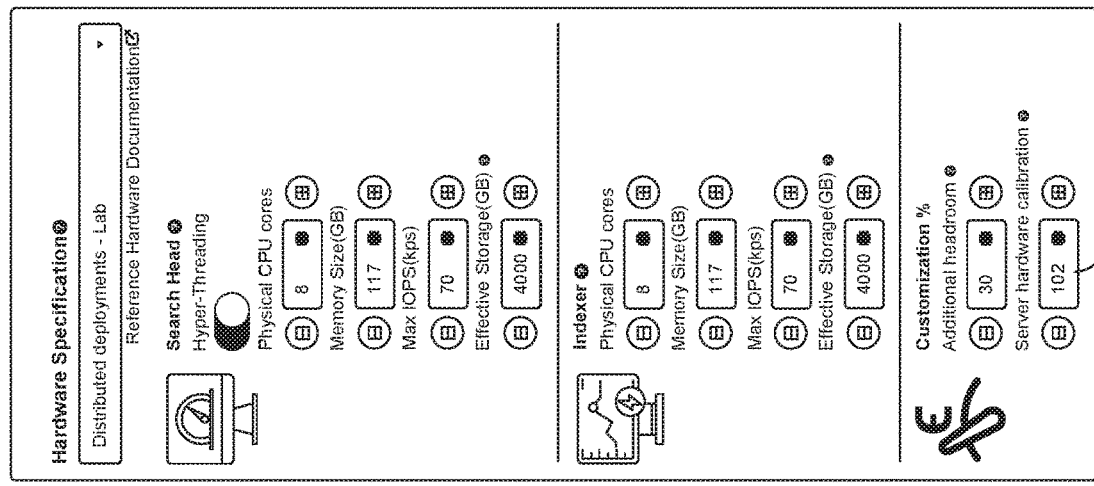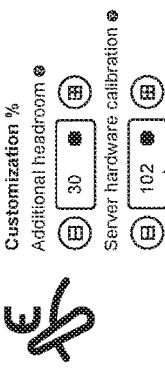
FIG. 24

TWO-TIER CAPACITY PLANNING

CROSS-REFERENCE TO RELATED APPLICATIONS

This application is a Continuation of International Application No. PCT/CN2019/084625 filed Apr. 26, 2019 and titled "Two-Tier Capacity Planning," the entire contents of which are incorporated by reference herein.

BACKGROUND

Modern data centers often include thousands of hosts that operate collectively to service requests from even larger numbers of remote clients. During operation, components of these data centers can produce significant volumes of raw, machine-generated data. In many cases, a user wishes to predict capacity for a particular execution environment.

SUMMARY

Disclosed herein are various examples directed to facilitating prediction of capacity, and, more specifically, execution platform requirements. In a central tier, central-tier benchmark values are generated from benchmark testing performed on different test configurations in a reference execution environment with reference hardware. In a deployment tier, deployment-tier benchmark values are generated from benchmark testing performed on a baseline deployed configuration in a number of execution environments that differ from the reference execution environment. A performance model is learned to support predictions made by a sizing model. The sizing model is learned from the central-tier benchmark values to predict execution platform requirements given a set of workload input parameters. The performance model is learned from the deployment-tier benchmark values and the central-tier benchmark values to predict a performance delta value reflecting the relative performance between a particular execution environment and the reference execution environment, given a set of execution platform input parameters. The performance delta value is used to adjust the predicted execution platform requirements to tailor the prediction to a particular execution environment. The predicted execution platform requirements can be deployed and tested to generate benchmark values that can be used to validate or tune the performance model.

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

BRIEF DESCRIPTION OF THE DRAWINGS

In the drawings:

FIG. 6A illustrates an example search screen;

FIG. 6B illustrates an example data summary dialog that enables a user to select various data sources;

FIG. 9B illustrates an example incident review dashboard;

FIGS. 15-17 illustrate example visualizations generated by a reporting application;

FIG. 23 depicts an example user interface that allows a user to predict a performance delta value and/or execution platform requirements;

FIG. 24 depicts an example user interface presenting inputs and outputs for a sizing calculator;

DETAILED DESCRIPTION

Figure 1:
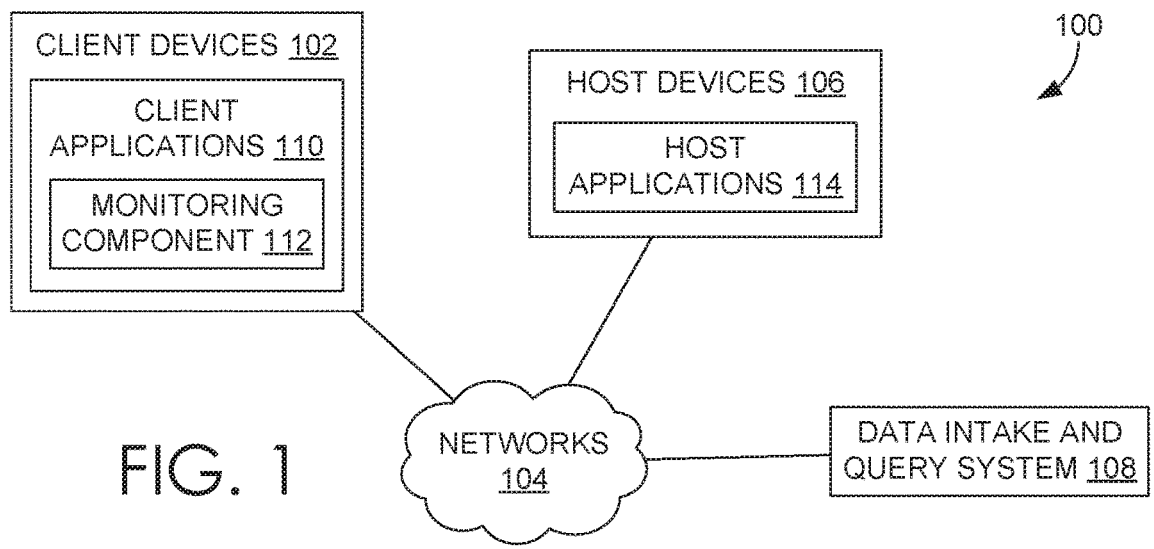
FIG. 1 includes a block diagram that illustrates an example of networked computer environment.

Various examples are described herein according to the following outline:
1.0. General Overview
2.0. Operating Environment
   2.1. Host Devices
   2.2. Client Devices
   2.3. Client Device Applications
   2.4. Data Server System
   2.5. Data Ingestion
      2.5.1. Input
      2.5.2. Parsing
      2.5.3. Indexing
   2.6. Query Processing
   2.7. Field Extraction 2.8. Example Search Screen
2.9. Data Modeling
2.10. Acceleration Techniques
2.10.1. Aggregation Technique
2.10.2. Keyword Index
2.10.3. High Performance Analytics Store
2.10.4. Accelerating Report Generation
2.11. Security Features
2.12. Data Center Monitoring
2.13. Cloud-Based System Overview
2.14. Searching Externally Archived Data
2.14.1. ERP Process Features
2.15. Cloud-Based Architecture
3.0. Overview of Facilitating Capacity Prediction
   3.1. Overview of a Capacity Prediction Tool in a Data Processing Environment
   3.2. Illustrative Capacity Prediction Operations
   3.3. Illustrative Hardware System
1.0 General Overview Modern data centers and other computing environments can comprise anywhere from a few host computer systems to thousands of systems configured to process data, service requests from remote clients, and perform numerous other computational tasks. During operation, various components within these computing environments often generate significant volumes of machine-generated data. For example, machine data is generated by various components in the information technology (IT) environments, such as servers, sensors, routers, mobile devices, Internet of Things (IoT) devices, etc. Machine-generated data can include system logs, network packet data, sensor data, application program data, error logs, stack traces, system performance data, etc. In general, machine-generated data can also include performance data, diagnostic information, and many other types of data that can be analyzed to diagnose performance problems, monitor user interactions, and to derive other insights.

A number of tools are available to analyze machine data, that is, machine-generated data. In order to reduce the size of the potentially vast amount of machine data that may be generated, many of these tools typically pre-process the data based on anticipated data-analysis needs. For example, pre-specified data items may be extracted from the machine data and stored in a database to facilitate efficient retrieval and analysis of those data items at search time. However, the rest of the machine data typically is not saved and discarded during pre-processing. As storage capacity becomes progressively cheaper and more plentiful, there are fewer incentives to discard these portions of machine data and many reasons to retain more of the data.

This plentiful storage capacity is presently making it feasible to store massive quantities of minimally processed machine data for later retrieval and analysis. In general, storing minimally processed machine data and performing analysis operations at search time can provide greater flexibility because it enables an analyst to search all of the machine data, instead of searching only a pre-specified set of data items. This may enable an analyst to investigate different aspects of the machine data that previously were unavailable for analysis.

However, analyzing and searching massive quantities of machine data presents a number of challenges. For example, a data center, servers, or network appliances may generate many different types and formats of machine data (e.g., system logs, network packet data (e.g., wire data, etc.), sensor data, application program data, error logs, stack traces, system performance data, operating system data, virtualization data, etc.) from thousands of different components, which can collectively be very time-consuming to analyze. In another example, mobile devices may generate large amounts of information relating to data accesses, application performance, operating system performance, network performance, etc. There can be millions of mobile devices that report these types of information.

These challenges can be addressed by using an event-based data intake and query system, such as the SPLUNK® ENTERPRISE system developed by Splunk Inc. of San Francisco, Calif. The SPLUNK® ENTERPRISE system is the leading platform for providing real-time operational intelligence that enables organizations to collect, index, and search machine-generated data from various websites, applications, servers, networks, and mobile devices that power their businesses. The SPLUNK® ENTERPRISE system is particularly useful for analyzing data which is commonly found in system log files, network data, and other data input sources. Although many of the techniques described herein are explained with reference to a data intake and query system similar to the SPLUNK® ENTERPRISE system, these techniques are also applicable to other types of data systems.

In the SPLUNK® ENTERPRISE system, machine-generated data are collected and stored as "events". An event comprises a portion of the machine-generated data and is associated with a specific point in time. For example, events may be derived from "time series data," where the time series data comprises a sequence of data points (e.g., performance measurements from a computer system, etc.) that are associated with successive points in time. In general, each event can be associated with a timestamp that is derived from the raw data in the event, determined through interpolation between temporally proximate events having known timestamps, or determined based on other configurable rules for associating timestamps with events, etc.

In some instances, machine data can have a predefined format, where data items with specific data formats are stored at predefined locations in the data. For example, the machine data may include data stored as fields in a database table. In other instances, machine data may not have a predefined format, that is, the data is not at fixed, predefined locations, but the data does have repeatable patterns and is not random. This means that some machine data can comprise various data items of different data types and that may be stored at different locations within the data. For example, when the data source is an operating system log, an event can include one or more lines from the operating system log containing raw data that includes different types of performance and diagnostic information associated with a specific point in time.

Examples of components which may generate machine data from which events can be derived include, but are not limited to, web servers, application servers, databases, firewalls, routers, operating systems, and software applications that execute on computer systems, mobile devices, sensors, Internet of Things (IoT) devices, etc. The data generated by such data sources can include, for example and without limitation, server log files, activity log files, configuration files, messages, network packet data, performance measurements, sensor measurements, etc.

The SPLUNK® ENTERPRISE system uses flexible schema to specify how to extract information from the event data. A flexible schema may be developed and redefined as needed. Note that a flexible schema may be applied to event data "on the fly," when it is needed (e.g., at search time, index time, ingestion time, etc.). When the schema is not applied to event data until search time it may be referred to as a "late-binding schema."

During operation, the SPLUNK® ENTERPRISE system starts with raw input data (e.g., one or more system logs, streams of network packet data, sensor data, application program data, error logs, stack traces, system performance data, etc.). The system divides this raw data into blocks (e.g., buckets of data, each associated with a specific time frame, etc.), and parses the raw data to produce timestamped events. The system stores the timestamped events in a data store. The system enables users to run queries against the stored data to, for example, retrieve events that meet criteria specified in a query, such as containing certain keywords or having specific values in defined fields. As used herein throughout, data that is part of an event is referred to as "event data". In this context, the term "field" refers to a location in the event data containing one or more values for a specific data item. As will be described in more detail herein, the fields are defined by extraction rules (e.g., regular expressions) that derive one or more values from the portion of raw machine data in each event that has a particular field specified by an extraction rule. The set of values so produced are semantically-related (such as IP address), even though the raw machine data in each event may be in different formats (e.g., semantically-related values may be in different positions in the events derived from different sources).

As noted above, the SPLUNK® ENTERPRISE system utilizes a late-binding schema to event data while performing queries on events. One aspect of a late-binding schema is applying "extraction rules" to event data to extract values for specific fields during search time. More specifically, the extraction rules for a field can include one or more instructions that specify how to extract a value for the field from the event data. An extraction rule can generally include any type of instruction for extracting values from data in events. In some cases, an extraction rule comprises a regular expression where a sequence of characters form a search pattern, in which case the rule is referred to as a "regex rule." The system applies the regex rule to the event data to extract values for associated fields in the event data by searching the event data for the sequence of characters defined in the regex rule.

In the SPLUNK® ENTERPRISE system, a field extractor may be configured to automatically generate extraction rules for certain field values in the events when the events are being created, indexed, or stored, or possibly at a later time. Alternatively, a user may manually define extraction rules for fields using a variety of techniques. In contrast to a conventional schema for a database system, a late-binding schema is not defined at data ingestion time. Instead, the late-binding schema can be developed on an ongoing basis until the time a query is actually executed. This means that extraction rules for the fields in a query may be provided in the query itself, or may be located during execution of the query. Hence, as a user learns more about the data in the events, the user can continue to refine the late-binding schema by adding new fields, deleting fields, or modifying the field extraction rules for use the next time the schema is used by the system. Because the SPLUNK® ENTERPRISE system maintains the underlying raw data and uses late-binding schema for searching the raw data, it enables a user to continue investigating and learn valuable insights about the raw data.

In some embodiments, a common field name may be used to reference two or more fields containing equivalent data items, even though the fields may be associated with different types of events that possibly have different data formats and different extraction rules. By enabling a common field name to be used to identify equivalent fields from different types of events generated by disparate data sources, the system facilitates use of a "common information model" (CIM) across the disparate data sources (further discussed with respect to FIG. 5).

2.0. Operating Environment

FIG. 1 includes a block diagram that illustrates an example networked computer system 100 in which an embodiment may be implemented. Those skilled in the art would understand that FIG. 1 represents one example of a networked computer system and other embodiments may use different arrangements.

The networked computer system 100 comprises one or more computing devices. These one or more computing devices comprise any combination of hardware and software configured to implement the various logical components described herein. For example, the one or more computing devices may include one or more memories that store instructions for implementing the various components described herein, one or more hardware processors configured to execute the instructions stored in the one or more memories, and various data repositories in the one or more memories for storing data structures utilized and manipulated by the various components.

In an embodiment, one or more client devices 102 are coupled to one or more host devices 106 and a data intake and query system 108 via one or more networks 104. Networks 104 broadly represent one or more LANs, WANs, cellular networks (e.g., LTE, HSPA, 3G, and other cellular technologies), and/or networks using any of wired, wireless, terrestrial microwave, or satellite links, and may include the public Internet.

2.1. Host Devices

In the illustrated embodiment, a system 100 includes one or more host devices 106. Host devices 106 may broadly include any number of computers, virtual machine instances, and/or data centers that are configured to host or execute one or more instances of host applications 114. In general, a host device 106 may be involved, directly or indirectly, in processing requests received from client devices 102. Each host device 106 may comprise, for example, one or more of a network device, a web server, an application server, a database server, etc. A collection of host devices 106 may be configured to implement a network-based service. For example, a provider of a network-based service may configure one or more host devices 106 and host applications 114 (e.g., one or more web servers, application servers, database servers, etc.) to collectively implement the network-based application.

In general, client devices 102 communicate with one or more host applications 114 to exchange information. The communication between a client device 102 and a host application 114 may, for example, be based on the Hypertext Transfer Protocol (HTTP) or any other network protocol. Content delivered from the host application 114 to a client device 102 may include, for example, HTML documents, media content, etc. The communication between a client device 102 and host application 114 may include sending various requests and receiving data packets. For example, in general, a client device 102 or application running on a client device may initiate communication with a host application 114 by making a request for a specific resource (e.g., based on an HTTP request), and the application server may respond with the requested content stored in one or more response packets.

In the illustrated embodiment, one or more of host applications 114 may generate various types of performance data during operation, including event logs, network data, sensor data, and other types of machine-generated data. For example, a host application 114 comprising a web server may generate one or more web server logs in which details of interactions between the web server and any number of client devices 102 is recorded. As another example, a host device 106 comprising a router may generate one or more router logs that record information related to network traffic managed by the router. As yet another example, a host application 114 comprising a database server may generate one or more logs that record information related to requests sent from other host applications 114 (e.g., web servers or application servers) for data managed by the database server.

2.2. Client Devices

Client devices 102 of FIG. 1 represent any computing device capable of interacting with one or more host devices 106 via a network 104. Examples of client devices 102 may include, without limitation, smart phones, tablet computers, handheld computers, wearable devices, laptop computers, desktop computers, servers, portable media players, gaming devices, and so forth. In general, a client device 102 can provide access to different content, for instance, content provided by one or more host devices 106, etc. Each client device 102 may comprise one or more client applications 110, described in more detail in a separate section hereinafter.

2.3. Client Device Applications

In an embodiment, each client device 102 may host or execute one or more client applications 110 that are capable of interacting with one or more host devices 106 via one or more networks 104. For instance, a client application 110 may be or comprise a web browser that a user may use to navigate to one or more websites or other resources provided by one or more host devices 106. As another example, a client application 110 may comprise a mobile application or "app." For example, an operator of a network-based service hosted by one or more host devices 106 may make available one or more mobile apps that enable users of client devices 102 to access various resources of the network-based service. As yet another example, client applications 110 may include background processes that perform various operations without direct interaction from a user. A client application 110 may include a "plug-in" or "extension" to another application, such as a web browser plug-in or extension.

In an embodiment, a client application 110 may include a monitoring component 112. At a high level, the monitoring component 112 comprises a software component or other logic that facilitates generating performance data related to a client device's operating state, including monitoring network traffic sent and received from the client device and collecting other device and/or application-specific information. Monitoring component 112 may be an integrated component of a client application 110, a plug-in, an extension, or any other type of add-on component. Monitoring component 112 may also be a stand-alone process.

In one embodiment, a monitoring component 112 may be created when a client application 110 is developed, for example, by an application developer using a software development kit (SDK). The SDK may include custom monitoring code that can be incorporated into the code implementing a client application 110. When the code is converted to an executable application, the custom code implementing the monitoring functionality can become part of the application itself.

In some cases, an SDK or other code for implementing the monitoring functionality may be offered by a provider of a data intake and query system, such as a system 108. In such cases, the provider of the system 108 can implement the custom code so that performance data generated by the monitoring functionality is sent to the system 108 to facilitate analysis of the performance data by a developer of the client application or other users.

In an embodiment, the custom monitoring code may be incorporated into the code of a client application 110 in a number of different ways, such as the insertion of one or more lines in the client application code that call or otherwise invoke the monitoring component 112. As such, a developer of a client application 110 can add one or more lines of code into the client application 110 to trigger the monitoring component 112 at desired points during execution of the application. Code that triggers the monitoring component may be referred to as a monitor trigger. For instance, a monitor trigger may be included at or near the beginning of the executable code of the client application 110 such that the monitoring component 112 is initiated or triggered as the application is launched, or included at other points in the code that correspond to various actions of the client application, such as sending a network request or displaying a particular interface.

In an embodiment, the monitoring component 112 may monitor one or more aspects of network traffic sent and/or received by a client application 110. For example, the monitoring component 112 may be configured to monitor data packets transmitted to and/or from one or more host applications 114. Incoming and/or outgoing data packets can be read or examined to identify network data contained within the packets, for example, and other aspects of data packets can be analyzed to determine a number of network performance statistics. Monitoring network traffic may enable information to be gathered particular to the network performance associated with a client application 110 or set of applications.

In an embodiment, network performance data refers to any type of data that indicates information about the network and/or network performance. Network performance data may include, for instance, a URL requested, a connection type (e.g., HTTP, HTTPS, etc.), a connection start time, a connection end time, an HTTP status code, request length, response length, request headers, response headers, connection status (e.g., completion, response time(s), failure, etc.), and the like. Upon obtaining network performance data indicating performance of the network, the network performance data can be transmitted to a data intake and query system 108 for analysis.

Upon developing a client application 110 that incorporates a monitoring component 112, the client application 110 can be distributed to client devices 102. Applications generally can be distributed to client devices 102 in any manner, or they can be pre-loaded. In some cases, the application may be distributed to a client device 102 via an application marketplace or other application distribution system. For instance, an application marketplace or other application distribution system might distribute the application to a client device based on a request from the client device to download the application.

Examples of functionality that enables monitoring performance of a client device are described in U.S. patent application Ser. No. 14/524,748, entitled "UTILIZING PACKET HEADERS TO MONITOR NETWORK TRAFFIC IN ASSOCIATION WITH A CLIENT DEVICE", filed on 27 Oct. 2014, and which is hereby incorporated by reference in its entirety for all purposes.

In an embodiment, the monitoring component 112 may also monitor and collect performance data related to one or more aspects of the operational state of a client application 110 and/or client device 102. For example, a monitoring component 112 may be configured to collect device performance information by monitoring one or more client device operations, or by making calls to an operating system and/or one or more other applications executing on a client device 102 for performance information. Device performance information may include, for instance, a current wireless signal strength of the device, a current connection type and network carrier, current memory performance information, a geographic location of the device, a device orientation, and any other information related to the operational state of the client device.

In an embodiment, the monitoring component 112 may also monitor and collect other device profile information including, for example, a type of client device, a manufacturer and model of the device, versions of various software applications installed on the device, and so forth.

In general, a monitoring component 112 may be configured to generate performance data in response to a monitor trigger in the code of a client application 110 or other triggering application event, as described above, and to store the performance data in one or more data records. Each data record, for example, may include a collection of field-value pairs, each field-value pair storing a particular item of performance data in association with a field for the item. For example, a data record generated by a monitoring component 112 may include a "networkLatency" field (not shown in the Figure) in which a value is stored. This field indicates a network latency measurement associated with one or more network requests. The data record may include a "state" field to store a value indicating a state of a network connection, and so forth for any number of aspects of collected performance data.

2.4. Data Server System

Figure 2:
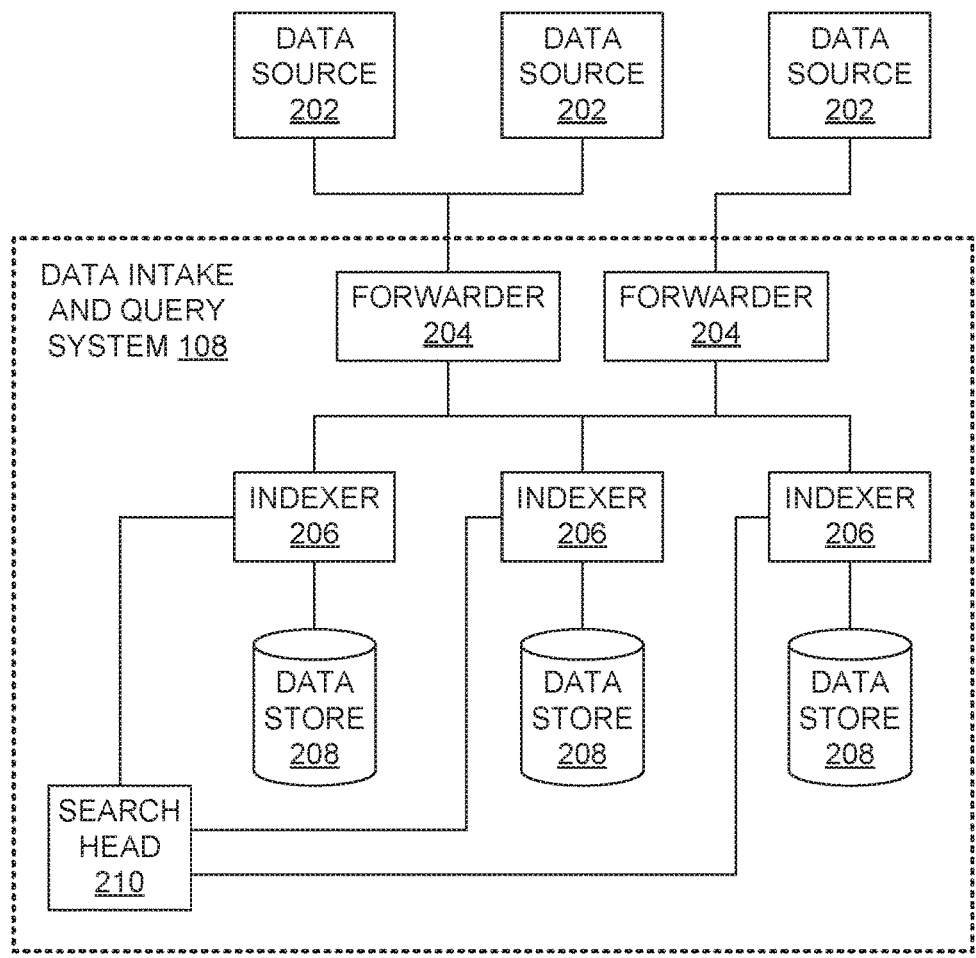
FIG. 2 illustrates a block diagram of an example data intake and query system.

FIG. 2 depicts a block diagram of an example data intake and query system 108, similar to the SPLUNK® ENTERPRISE system. System 108 includes one or more forwarders 204 that receive data from a variety of input data sources 202, and one or more indexers 206 that process and store the data in one or more data stores 208. These forwarders and indexers can comprise separate computer systems, or may alternatively comprise separate processes executing on one or more computer systems.

Each data source 202 broadly represents a distinct source of data that can be consumed by a system 108. Examples of a data source 202 include, without limitation, data files, directories of files, data sent over a network, event logs, registries, etc.

During operation, the forwarders 204 identify which indexers 206 receive data collected from a data source 202 and forward the data to the appropriate indexers. Forwarders 204 can also perform operations on the data before forwarding, including removing extraneous data, detecting timestamps in the data, parsing data, indexing data, routing data based on criteria relating to the data being routed, and/or performing other data transformations.

In an embodiment, a forwarder 204 may comprise a service accessible to client devices 102 and host devices 106 via a network 104. For example, one type of forwarder 204 may be capable of consuming vast amounts of real-time data from a potentially large number of client devices 102 and/or host devices 106. The forwarder 204 may, for example, comprise a computing device which implements multiple data pipelines or "queues" to handle forwarding of network data to indexers 206. A forwarder 204 may also perform many of the functions that are performed by an indexer. For example, a forwarder 204 may perform keyword extractions on raw data or parse raw data to create events. A forwarder 204 may generate time stamps for events. Additionally or alternatively, a forwarder 204 may perform routing of events to indexers. Data store 208 may contain events derived from machine data from a variety of sources all pertaining to the same component in an IT environment, and this data may be produced by the machine in question or by other components in the IT environment.

2.5. Data Ingestion

Figure 3:
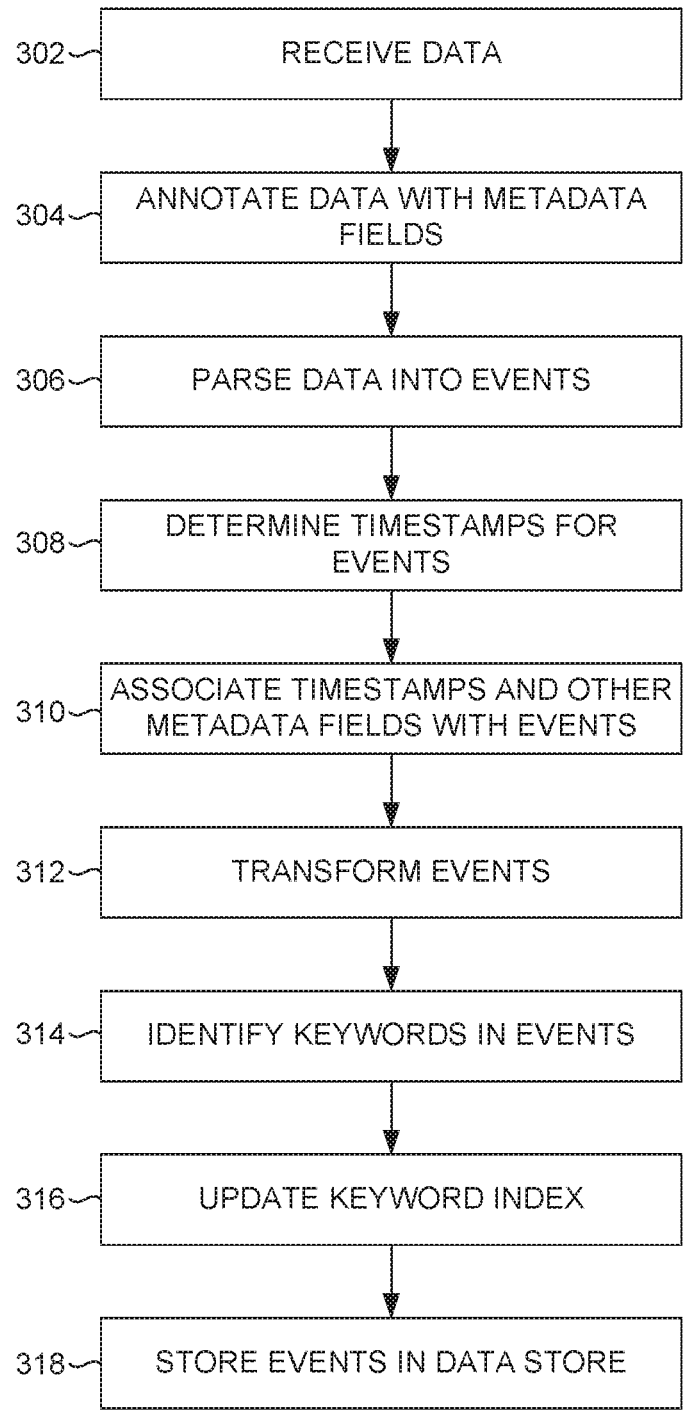
FIG. 3 is a flow diagram that illustrates an example of how indexers process, index, and store data received from forwarders.

FIG. 3 depicts a flow chart illustrating an example data flow performed by Data Intake and Query system 108, in accordance with the disclosed embodiments. The data flow illustrated in FIG. 3 is provided for illustrative purposes only; those skilled in the art would understand that one or more of the steps of the processes illustrated in FIG. 3 may be removed or the ordering of the steps may be changed. Furthermore, for the purposes of illustrating a clear example, one or more particular system components are described in the context of performing various operations during each of the data flow stages. For example, a forwarder is described as receiving and processing data during an input phase; an indexer is described as parsing and indexing data during parsing and indexing phases; and a search head is described as performing a search query during a search phase. However, other system arrangements and distributions of the processing steps across system components may be used.

2.5.1. Input

At block 302, a forwarder receives data from an input source, such as a data source 202 shown in FIG. 2. A forwarder initially may receive the data as a raw data stream generated by the input source. For example, a forwarder may receive a data stream from a log file generated by an application server, from a stream of network data from a network device, or from any other source of data. In one embodiment, a forwarder receives the raw data and may segment the data stream into "blocks", or "buckets," possibly of a uniform data size, to facilitate subsequent processing steps.

At block 304, a forwarder or other system component annotates each block generated from the raw data with one or more metadata fields. These metadata fields may, for example, provide information related to the data block as a whole and may apply to each event that is subsequently derived from the data in the data block. For example, the metadata fields may include separate fields specifying each of a host, a source, and a source type related to the data block. A host field may contain a value identifying a host name or IP address of a device that generated the data. A source field may contain a value identifying a source of the data, such as a pathname of a file or a protocol and port related to received network data. A source type field may contain a value specifying a particular source type label for the data. Additional metadata fields may also be included during the input phase, such as a character encoding of the data, if known, and possibly other values that provide information relevant to later processing steps. In an embodiment, a forwarder forwards the annotated data blocks to another system component (typically an indexer) for further processing.

The SPLUNK® ENTERPRISE system allows forwarding of data from one SPLUNK® ENTERPRISE instance to another, or even to a third-party system. SPLUNK® ENTERPRISE system can employ different types of forwarders in a configuration.

In an embodiment, a forwarder may contain the essential components needed to forward data. It can gather data from a variety of inputs and forward the data to a SPLUNK® ENTERPRISE server for indexing and searching. It also can tag metadata (e.g., source, source type, host, etc.).

Additionally or optionally, in an embodiment, a forwarder has the capabilities of the aforementioned forwarder as well as additional capabilities. The forwarder can parse data before forwarding the data (e.g., associate a time stamp with a portion of data and create an event, etc.) and can route data based on criteria such as source or type of event. It can also index data locally while forwarding the data to another indexer.

2.5.2. Parsing

At block 306, an indexer receives data blocks from a forwarder and parses the data to organize the data into events. In an embodiment, to organize the data into events, an indexer may determine a source type associated with each data block (e.g., by extracting a source type label from the metadata fields associated with the data block, etc.) and refer to a source type configuration corresponding to the identified source type. The source type definition may include one or more properties that indicate to the indexer to automatically determine the boundaries of events within the data. In general, these properties may include regular expression-based rules or delimiter rules where, for example, event boundaries may be indicated by predefined characters or character strings. These predefined characters may include punctuation marks or other special characters including, for example, carriage returns, tabs, spaces, line breaks, etc. If a source type for the data is unknown to the indexer, an indexer may infer a source type for the data by examining the structure of the data. Then, it can apply an inferred source type definition to the data to create the events.

At block 308, the indexer determines a timestamp for each event. Similar to the process for creating events, an indexer may again refer to a source type definition associated with the data to locate one or more properties that indicate instructions for determining a timestamp for each event. The properties may, for example, instruct an indexer to extract a time value from a portion of data in the event, to interpolate time values based on timestamps associated with temporally proximate events, to create a timestamp based on a time the event data was received or generated, to use the timestamp of a previous event, or use any other rules for determining timestamps.

At block 310, the indexer associates with each event one or more metadata fields including a field containing the timestamp (in some embodiments, a timestamp may be included in the metadata fields) determined for the event. These metadata fields may include a number of "default fields" that are associated with all events, and may also include one more custom fields as defined by a user. Similar to the metadata fields associated with the data blocks at block 304, the default metadata fields associated with each event may include a host, source, and source type field including or in addition to a field storing the timestamp.

At block 312, an indexer may optionally apply one or more transformations to data included in the events created at block 306. For example, such transformations can include removing a portion of an event (e.g., a portion used to define event boundaries, extraneous characters from the event, other extraneous text, etc.), masking a portion of an event (e.g., masking a credit card number), removing redundant portions of an event, etc. The transformations applied to event data may, for example, be specified in one or more configuration files and referenced by one or more source type definitions.

2.5.3. Indexing

At blocks 314 and 316, an indexer can optionally generate a keyword index to facilitate fast keyword searching for event data. To build a keyword index, at block 314, the indexer identifies a set of keywords in each event. At block 316, the indexer includes the identified keywords in an index, which associates each stored keyword with reference pointers to events containing that keyword (or to locations within events where that keyword is located, other location identifiers, etc.). When an indexer subsequently receives a keyword-based query, the indexer can access the keyword index to quickly identify events containing the keyword.

In some embodiments, the keyword index may include entries for name-value pairs found in events, where a name-value pair can include a pair of keywords connected by a symbol, such as an equals sign or colon. This way, events containing these name-value pairs can be quickly located. In some embodiments, fields can automatically be generated for some or all of the name-value pairs at the time of indexing. For example, if the string "dest=10.0.1.2" is found in an event, a field named "dest" may be created for the event, and assigned a value of "10.0.1.2".

At block 318, the indexer stores the events with an associated timestamp in a data store 208. Timestamps enable a user to search for events based on a time range. In one embodiment, the stored events are organized into "buckets," where each bucket stores events associated with a specific time range based on the timestamps associated with each event. This may not only improve time-based searching, but also allows for events with recent timestamps, which may have a higher likelihood of being accessed, to be stored in a faster memory to facilitate faster retrieval. For example, buckets containing the most recent events can be stored in flash memory rather than on a hard disk.

Each indexer 206 may be responsible for storing and searching a subset of the events contained in a corresponding data store 208. By distributing events among the indexers and data stores, the indexers can analyze events for a query in parallel. For example, using map-reduce techniques, each indexer returns partial responses for a subset of events to a search head that combines the results to produce an answer for the query. By storing events in buckets for specific time ranges, an indexer may further optimize data retrieval process by searching buckets corresponding to time ranges that are relevant to a query.

Moreover, events and buckets can also be replicated across different indexers and data stores to facilitate high availability and disaster recovery as described in U.S. patent application Ser. No. 14/266,812, entitled "SITE-BASED SEARCH AFFINITY", filed on 30 Apr. 2014, and in U.S. patent application Ser. No. 14/266,817, entitled "MULTI-SITE CLUSTERING", also filed on 30 Apr. 2014, each of which is hereby incorporated by reference in its entirety for all purposes.

2.6. Query Processing

Figure 4:
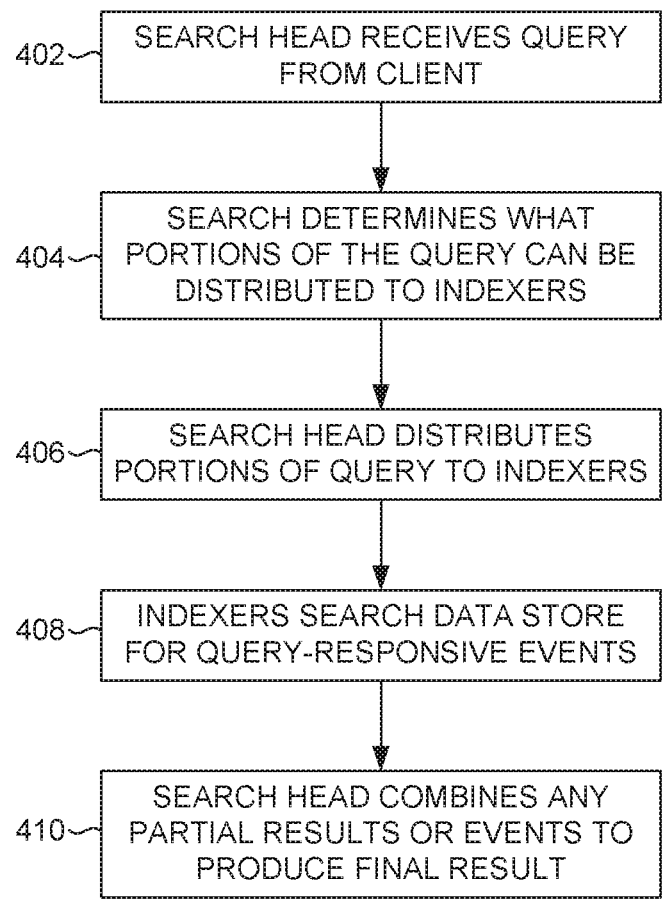
FIG. 4 is a flow diagram that illustrates an example of how a search head and indexers perform a search query.

FIG. 4 is a flow diagram that illustrates an example process that a search head and one or more indexers may perform during a search query. At block 402, a search head receives a search query from a client. At block 404, the search head analyzes the search query to determine what portion(s) of the query can be delegated to indexers and what portions of the query can be executed locally by the search head. At block 406, the search head distributes the determined portions of the query to the appropriate indexers. In an embodiment, a search head cluster may take the place of an independent search head where each search head in the search head cluster coordinates with peer search heads in the search head cluster to schedule jobs, replicate search results, update configurations, fulfill search requests, etc. In an embodiment, the search head (or each search head) communicates with a master node (also known as a cluster master, not shown in FIG. 4) that provides the search head with a list of indexers to which the search head can distribute the determined portions of the query. The master node maintains a list of active indexers and can also designate which indexers may have responsibility for responding to queries over certain sets of events. A search head may communicate with the master node before the search head distributes queries to indexers to discover the addresses of active indexers.

At block 408, the indexers to which the query was distributed, search data stores associated with them for events that are responsive to the query. To determine which events are responsive to the query, the indexer searches for events that match the criteria specified in the query. These criteria can include matching keywords or specific values for certain fields. The searching operations at block 408 may use the late-binding schema to extract values for specified fields from events at the time the query is processed. In an embodiment, one or more rules for extracting field values may be specified as part of a source type definition. The indexers may then either send the relevant events back to the search head, or use the events to determine a partial result, and send the partial result back to the search head.

At block 410, the search head combines the partial results and/or events received from the indexers to produce a final result for the query. This final result may comprise different types of data depending on what the query requested. For example, the results can include a listing of matching events returned by the query, or some type of visualization of the data from the returned events. In another example, the final result can include one or more calculated values derived from the matching events.

The results generated by the system 108 can be returned to a client using different techniques. For example, one technique streams results or relevant events back to a client in real-time as they are identified. Another technique waits to report the results to the client until a complete set of results (which may include a set of relevant events or a result based on relevant events) is ready to return to the client. Yet another technique streams interim results or relevant events back to the client in real-time until a complete set of results is ready, and then returns the complete set of results to the client. In another technique, certain results are stored as "search jobs" and the client may retrieve the results by referring the search jobs.

The search head can also perform various operations to make the search more efficient. For example, before the search head begins execution of a query, the search head can determine a time range for the query and a set of common keywords that all matching events include. The search head may then use these parameters to query the indexers to obtain a superset of the eventual results. Then, during a filtering stage, the search head can perform field-extraction operations on the superset to produce a reduced set of search results. This speeds up queries that are performed on a periodic basis.

2.7. Field Extraction

The search head 210 allows users to search and visualize event data extracted from raw machine data received from homogenous data sources. It also allows users to search and visualize event data extracted from raw machine data received from heterogeneous data sources. The search head 210 includes various mechanisms, which may additionally reside in an indexer 206, for processing a query. Splunk Processing Language (SPL), used in conjunction with the SPLUNK® ENTERPRISE system, can be utilized to make a query. SPL is a pipelined search language in which a set of inputs is operated on by a first command in a command line, and then a subsequent command following the pipe symbol "|" operates on the results produced by the first command, and so on for additional commands. Other query languages, such as the Structured Query Language ("SQL"), can be used to create a query.

In response to receiving the search query, search head 210 uses extraction rules to extract values for the fields associated with a field or fields in the event data being searched. The search head 210 obtains extraction rules that specify how to extract a value for certain fields from an event. Extraction rules can comprise regex rules that specify how to extract values for the relevant fields. In addition to specifying how to extract field values, the extraction rules may also include instructions for deriving a field value by performing a function on a character string or value retrieved by the extraction rule. For example, a transformation rule may truncate a character string, or convert the character string into a different data format. In some cases, the query itself can specify one or more extraction rules.

The search head 210 can apply the extraction rules to event data that it receives from indexers 206. Indexers 206 may apply the extraction rules to events in an associated data store 208. Extraction rules can be applied to all the events in a data store, or to a subset of the events that have been filtered based on some criteria (e.g., event time stamp values, etc.). Extraction rules can be used to extract one or more values for a field from events by parsing the event data and examining the event data for one or more patterns of characters, numbers, delimiters, etc., that indicate where the field begins and, optionally, ends.

Figure 5:
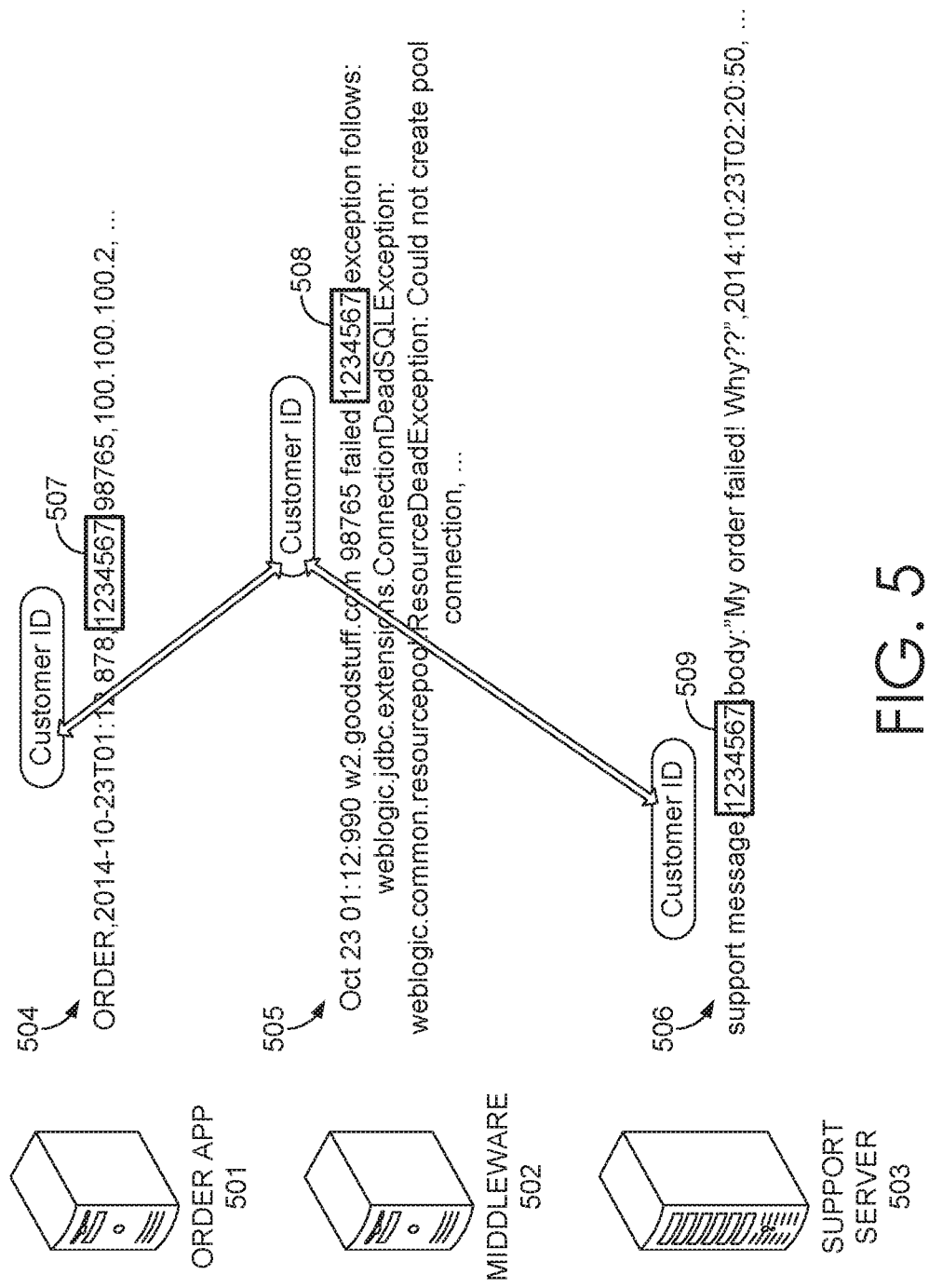
FIG. 5 illustrates a example scenario where a common customer ID is found among log data received from three disparate sources.

FIG. 5 illustrates an example of raw machine data received from disparate data sources. In this example, a user submits an order for merchandise using a vendor's shopping application program 501 running on the user's system. In this example, the order was not delivered to the vendor's server due to a resource exception at the destination server that is detected by the middleware code 502. The user then sends a message to the customer support 503 to complain about the order failing to complete. The three systems 501, 502, and 503 are disparate systems that do not have a common logging format. The order application 501 sends log data 504 to the SPLUNK® ENTERPRISE system in one format, the middleware code 502 sends error log data 505 in a second format, and the support server 503 sends log data 506 in a third format.

Using the log data received at one or more indexers 206 from the three systems the vendor can uniquely obtain an insight into user activity, user experience, and system behavior. The search head 210 allows the vendor's administrator to search the log data from the three systems that one or more indexers 206 are responsible for searching, thereby obtaining correlated information, such as the order number and corresponding customer ID number of the person placing the order. The system also allows the administrator to see a visualization of related events via a user interface. The administrator can query the search head 210 for customer ID field value matches across the log data from the three systems that are stored at the one or more indexers 206. The customer ID field value exists in the data gathered from the three systems, but the customer ID field value may be located in different areas of the data given differences in the architecture of the systems—there is a semantic relationship between the customer ID field values generated by the three systems. The search head 210 requests event data from the one or more indexers 206 to gather relevant event data from the three systems. It then applies extraction rules to the event data in order to extract field values that it can correlate. The search head may apply a different extraction rule to each set of events from each system when the event data format differs among systems. In this example, the user interface can display to the administrator the event data corresponding to the common customer ID field values 507, 508, and 509, thereby providing the administrator with insight into a customer's experience.

Note that query results can be returned to a client, a search head, or any other system component for further processing. In general, query results may include a set of one or more events, a set of one or more values obtained from the events, a subset of the values, statistics calculated based on the values, a report containing the values, or a visualization, such as a graph or chart, generated from the values.

2.8. Example Search Screen

Figure 6A:
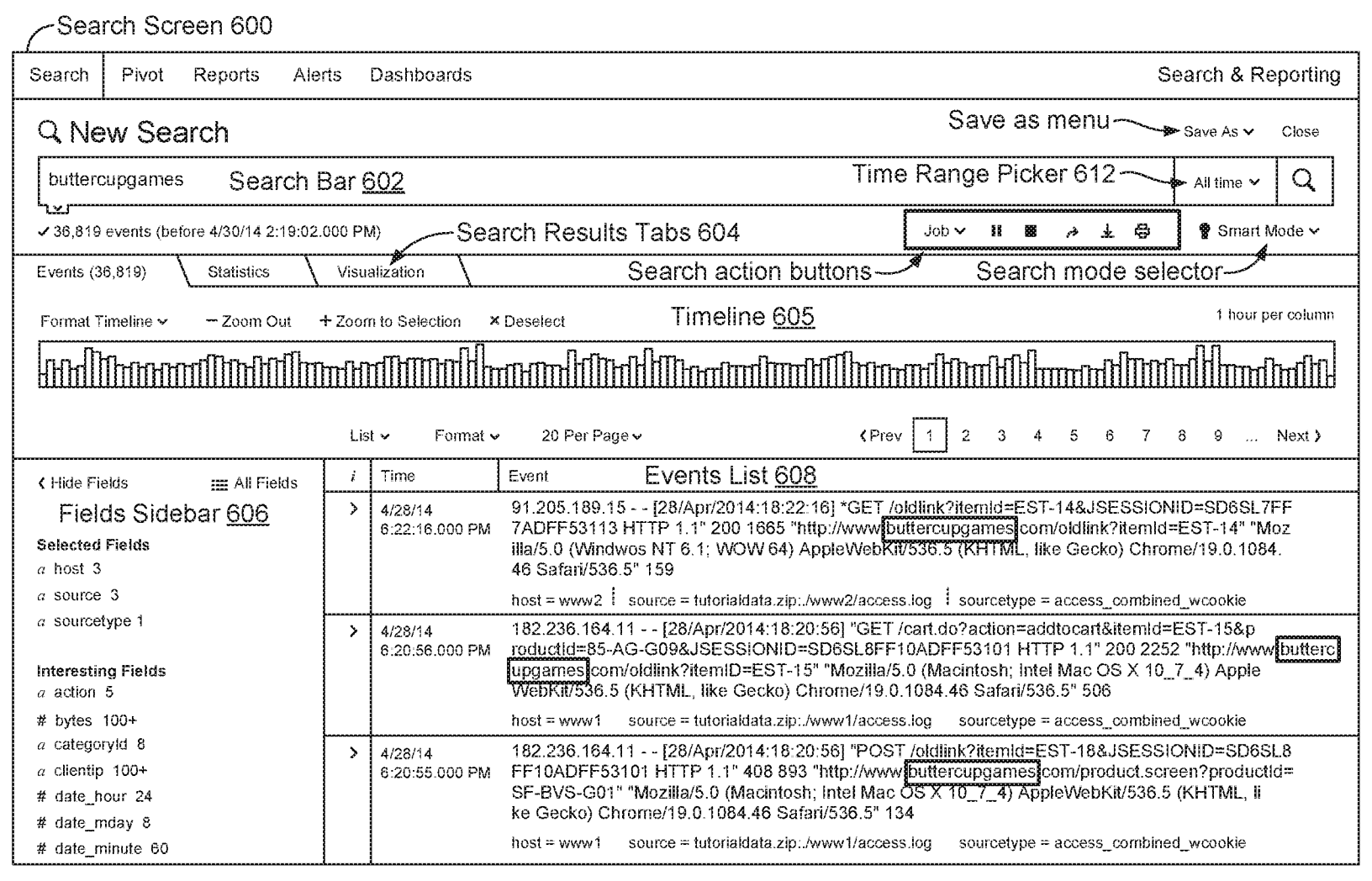

FIG. 6A illustrates an example search screen 600. Search screen 600 includes a search bar 602 that accepts user input in the form of a search string. It also includes a time range picker 612 that enables the user to specify a time range for the search. For "historical searches" the user can select a specific time range, or alternatively a relative time range, such as "today," "yesterday" or "last week." For "real-time searches," the user can select the size of a preceding time window to search for real-time events. Search screen 600 also initially displays a "data summary" dialog as is illustrated in FIG. 6B that enables the user to select different sources for the event data, such as by selecting specific hosts and log files.

After the search is executed, the search screen 600 in FIG. 6A can display the results through search results tabs 604, wherein search results tabs 604 includes: an "events tab" that displays various information about events returned by the search; a "statistics tab" that displays statistics about the search results; and a "visualization tab" that displays various visualizations of the search results. The events tab illustrated in FIG. 6A displays a timeline graph 605 that graphically illustrates the number of events that occurred in one-hour intervals over the selected time range. It also displays an events list 608 that enables a user to view the raw data in each of the returned events. It additionally displays a fields sidebar 606 that includes statistics about occurrences of specific fields in the returned events, including "selected fields" that are pre-selected by the user, and "interesting fields" that are automatically selected by the system based on pre-specified criteria.

2.9. Data Models

A data model is a hierarchically structured search-time mapping of semantic knowledge about one or more datasets. It encodes the domain knowledge necessary to build a variety of specialized searches of those datasets. Those searches, in turn, can be used to generate reports.

A data model is composed of one or more "objects" (or "data model objects") that define or otherwise correspond to a specific set of data.

Objects in data models can be arranged hierarchically in parent/child relationships. Each child object represents a subset of the dataset covered by its parent object. The top-level objects in data models are collectively referred to as "root objects."

Child objects have inheritance. Data model objects are defined by characteristics that mostly break down into constraints and attributes. Child objects inherit constraints and attributes from their parent objects and have additional constraints and attributes of their own. Child objects provide a way of filtering events from parent objects. Because a child object always provides an additional constraint in addition to the constraints it has inherited from its parent object, the dataset it represents is always a subset of the dataset that its parent represents.

For example, a first data model object may define a broad set of data pertaining to e-mail activity generally, and another data model object may define specific datasets within the broad dataset, such as a subset of the e-mail data pertaining specifically to e-mails sent. Examples of data models can include electronic mail, authentication, databases, intrusion detection, malware, application state, alerts, compute inventory, network sessions, network traffic, performance, audits, updates, vulnerabilities, etc. Data models and their objects can be designed by knowledge managers in an organization, and they can enable downstream users to quickly focus on a specific set of data. For example, a user can simply select an "e-mail activity" data model object to access a dataset relating to e-mails generally (e.g., sent or received), or select an "e-mails sent" data model object (or data sub-model object) to access a dataset relating to e-mails sent.

A data model object may be defined by (1) a set of search constraints, and (2) a set of fields. Thus, a data model object can be used to quickly search data to identify a set of events and to identify a set of fields to be associated with the set of events. For example, an "e-mails sent" data model object may specify a search for events relating to e-mails that have been sent, and specify a set of fields that are associated with the events. Thus, a user can retrieve and use the "e-mails sent" data model object to quickly search source data for events relating to sent e-mails, and may be provided with a listing of the set of fields relevant to the events in a user interface screen.

A child of the parent data model may be defined by a search (typically a narrower search) that produces a subset of the events that would be produced by the parent data model's search. The child's set of fields can include a subset of the set of fields of the parent data model and/or additional fields. Data model objects that reference the subsets can be arranged in a hierarchical manner, so that child subsets of events are proper subsets of their parents. A user iteratively applies a model development tool to prepare a query that defines a subset of events and assigns an object name to that subset. A child subset is created by further limiting a query that generated a parent subset. A late-binding schema of field extraction rules is associated with each object or subset in the data model.

Data definitions in associated schemas can be taken from the common information model (CIM) or can be devised for a particular schema and optionally added to the CIM. Child objects inherit fields from parents and can include fields not present in parents. A model developer can select fewer extraction rules than are available for the sources returned by the query that defines events belonging to a model. Selecting a limited set of extraction rules can be a tool for simplifying and focusing the data model, while allowing a user flexibility to explore the data subset. Development of a data model is further explained in U.S. Pat. Nos. 8,788,525 and 8,788,526, both entitled "DATA MODEL FOR MACHINE DATA FOR SEMANTIC SEARCH", both issued on 22 Jul. 2014, U.S. Pat. No. 8,983,994, entitled "GENERATION OF A DATA MODEL FOR SEARCHING MACHINE DATA", issued on 17 Mar. 2015, U.S. patent application Ser. No. 14/611,232, entitled "GENERATION OF A DATA MODEL APPLIED TO QUERIES", filed on 31 Jan. 2015, and U.S. patent application Ser. No. 14/815,884, entitled "GENERATION OF A DATA MODEL APPLIED TO OBJECT QUERIES", filed on 31 Jul. 2015, each of which is hereby incorporated by reference in its entirety for all purposes. See, also, Knowledge Manager Manual, Build a Data Model, Splunk Enterprise 6.1.3 pp. 150-204 (Aug. 25, 2014).

A data model can also include reports. One or more report formats can be associated with a particular data model and be made available to run against the data model. A user can use child objects to design reports with object datasets that already have extraneous data pre-filtered out. In an embodiment, the data intake and query system 108 provides the user with the ability to produce reports (e.g., a table, chart, visualization, etc.) without having to enter SPL, SQL, or other query language terms into a search screen. Data models are used as the basis for the search feature.

Data models may be selected in a report generation interface. The report generator supports drag-and-drop organization of fields to be summarized in a report. When a model is selected, the fields with available extraction rules are made available for use in the report. The user may refine and/or filter search results to produce more precise reports. The user may select some fields for organizing the report and select other fields for providing detail according to the report organization. For example, "region" and "salesperson" are fields used for organizing the report and sales data can be summarized (subtotaled and totaled) within this organization. The report generator allows the user to specify one or more fields within events and apply statistical analysis on values extracted from the specified one or more fields. The report generator may aggregate search results across sets of events and generate statistics based on aggregated search results. Building reports using the report generation interface is further explained in U.S. patent application Ser. No. 14/503,335, entitled "GENERATING REPORTS FROM UNSTRUCTURED DATA", filed on 30 Sep. 2014, and which is hereby incorporated by reference in its entirety for all purposes, and in Pivot Manual, Splunk Enterprise 6.1.3 (Aug. 4, 2014). Data visualizations also can be generated in a variety of formats, by reference to the data model. Reports, data visualizations, and data model objects can be saved and associated with the data model for future use. The data model object may be used to perform searches of other data.

FIGS. 12, 13, and 7A-7D illustrate a series of user interface screens where a user may select report generation options using data models. The report generation process may be driven by a predefined data model object, such as a data model object defined and/or saved via a reporting application or a data model object obtained from another source. A user can load a saved data model object using a report editor. For example, the initial search query and fields used to drive the report editor may be obtained from a data model object. The data model object that is used to drive a report generation process may define a search and a set of fields. Upon loading of the data model object, the report generation process may enable a user to use the fields (e.g., the fields defined by the data model object) to define criteria for a report (e.g., filters, split rows/columns, aggregates, etc.) and the search may be used to identify events (e.g., to identify events responsive to the search) used to generate the report. That is, for example, if a data model object is selected to drive a report editor, the graphical user interface of the report editor may enable a user to define reporting criteria for the report using the fields associated with the selected data model object, and the events used to generate the report may be constrained to the events that match, or otherwise satisfy, the search constraints of the selected data model object.

Figure 12:
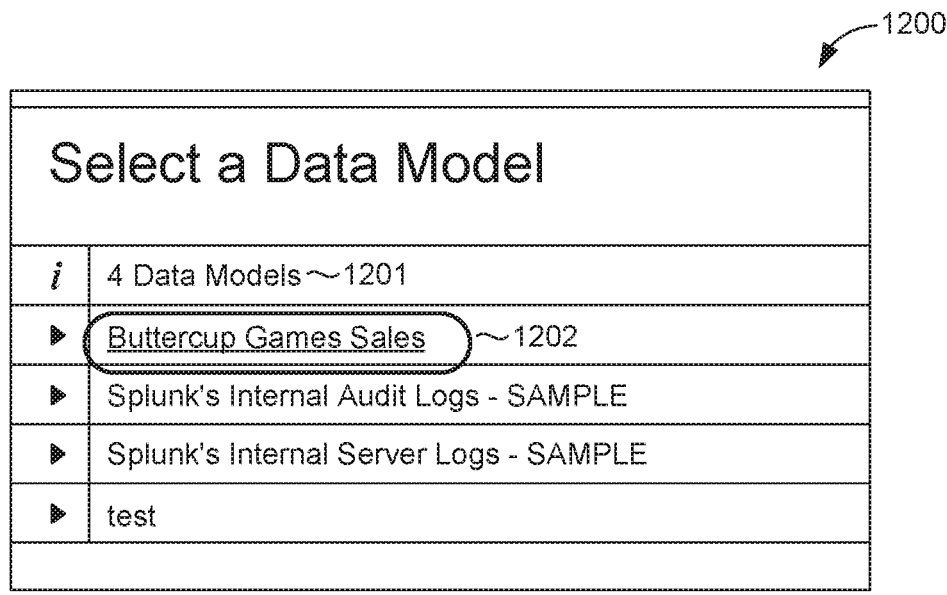
FIGS. 12-14 illustrate an example series of user interface screens for an example data model-driven report generation interface.

The selection of a data model object for use in driving a report generation may be facilitated by a data model object selection interface. FIG. 12 illustrates an example interactive data model selection graphical user interface 1200 of a report editor that displays a listing of available data models 1201. The user may select one of the data models 1202.

Figure 13:
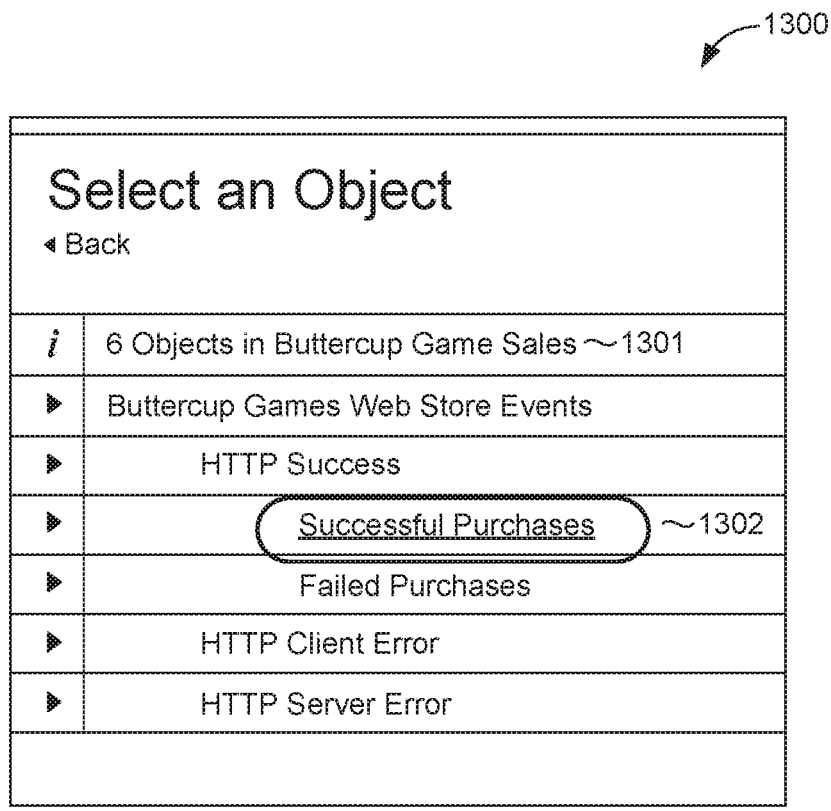

FIG. 13 illustrates an example data model object selection graphical user interface 1300 that displays available data objects 1301 for the selected data object model 1202. The user may select one of the displayed data model objects 1302 for use in driving the report generation process.

Figure 7A:
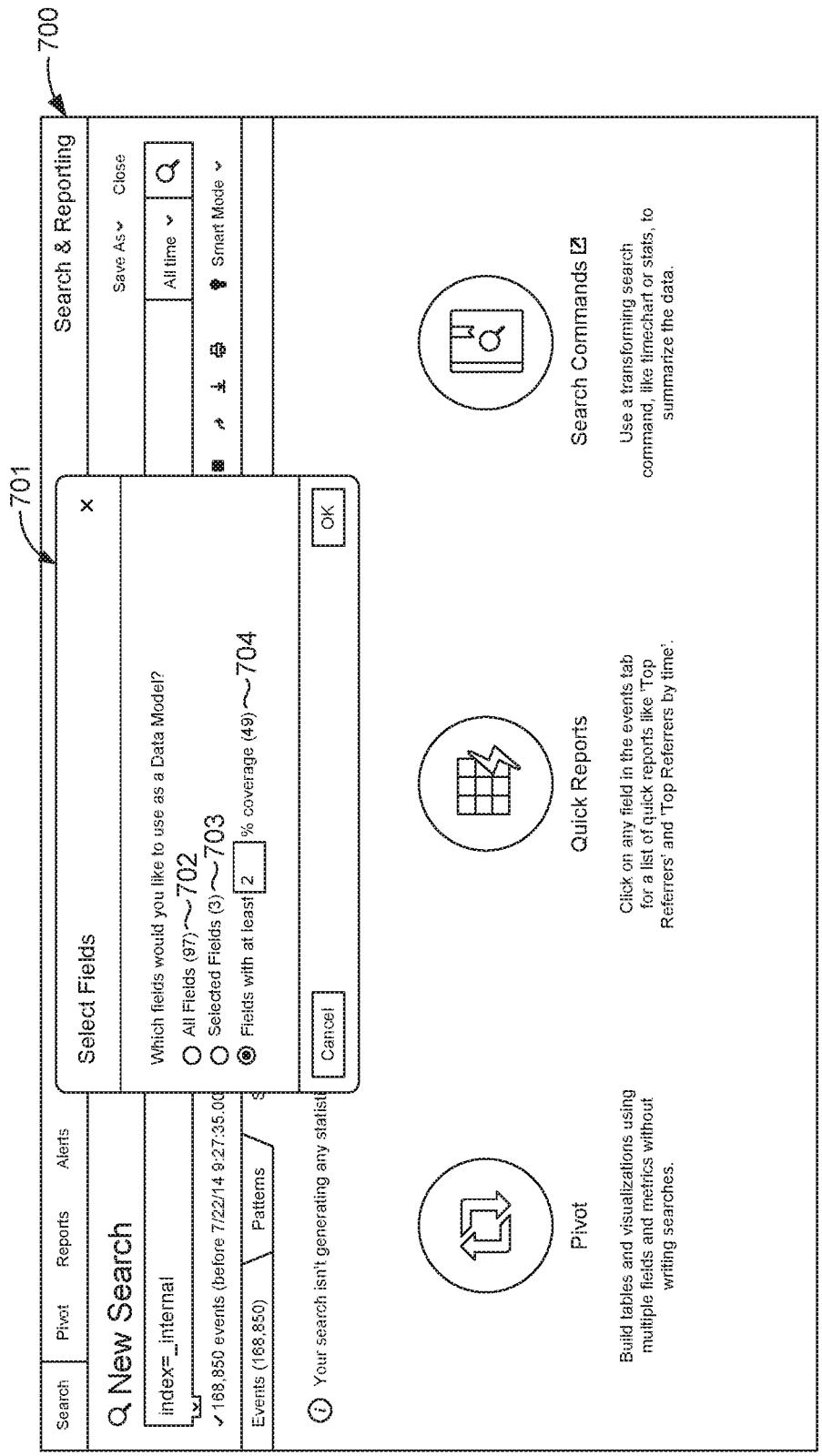
FIGS. 7A-7D illustrate an example series of user interface screens for an example data model-driven report generation interface.

Once a data model object is selected by the user, a user interface screen 700 shown in FIG. 7A may display an interactive listing of automatic field identification options 701 based on the selected data model object. For example, a user may select one of the three illustrated options (e.g., the "All Fields" option 702, the "Selected Fields" option 703, or the "Coverage" option (e.g., fields with at least a specified % of coverage) 704). If the user selects the "All Fields" option 702, all of the fields identified from the events that were returned in response to an initial search query may be selected. That is, for example, all of the fields of the identified data model object fields may be selected. If the user selects the "Selected Fields" option 703, only the fields from the fields of the identified data model object fields that are selected by the user may be used. If the user selects the "Coverage" option 704, only the fields of the identified data model object fields meeting a specified coverage criteria may be selected. A percent coverage may refer to the percentage of events returned by the initial search query that a given field appears in. Thus, for example, if an object dataset includes 10,000 events returned in response to an initial search query, and the "avg_age" field appears in 854 of those 10,000 events, then the "avg_age" field would have a coverage of 8.54% for that object dataset. If, for example, the user selects the "Coverage" option and specifies a coverage value of 2%, only fields having a coverage value equal to or greater than 2% may be selected. The number of fields corresponding to each selectable option may be displayed in association with each option. For example, "97" displayed next to the "All Fields" option 702 indicates that 97 fields will be selected if the "All Fields" option is selected. The "3" displayed next to the "Selected Fields" option 703 indicates that 3 of the 97 fields will be selected if the "Selected Fields" option is selected. The "49" displayed next to the "Coverage" option 704 indicates that 49 of the 97 fields (e.g., the 49 fields having a coverage of 2% or greater) will be selected if the "Coverage" option is selected. The number of fields corresponding to the "Coverage" option may be dynamically updated based on the specified percent of coverage.

Figure 7B:
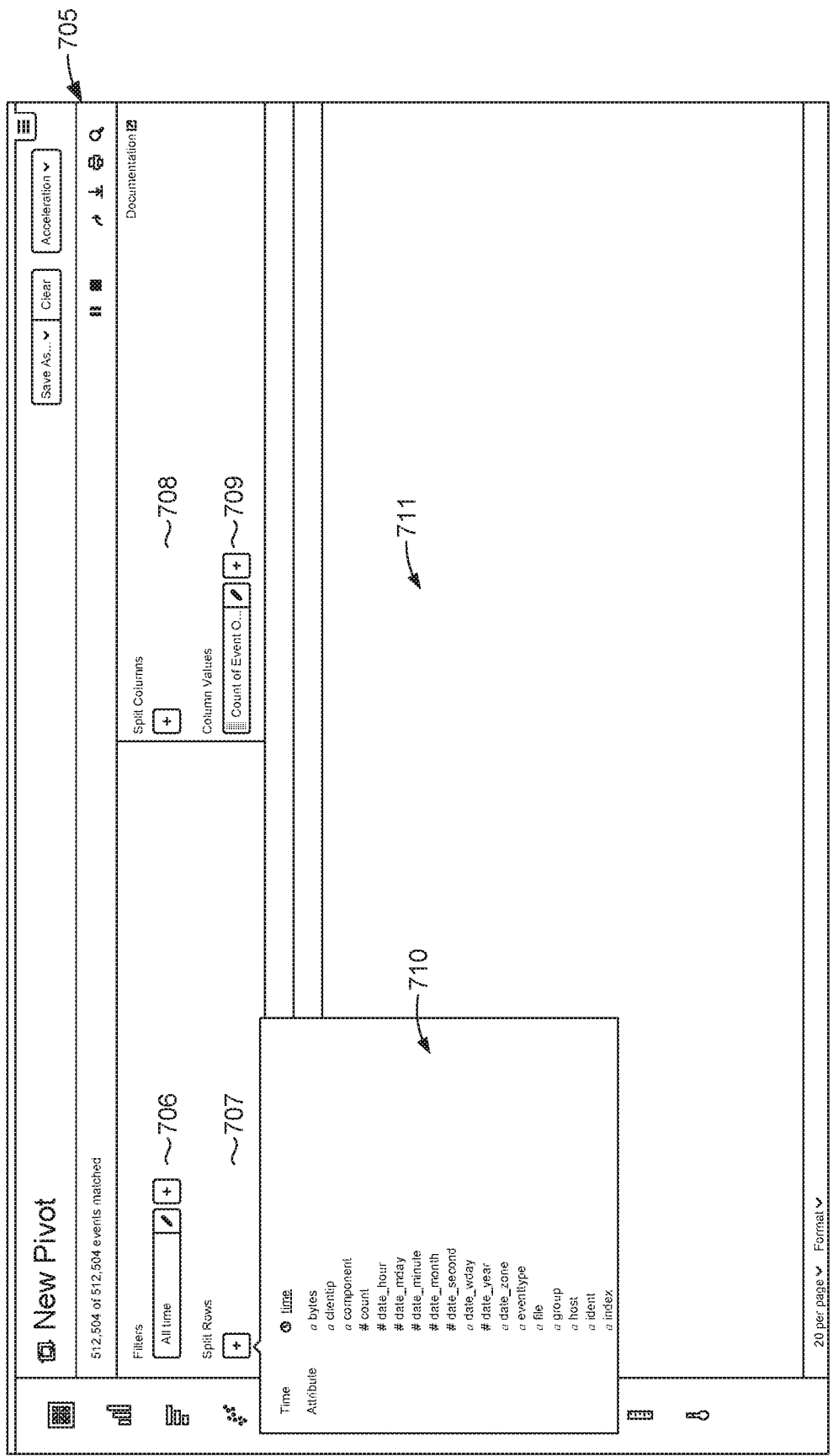
Figure 7C:
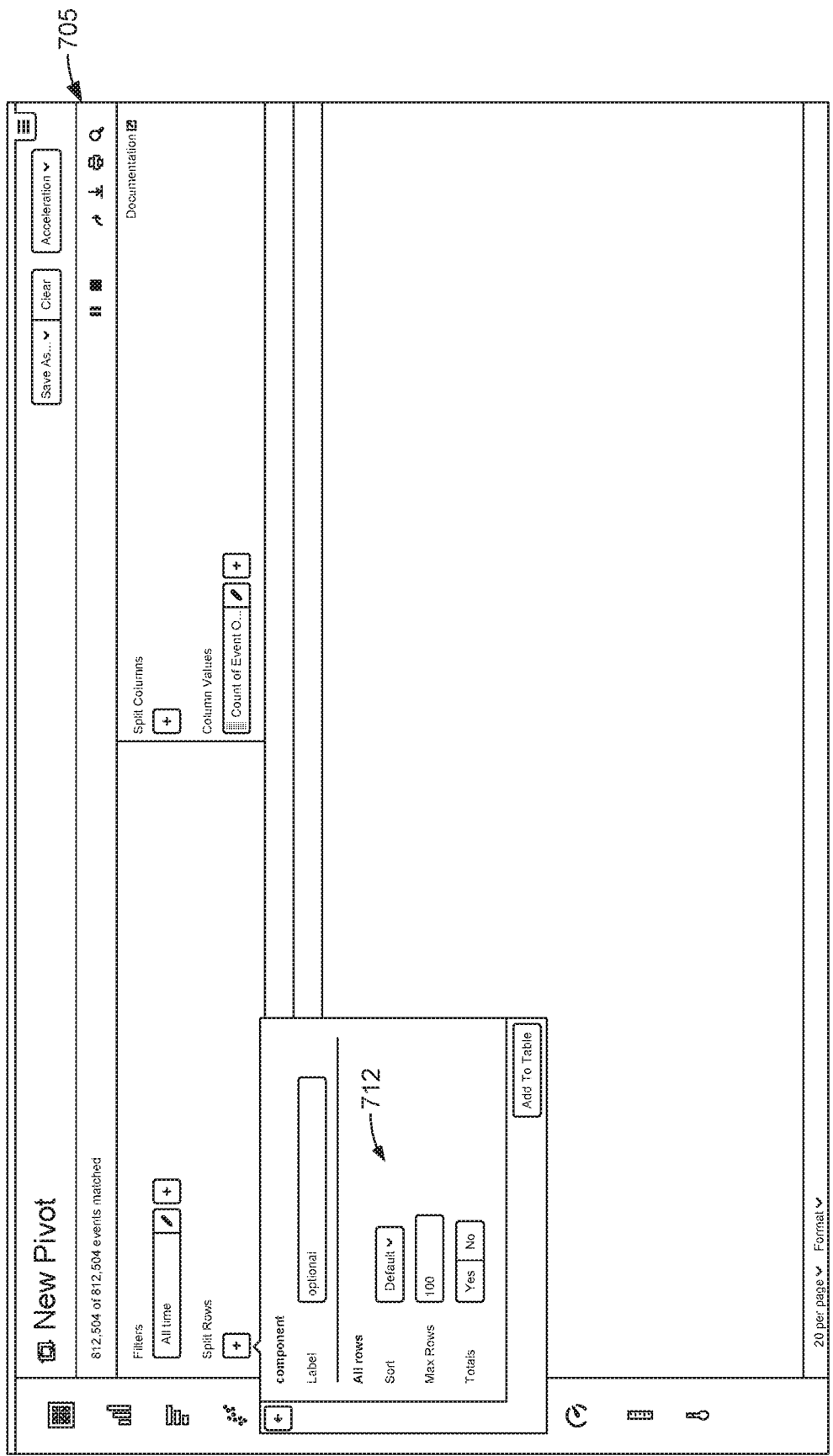

FIG. 7B illustrates an example graphical user interface screen (also called the pivot interface) 705 displaying the reporting application's "Report Editor" page. The screen may display interactive elements for defining various elements of a report. For example, the page includes a "Filters" element 706, a "Split Rows" element 707, a "Split Columns" element 708, and a "Column Values" element 709. The page may include a list of search results 711. In this example, the Split Rows element 707 is expanded, revealing a listing of fields 710 that can be used to define additional criteria (e.g., reporting criteria). The listing of fields 710 may correspond to the selected fields (attributes). That is, the listing of fields 710 may list only the fields previously selected, either automatically and/or manually by a user. FIG. 7C illustrates a formatting dialogue 712 that may be displayed upon selecting a field from the listing of fields 710. The dialogue can be used to format the display of the results of the selection (e.g., label the column to be displayed as "component").

Figure 7D:
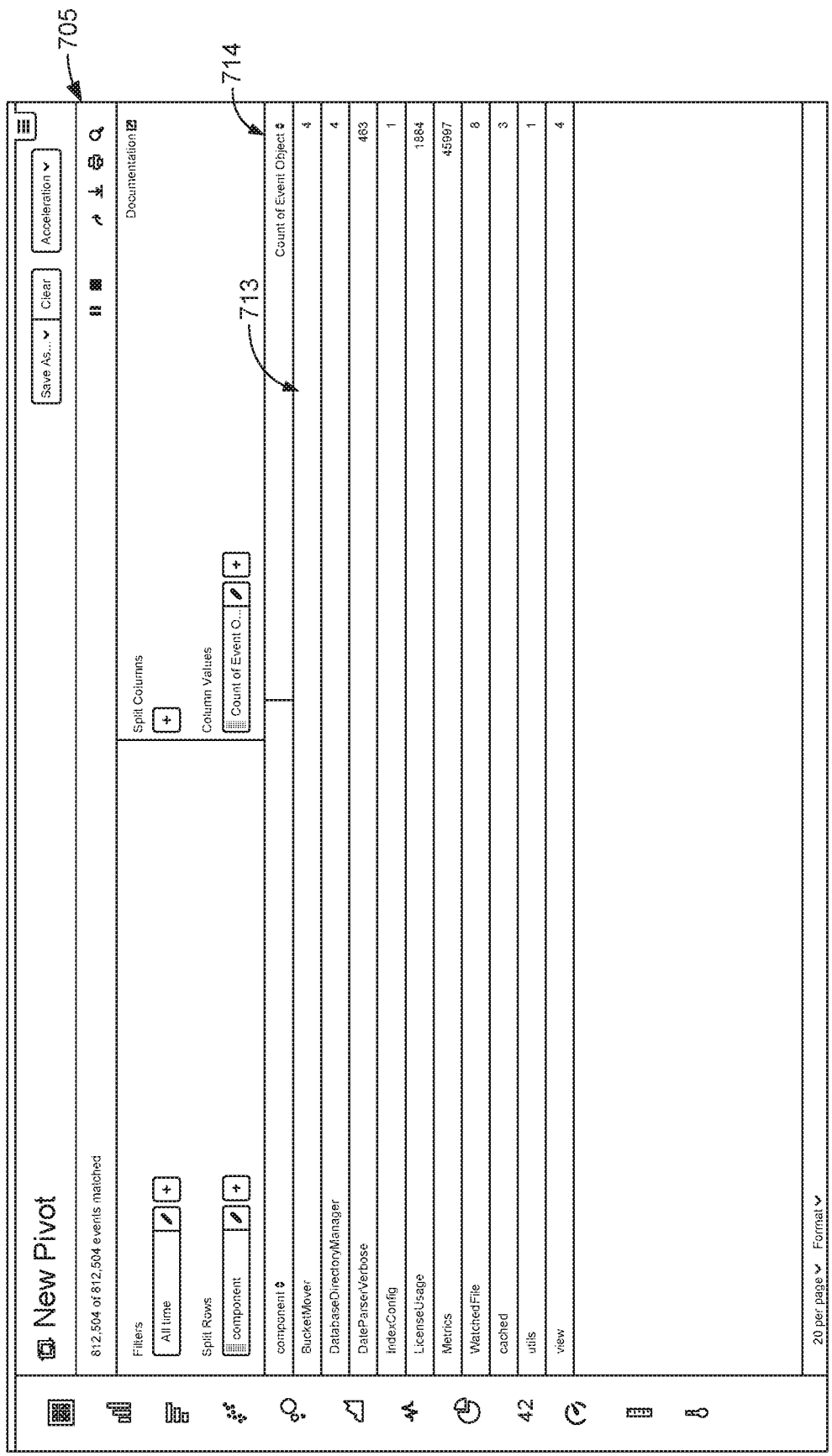

FIG. 7D illustrates an example graphical user interface screen 705 including a table of results 713 based on the selected criteria including splitting the rows by the "component" field. A column 714 having an associated count for each component listed in the table may be displayed that indicates an aggregate count of the number of times that the particular field-value pair (e.g., the value in a row) occurs in the set of events responsive to the initial search query.

Figure 14:
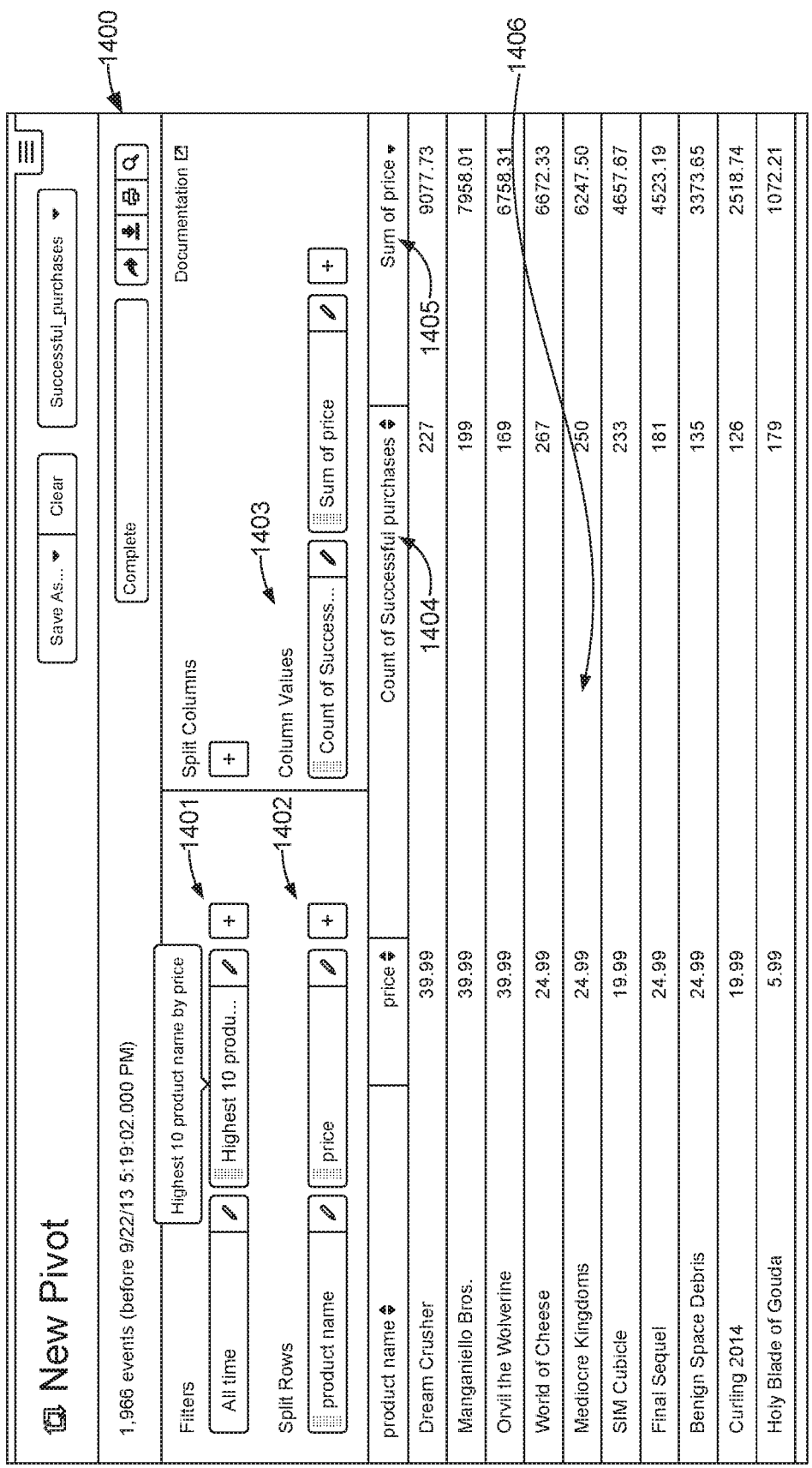

FIG. 14 illustrates an example graphical user interface screen 1400 that allows the user to filter search results and to perform statistical analysis on values extracted from specific fields in the set of events. In this example, the top ten product names ranked by price are selected as a filter 1401 that causes the display of the ten most popular products sorted by price. Each row is displayed by product name and price 1402. This results in each product displayed in a column labeled "product name" along with an associated price in a column labeled "price" 1406. Statistical analysis of other fields in the events associated with the ten most popular products have been specified as column values 1403. A count of the number of successful purchases for each product is displayed in column 1404. These statistics may be produced by filtering the search results by the product name, finding all occurrences of a successful purchase in a field within the events and generating a total of the number of occurrences. A sum of the total sales is displayed in column 1405, which is a result of the multiplication of the price and the number of successful purchases for each product.

Figure 15:
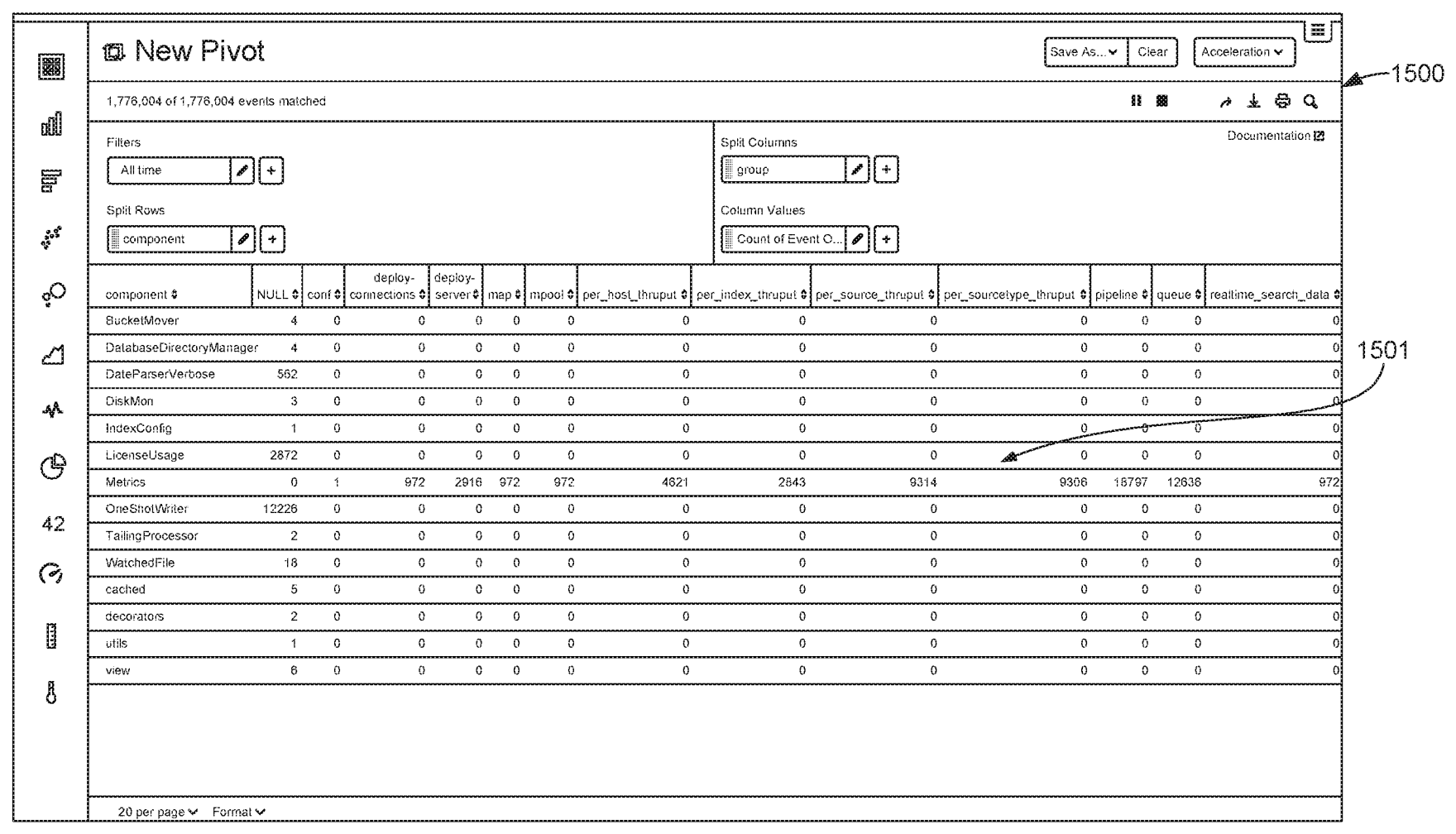
Figure 16:
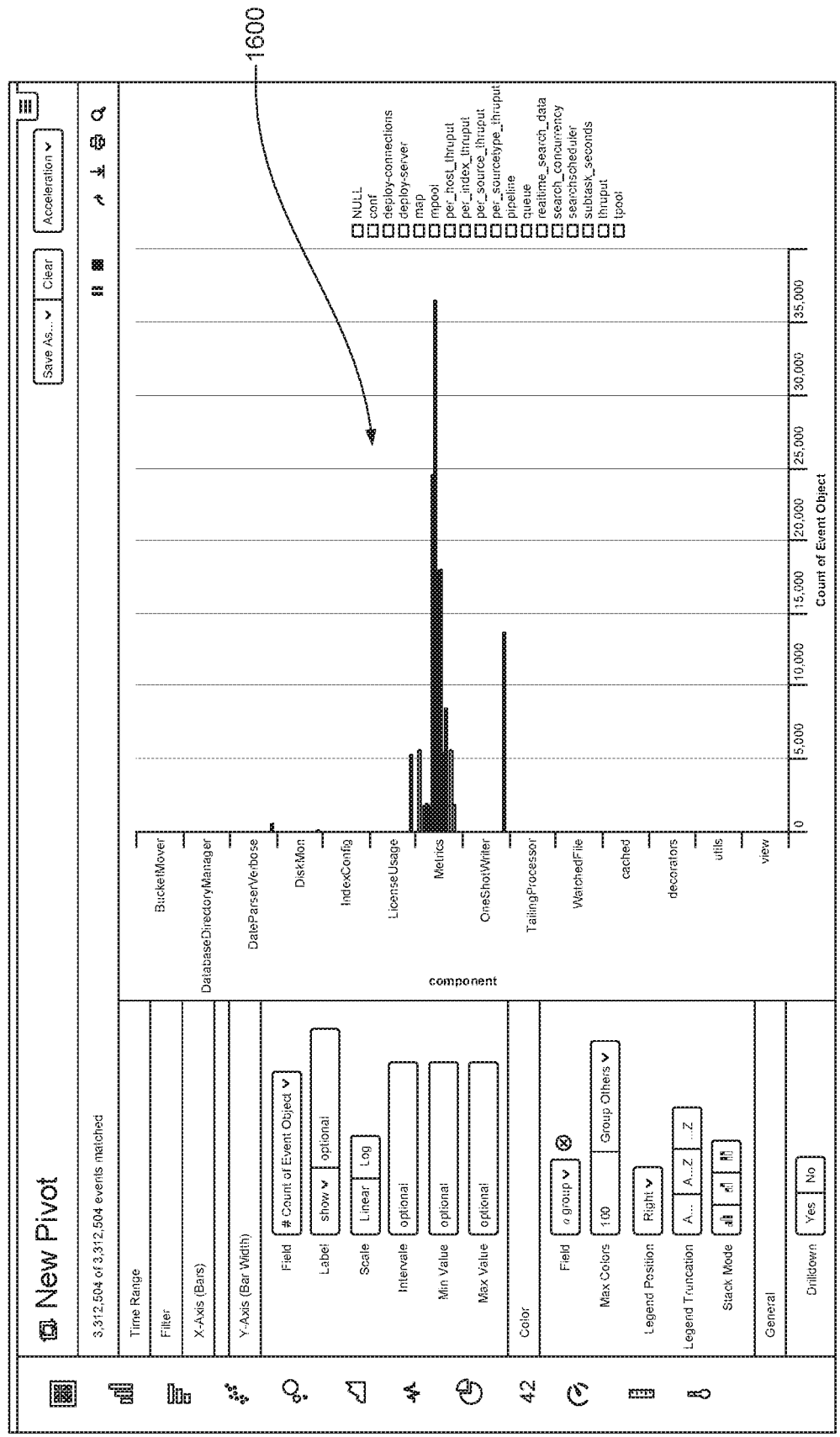
Figure 17:
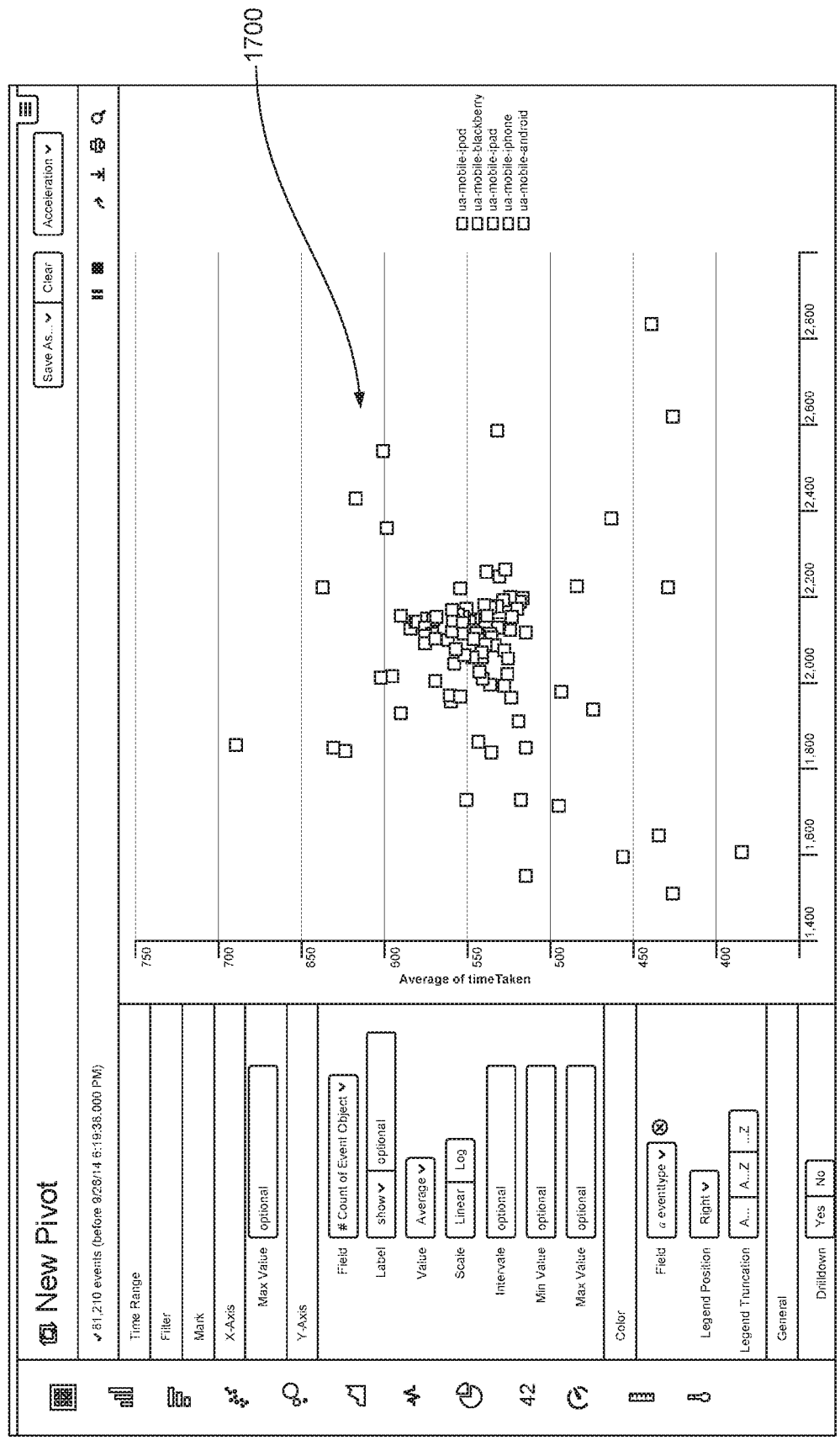

The reporting application allows the user to create graphical visualizations of the statistics generated for a report. For example, FIG. 15 illustrates an example graphical user interface 1500 that displays a set of components and associated statistics 1501. The reporting application allows the user to select a visualization of the statistics in a graph (e.g., bar chart, scatter plot, area chart, line chart, pie chart, radial gauge, marker gauge, filler gauge, etc.). FIG. 16 illustrates an example of a bar chart visualization 1600 of an aspect of the statistical data 1501. FIG. 17 illustrates a scatter plot visualization 1700 of an aspect of the statistical data 1501.

2.10. Acceleration Technique

The above-described system provides significant flexibility by enabling a user to analyze massive quantities of minimally processed data "on the fly" at search time instead of storing pre-specified portions of the data in a database at ingestion time. This flexibility enables a user to see valuable insights, correlate data, and perform subsequent queries to examine interesting aspects of the data that may not have been apparent at ingestion time.

However, performing extraction and analysis operations at search time can involve a large amount of data and require a large number of computational operations, which can cause delays in processing the queries. Advantageously, SPLUNK® ENTERPRISE system employs a number of unique acceleration techniques that have been developed to speed up analysis operations performed at search time. These techniques include: (1) performing search operations in parallel across multiple indexers; (2) using a keyword index; (3) using a high performance analytics store; and (4) accelerating the process of generating reports. These novel techniques are described in more detail below.

2.10.1. Aggregation Technique

Figure 8:
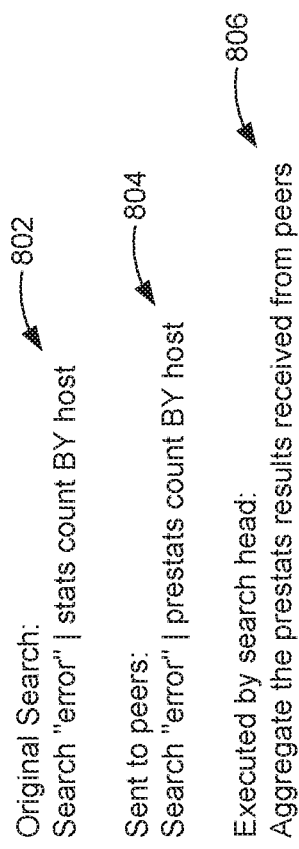
FIG. 8 illustrates an example search query received from a client and executed by search peers.

To facilitate faster query processing, a query can be structured such that multiple indexers perform the query in parallel, while aggregation of search results from the multiple indexers is performed locally at the search head. For example, FIG. 8 illustrates how a search query 802 received from a client at a search head 210 can split into two phases, including: (1) subtasks 804 (e.g., data retrieval or simple filtering) that may be performed in parallel by indexers 206 for execution, and (2) a search results aggregation operation 806 to be executed by the search head when the results are ultimately collected from the indexers.

During operation, upon receiving search query 802, a search head 210 determines that a portion of the operations involved with the search query may be performed locally by the search head. The search head modifies search query 802 by substituting "stats" (create aggregate statistics over results sets received from the indexers at the search head) with "prestats" (create statistics by the indexer from local results set) to produce search query 804, and then distributes search query 804 to distributed indexers, which are also referred to as "search peers." Note that search queries may generally specify search criteria or operations to be performed on events that meet the search criteria. Search queries may also specify field names, as well as search criteria for the values in the fields or operations to be performed on the values in the fields. Moreover, the search head may distribute the full search query to the search peers as illustrated in FIG. 4, or may alternatively distribute a modified version (e.g., a more restricted version) of the search query to the search peers. In this example, the indexers are responsible for producing the results and sending them to the search head. After the indexers return the results to the search head, the search head aggregates the received results 806 to form a single search result set. By executing the query in this manner, the system effectively distributes the computational operations across the indexers while minimizing data transfers.

2.10.2. Keyword Index

As described above with reference to the flow charts in FIG. 3 and FIG. 4, data intake and query system 108 can construct and maintain one or more keyword indices to quickly identify events containing specific keywords. This technique can greatly speed up the processing of queries involving specific keywords. As mentioned above, to build a keyword index, an indexer first identifies a set of keywords. Then, the indexer includes the identified keywords in an index, which associates each stored keyword with references to events containing that keyword, or to locations within events where that keyword is located. When an indexer subsequently receives a keyword-based query, the indexer can access the keyword index to quickly identify events containing the keyword.

2.10.3. High Performance Analytics Store

To speed up certain types of queries, some embodiments of system 108 create a high performance analytics store, which is referred to as a "summarization table," that contains entries for specific field-value pairs. Each of these entries keeps track of instances of a specific value in a specific field in the event data and includes references to events containing the specific value in the specific field. For example, an example entry in a summarization table can keep track of occurrences of the value "94107" in a "ZIP code" field of a set of events and the entry includes references to all of the events that contain the value "94107" in the ZIP code field. This optimization technique enables the system to quickly process queries that seek to determine how many events have a particular value for a particular field. To this end, the system can examine the entry in the summarization table to count instances of the specific value in the field without having to go through the individual events or perform data extractions at search time. Also, if the system needs to process all events that have a specific field-value combination, the system can use the references in the summarization table entry to directly access the events to extract further information without having to search all of the events to find the specific field-value combination at search time.

In some embodiments, the system maintains a separate summarization table for each of the above-described time-specific buckets that stores events for a specific time range. A bucket-specific summarization table includes entries for specific field-value combinations that occur in events in the specific bucket. Alternatively, the system can maintain a separate summarization table for each indexer. The indexer-specific summarization table includes entries for the events in a data store that are managed by the specific indexer. Indexer-specific summarization tables may also be bucket-specific.

The summarization table can be populated by running a periodic query that scans a set of events to find instances of a specific field-value combination, or alternatively instances of all field-value combinations for a specific field. A periodic query can be initiated by a user, or can be scheduled to occur automatically at specific time intervals. A periodic query can also be automatically launched in response to a query that asks for a specific field-value combination.

In some cases, when the summarization tables may not cover all of the events that are relevant to a query, the system can use the summarization tables to obtain partial results for the events that are covered by summarization tables, but may also have to search through other events that are not covered by the summarization tables to produce additional results. These additional results can then be combined with the partial results to produce a final set of results for the query. The summarization table and associated techniques are described in more detail in U.S. Pat. No. 8,682,925, entitled "DISTRIBUTED HIGH PERFORMANCE ANALYTICS STORE", issued on 25 Mar. 2014, U.S. patent application Ser. No. 14/170,159, entitled "SUPPLEMENTING A HIGH PERFORMANCE ANALYTICS STORE WITH EVALUATION OF INDIVIDUAL EVENTS TO RESPOND TO AN EVENT QUERY", filed on 31 Jan. 2014, and U.S. patent application Ser. No. 14/815,973, entitled "STORAGE MEDIUM AND CONTROL DEVICE", filed on 21 Feb. 2014, each of which is hereby incorporated by reference in its entirety.

2.10.4. Accelerating Report Generation

In some embodiments, a data server system such as the SPLUNK® ENTERPRISE system can accelerate the process of periodically generating updated reports based on query results. To accelerate this process, a summarization engine automatically examines the query to determine whether generation of updated reports can be accelerated by creating intermediate summaries. If reports can be accelerated, the summarization engine periodically generates a summary covering data obtained during a latest non-overlapping time period. For example, where the query seeks events meeting a specified criteria, a summary for the time period includes only events within the time period that meet the specified criteria. Similarly, if the query seeks statistics calculated from the events, such as the number of events that match the specified criteria, then the summary for the time period includes the number of events in the period that match the specified criteria.

In addition to the creation of the summaries, the summarization engine schedules the periodic updating of the report associated with the query. During each scheduled report update, the query engine determines whether intermediate summaries have been generated covering portions of the time period covered by the report update. If so, then the report is generated based on the information contained in the summaries. Also, if additional event data has been received and has not yet been summarized, and is required to generate the complete report, the query can be run on this additional event data. Then, the results returned by this query on the additional event data, along with the partial results obtained from the intermediate summaries, can be combined to generate the updated report. This process is repeated each time the report is updated. Alternatively, if the system stores events in buckets covering specific time ranges, then the summaries can be generated on a bucket-by-bucket basis. Note that producing intermediate summaries can save the work involved in re-running the query for previous time periods, so advantageously only the newer event data needs to be processed while generating an updated report. These report acceleration techniques are described in more detail in U.S. Pat. No. 8,589,403, entitled "COMPRESSED JOURNALING IN EVENT TRACKING FILES FOR METADATA RECOVERY AND REPLICATION", issued on 19 Nov. 2013, U.S. Pat. No. 8,412,696, entitled "REAL TIME SEARCHING AND REPORTING", issued on 2 Apr. 2011, and U.S. Pat. Nos. 8,589,375 and 8,589,432, both also entitled "REAL TIME SEARCHING AND REPORTING", both issued on 19 Nov. 2013, each of which is hereby incorporated by reference in its entirety.

2.11. Security Features

The SPLUNK® ENTERPRISE platform provides various schemas, dashboards and visualizations that simplify developers' task to create applications with additional capabilities. One such application is the SPLUNK® APP FOR ENTERPRISE SECURITY, which performs monitoring and alerting operations and includes analytics to facilitate identifying both known and unknown security threats based on large volumes of data stored by the SPLUNK® ENTERPRISE system. SPLUNK® APP FOR ENTERPRISE SECURITY provides the security practitioner with visibility into security-relevant threats found in the enterprise infrastructure by capturing, monitoring, and reporting on data from enterprise security devices, systems, and applications. Through the use of SPLUNK® ENTERPRISE searching and reporting capabilities, SPLUNK® APP FOR ENTERPRISE SECURITY provides a top-down and bottom-up view of an organization's security posture.

The SPLUNK® APP FOR ENTERPRISE SECURITY leverages SPLUNK® ENTERPRISE search-time normalization techniques, saved searches, and correlation searches to provide visibility into security-relevant threats and activity and generate notable events for tracking. The App enables the security practitioner to investigate and explore the data to find new or unknown threats that do not follow signature-based patterns.

Conventional Security Information and Event Management (SIEM) systems that lack the infrastructure to effectively store and analyze large volumes of security-related data. Traditional SIEM systems typically use fixed schemas to extract data from pre-defined security-related fields at data ingestion time and storing the extracted data in a relational database. This traditional data extraction process (and associated reduction in data size) that occurs at data ingestion time inevitably hampers future incident investigations that may need original data to determine the root cause of a security issue, or to detect the onset of an impending security threat.

In contrast, the SPLUNK® APP FOR ENTERPRISE SECURITY system stores large volumes of minimally processed security-related data at ingestion time for later retrieval and analysis at search time when a live security threat is being investigated. To facilitate this data retrieval process, the SPLUNK® APP FOR ENTERPRISE SECURITY provides pre-specified schemas for extracting relevant values from the different types of security-related event data and enables a user to define such schemas.

The SPLUNK® APP FOR ENTERPRISE SECURITY can process many types of security-related information. In general, this security-related information can include any information that can be used to identify security threats. For example, the security-related information can include network-related information, such as IP addresses, domain names, asset identifiers, network traffic volume, uniform resource locator strings, and source addresses. The process of detecting security threats for network-related information is further described in U.S. Pat. No. 8,826,434, entitled "SECURITY THREAT DETECTION BASED ON INDICATIONS IN BIG DATA OF ACCESS TO NEWLY REGISTERED DOMAINS", issued on 2 Sep. 2014, U.S. patent application Ser. No. 13/956,252, entitled "INVESTIGATIVE AND DYNAMIC DETECTION OF POTENTIAL SECURITY-THREAT INDICATORS FROM EVENTS IN BIG DATA", filed on 31 Jul. 2013, U.S. patent application Ser. No. 14/445,018, entitled "GRAPHIC DISPLAY OF SECURITY THREATS BASED ON INDICATIONS OF ACCESS TO NEWLY REGISTERED DOMAINS", filed on 28 Jul. 2014, U.S. patent application Ser. No. 14/445,023, entitled "SECURITY THREAT DETECTION OF NEWLY REGISTERED DOMAINS", filed on 28 Jul. 2014, U.S. patent application Ser. No. 14/815,971, entitled "SECURITY THREAT DETECTION USING DOMAIN NAME ACCESSES", filed on 1 Aug. 2015, and U.S. patent application Ser. No. 14/815,972, entitled "SECURITY THREAT DETECTION USING DOMAIN NAME REGISTRATIONS", filed on 1 Aug. 2015, each of which is hereby incorporated by reference in its entirety for all purposes. Security-related information can also include malware infection data and system configuration information, as well as access control information, such as login/logout information and access failure notifications. The security-related information can originate from various sources within a data center, such as hosts, virtual machines, storage devices and sensors. The security-related information can also originate from various sources in a network, such as routers, switches, email servers, proxy servers, gateways, firewalls and intrusion-detection systems.

During operation, the SPLUNK® APP FOR ENTERPRISE SECURITY facilitates detecting "notable events" that are likely to indicate a security threat. These notable events can be detected in a number of ways: (1) a user can notice a correlation in the data and can manually identify a corresponding group of one or more events as "notable;" or (2) a user can define a "correlation search" specifying criteria for a notable event, and every time one or more events satisfy the criteria, the application can indicate that the one or more events are notable. A user can alternatively select a pre-defined correlation search provided by the application. Note that correlation searches can be run continuously or at regular intervals (e.g., every hour) to search for notable events. Upon detection, notable events can be stored in a dedicated "notable events index," which can be subsequently accessed to generate various visualizations containing security-related information. Also, alerts can be generated to notify system operators when important notable events are discovered.

Figure 9A:
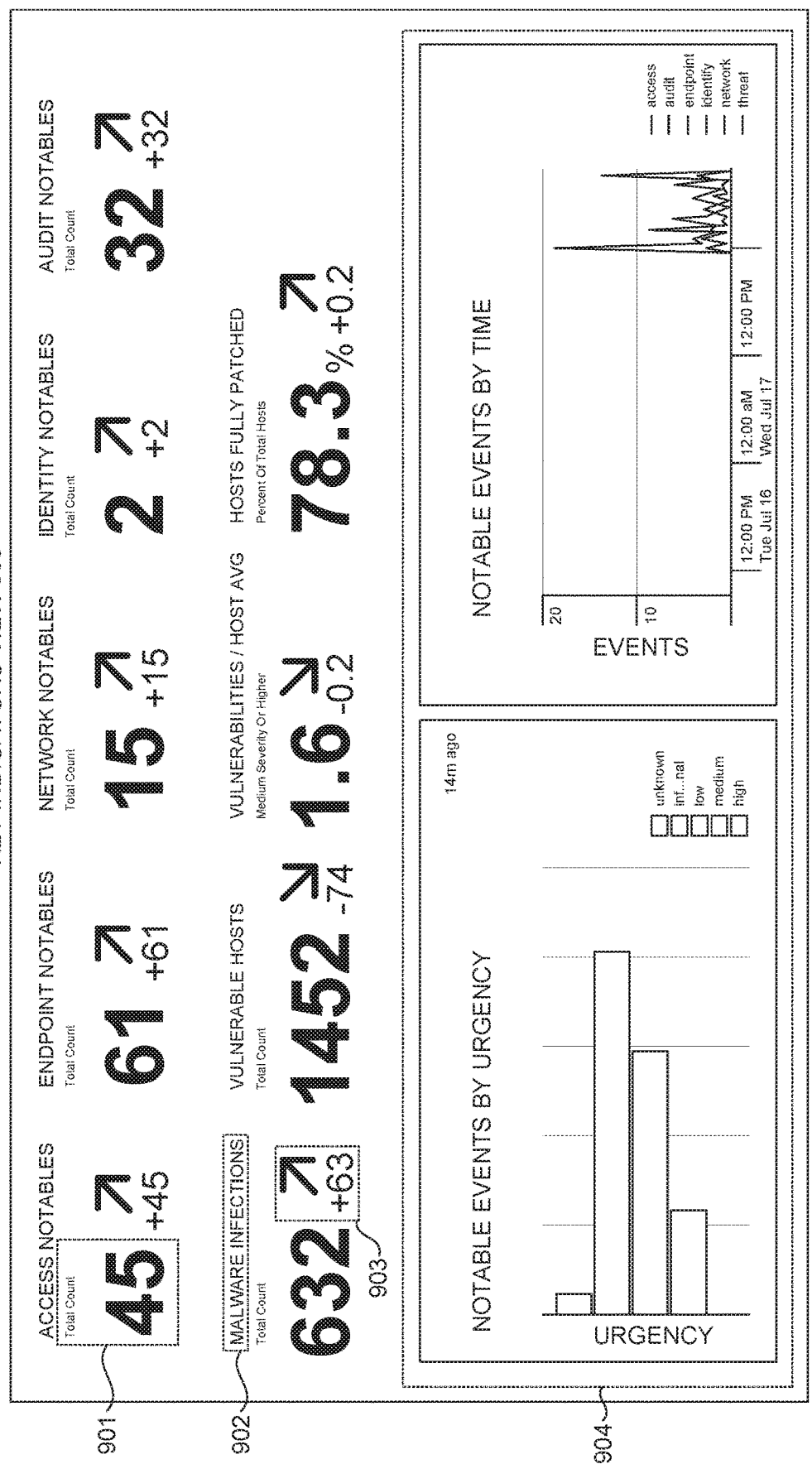
FIG. 9A illustrates an example of key indicators view.

The SPLUNK® APP FOR ENTERPRISE SECURITY provides various visualizations to aid in discovering security threats, such as a "key indicators view" that enables a user to view security metrics, such as counts of different types of notable events. For example, FIG. 9A illustrates an example key indicators view 900 that comprises a dashboard, which can display a value 901, for various security-related metrics, such as malware infections 902. It can also display a change in a metric value 903, which indicates that the number of malware infections increased by 63 during the preceding interval. Key indicators view 900 additionally displays a histogram panel 904 that displays a histogram of notable events organized by urgency values, and a histogram of notable events organized by time intervals. This key indicators view is described in further detail in pending U.S. patent application Ser. No. 13/956,338, entitled "KEY INDICATORS VIEW", filed on 31 Jul. 2013, and which is hereby incorporated by reference in its entirety for all purposes.

These visualizations can also include an "incident review dashboard" that enables a user to view and act on "notable events." These notable events can include: (1) a single event of high importance, such as any activity from a known web attacker; or (2) multiple events that collectively warrant review, such as a large number of authentication failures on a host followed by a successful authentication. For example, FIG. 9B illustrates an example incident review dashboard 910 that includes a set of incident attribute fields 911 that, for example, enables a user to specify a time range field 912 for the displayed events. It also includes a timeline 913 that graphically illustrates the number of incidents that occurred in time intervals over the selected time range. It additionally displays an events list 914 that enables a user to view a list of all of the notable events that match the criteria in the incident attributes fields 911. To facilitate identifying patterns among the notable events, each notable event can be associated with an urgency value (e.g., low, medium, high, critical), which is indicated in the incident review dashboard. The urgency value for a detected event can be determined based on the severity of the event and the priority of the system component associated with the event.

2.12. Data Center Monitoring

As mentioned above, the SPLUNK® ENTERPRISE platform provides various features that simplify the developer's task to create various applications. One such application is SPLUNK® APP FOR VMWARE® that provides operational visibility into granular performance metrics, logs, tasks and events, and topology from hosts, virtual machines and virtual centers. It empowers administrators with an accurate real-time picture of the health of the environment, proactively identifying performance and capacity bottlenecks.

Conventional data-center-monitoring systems lack the infrastructure to effectively store and analyze large volumes of machine-generated data, such as performance information and log data obtained from the data center. In conventional data-center-monitoring systems, machine-generated data is typically pre-processed prior to being stored, for example, by extracting pre-specified data items and storing them in a database to facilitate subsequent retrieval and analysis at search time. However, the rest of the data is not saved and discarded during pre-processing.

In contrast, the SPLUNK® APP FOR VMWARE® stores large volumes of minimally processed machine data, such as performance information and log data, at ingestion time for later retrieval and analysis at search time when a live performance issue is being investigated. In addition to data obtained from various log files, this performance-related information can include values for performance metrics obtained through an application programming interface (API) provided as part of the vSphere Hypervisor™ system distributed by VMware, Inc. of Palo Alto, Calif. For example, these performance metrics can include: (1) CPU-related performance metrics; (2) disk-related performance metrics; (3) memory-related performance metrics; (4) network-related performance metrics; (5) energy-usage statistics; (6) data-traffic-related performance metrics; (7) overall system availability performance metrics; (8) cluster-related performance metrics; and (9) virtual machine performance statistics. Such performance metrics are described in U.S. patent application Ser. No. 14/167,316, entitled "CORRELATION FOR USER-SELECTED TIME RANGES OF VALUES FOR PERFORMANCE METRICS OF COMPONENTS IN AN INFORMATION-TECHNOLOGY ENVIRONMENT WITH LOG DATA FROM THAT INFORMATION-TECHNOLOGY ENVIRONMENT", filed on 29 Jan. 2014, and which is hereby incorporated by reference in its entirety for all purposes.

To facilitate retrieving information of interest from performance data and log files, the SPLUNK® APP FOR VMWARE® provides pre-specified schemas for extracting relevant values from different types of performance-related event data, and also enables a user to define such schemas.

Figure 9C:
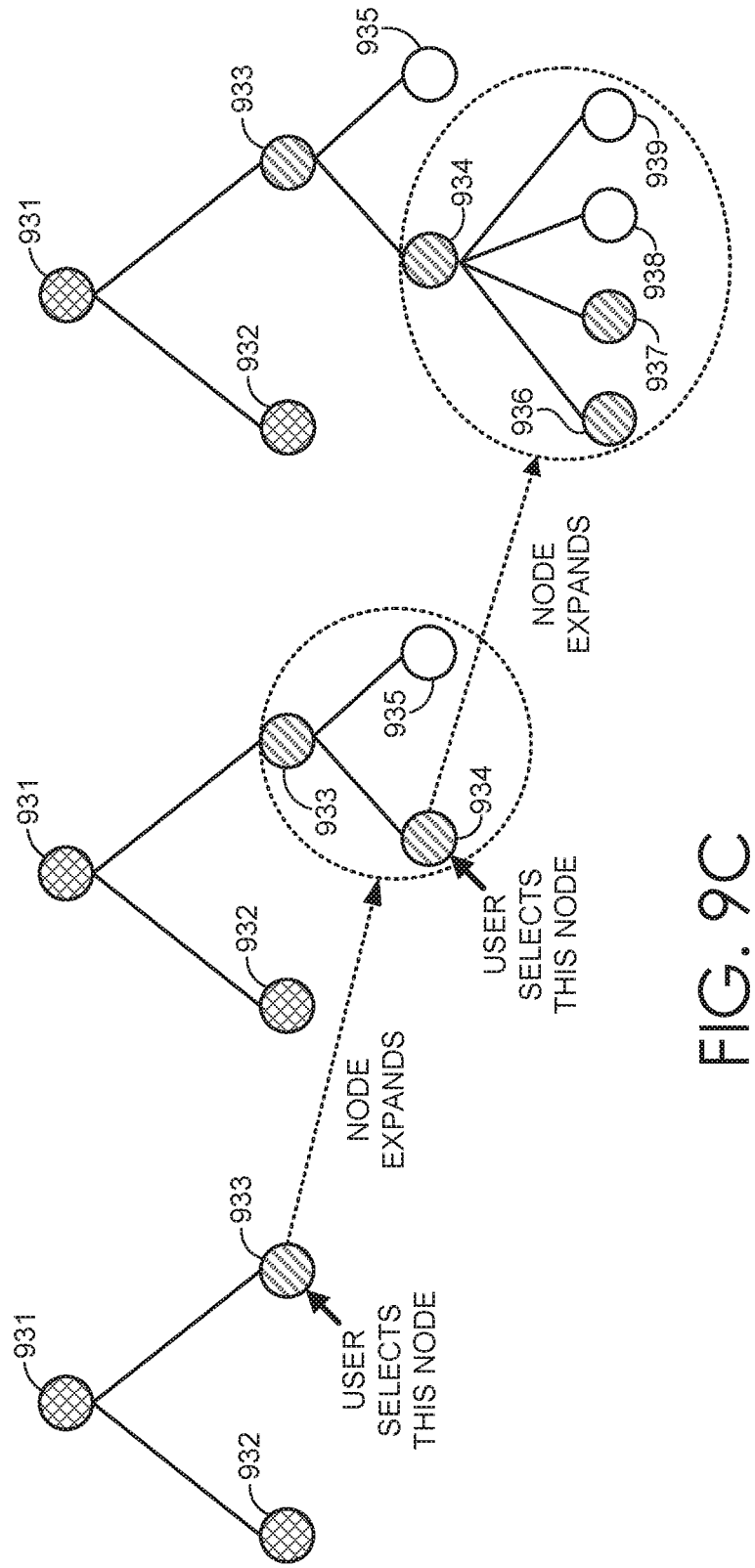
FIG. 9C illustrates an example proactive monitoring tree.

The SPLUNK® APP FOR VMWARE® additionally provides various visualizations to facilitate detecting and diagnosing the root cause of performance problems. For example, one such visualization is a "proactive monitoring tree" that enables a user to easily view and understand relationships among various factors that affect the performance of a hierarchically structured computing system. This proactive monitoring tree enables a user to easily navigate the hierarchy by selectively expanding nodes representing various entities (e.g., virtual centers or computing clusters) to view performance information for lower-level nodes associated with lower-level entities (e.g., virtual machines or host systems). Example node-expansion operations are illustrated in FIG. 9C, wherein nodes 933 and 934 are selectively expanded. Note that nodes 931-939 can be displayed using different patterns or colors to represent different performance states, such as a critical state, a warning state, a normal state or an unknown/offline state. The ease of navigation provided by selective expansion in combination with the associated performance-state information enables a user to quickly diagnose the root cause of a performance problem. The proactive monitoring tree is described in further detail in U.S. patent application Ser. No. 14/253,490, entitled "PROACTIVE MONITORING TREE WITH SEVERITY STATE SORTING", filed on 15 Apr. 2014, and U.S. patent application Ser. No. 14/812,948, also entitled "PROACTIVE MONITORING TREE WITH SEVERITY STATE SORTING", filed on 29 Jul. 2015, each of which is hereby incorporated by reference in its entirety for all purposes.

Figure 9D:
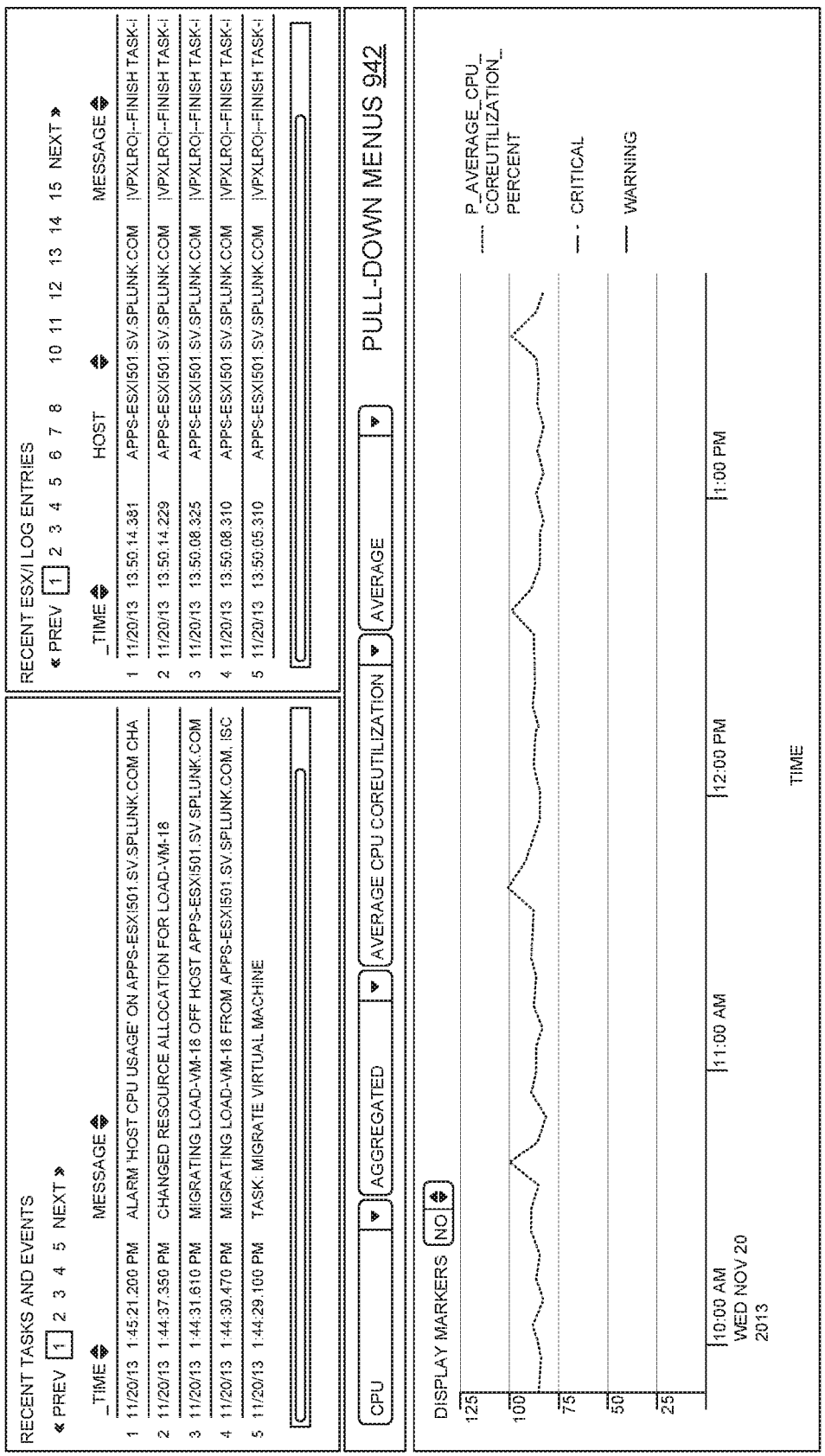
FIG. 9D illustrates an example user interface screen displaying both log data and performance data.

The SPLUNK® APP FOR VMWARE® also provides a user interface that enables a user to select a specific time range and then view heterogeneous data comprising events, log data, and associated performance metrics for the selected time range. For example, the screen illustrated in FIG. 9D displays a listing of recent "tasks and events" and a listing of recent "log entries" for a selected time range above a performance-metric graph for "average CPU core utilization" for the selected time range. Note that a user is able to operate pull-down menus 942 to selectively display different performance metric graphs for the selected time range. This enables the user to correlate trends in the performance-metric graph with corresponding event and log data to quickly determine the root cause of a performance problem. This user interface is described in more detail in U.S. patent application Ser. No. 14/167,316, entitled "CORRELATION FOR USER-SELECTED TIME RANGES OF VALUES FOR PERFORMANCE METRICS OF COMPONENTS IN AN INFORMATION-TECHNOLOGY ENVIRONMENT WITH LOG DATA FROM THAT INFORMATION-TECHNOLOGY ENVIRONMENT", filed on 29 Jan. 2014, and which is hereby incorporated by reference in its entirety for all purposes.

2.13. Cloud-Based System Overview

The example data intake and query system 108 described in reference to FIG. 2 comprises several system components, including one or more forwarders, indexers, and search heads. In some environments, a user of a data intake and query system 108 may install and configure, on computing devices owned and operated by the user, one or more software applications that implement some or all of these system components. For example, a user may install a software application on server computers owned by the user and configure each server to operate as one or more of a forwarder, an indexer, a search head, etc. This arrangement generally may be referred to as an "on-premises" solution. That is, the system 108 is installed and operates on computing devices directly controlled by the user of the system. Some users may prefer an on-premises solution because it may provide a greater level of control over the configuration of certain aspects of the system (e.g., security, privacy, standards, controls, etc.). However, other users may instead prefer an arrangement in which the user is not directly responsible for providing and managing the computing devices upon which various components of system 108 operate.

In one embodiment, to provide an alternative to an entirely on-premises environment for system 108, one or more of the components of a data intake and query system instead may be provided as a cloud-based service. In this context, a cloud-based service refers to a service hosted by one more computing resources that are accessible to end users over a network, for example, by using a web browser or other application on a client device to interface with the remote computing resources. For example, a service provider may provide a cloud-based data intake and query system by managing computing resources configured to implement various aspects of the system (e.g., forwarders, indexers, search heads, etc.) and by providing access to the system to end users via a network. Typically, a user may pay a subscription or other fee to use such a service. Each subscribing user of the cloud-based service may be provided with an account that enables the user to configure a customized cloud-based system based on the user's preferences.

Figure 10:
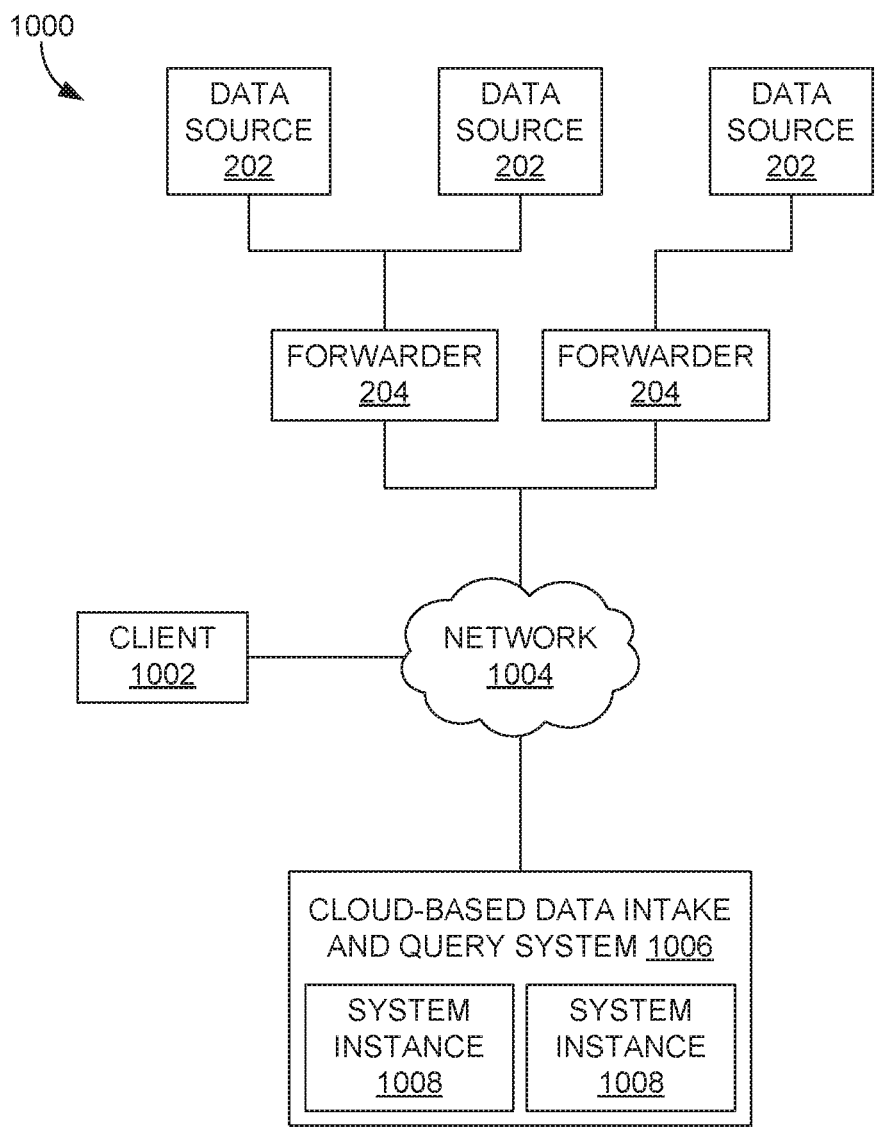
FIG. 10 illustrates a block diagram of an example cloud-based data intake and query system.

FIG. 10 illustrates a block diagram of an example cloud-based data intake and query system. Similar to the system of FIG. 2, the networked computer system 1000 includes input data sources 202 and forwarders 204. These input data sources and forwarders may be in a subscriber's private computing environment. Alternatively, they might be directly managed by the service provider as part of the cloud service. In the example system 1000, one or more forwarders 204 and client devices 1002 are coupled to a cloud-based data intake and query system 1006 via one or more networks 1004. Network 1004 broadly represents one or more LANs, WANs, cellular networks, intranetworks, internetworks, etc., using any of wired, wireless, terrestrial microwave, satellite links, etc., and may include the public Internet, and is used by client devices 1002 and forwarders 204 to access the system 1006. Similar to the system of 108, each of the forwarders 204 may be configured to receive data from an input source and to forward the data to other components of the system 1006 for further processing.

In an embodiment, a cloud-based data intake and query system 1006 may comprise a plurality of system instances 1008. In general, each system instance 1008 may include one or more computing resources managed by a provider of the cloud-based system 1006 made available to a particular subscriber. The computing resources comprising a system instance 1008 may, for example, include one or more servers or other devices configured to implement one or more forwarders, indexers, search heads, and other components of a data intake and query system, similar to system 108. As indicated above, a subscriber may use a web browser or other application of a client device 1002 to access a web portal or other interface that enables the subscriber to configure an instance 1008.

Providing a data intake and query system as described in reference to system 108 as a cloud-based service presents a number of challenges. Each of the components of a system 108 (e.g., forwarders, indexers and search heads) may at times refer to various configuration files stored locally at each component. These configuration files typically may involve some level of user configuration to accommodate particular types of data a user desires to analyze and to account for other user preferences. However, in a cloud-based service context, users typically may not have direct access to the underlying computing resources implementing the various system components (e.g., the computing resources comprising each system instance 1008) and may desire to make such configurations indirectly, for example, using one or more web-based interfaces. Thus, the techniques and systems described herein for providing user interfaces that enable a user to configure source type definitions are applicable to both on-premises and cloud-based service contexts, or some combination thereof (e.g., a hybrid system where both an on-premises environment such as SPLUNK® ENTERPRISE and a cloud-based environment such as SPLUNK CLOUD™ are centrally visible).

2.14. Searching Externally Archived Data

Figure 11:
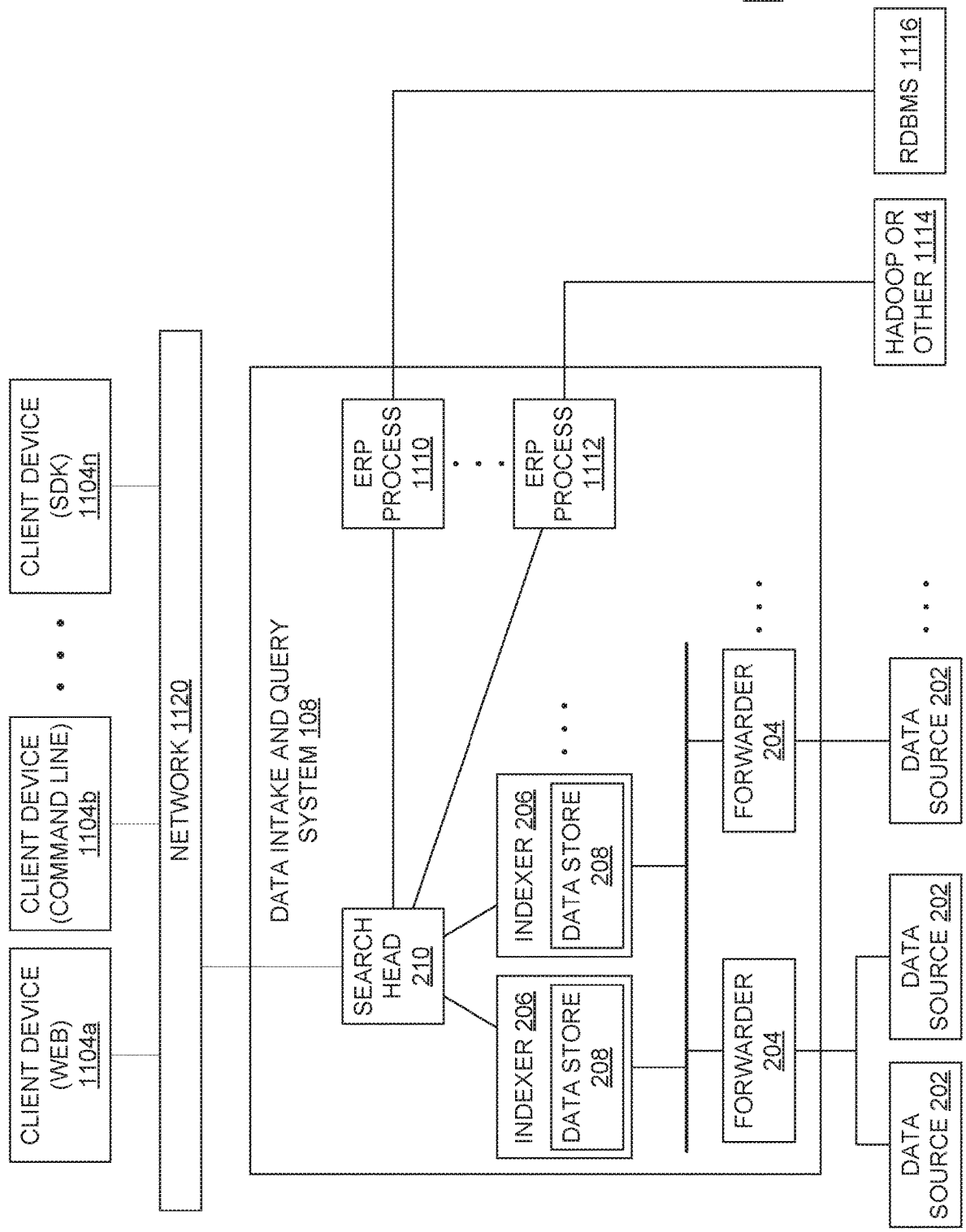
FIG. 11 illustrates a block diagram of an example data intake and query system that performs searches across external data systems.

FIG. 11 shows a block diagram of an example of a data intake and query system 108 that provides transparent search facilities for data systems that are external to the data intake and query system. Such facilities are available in the HUNK® system provided by Splunk Inc. of San Francisco, Calif. HUNK® represents an analytics platform that enables business and IT teams to rapidly explore, analyze, and visualize data in Hadoop and NoSQL data stores.

The search head 210 of the data intake and query system receives search requests from one or more client devices 1104 over network connections 1120. As discussed above, the data intake and query system 108 may reside in an enterprise location, in the cloud, etc. FIG. 11 illustrates that multiple client devices 1104a, 1104b, . . . , 1104n may communicate with the data intake and query system 108. The client devices 1104 may communicate with the data intake and query system using a variety of connections. For example, one client device in FIG. 11 is illustrated as communicating over an Internet (Web) protocol, another client device is illustrated as communicating via a command line interface, and another client device is illustrated as communicating via a system developer kit (SDK).

The search head 210 analyzes the received search request to identify request parameters. If a search request received from one of the client devices 1104 references an index maintained by the data intake and query system, then the search head 210 connects to one or more indexers 206 of the data intake and query system for the index referenced in the request parameters. That is, if the request parameters of the search request reference an index, then the search head accesses the data in the index via the indexer. The data intake and query system 108 may include one or more indexers 206, depending on system access resources and requirements. As described further below, the indexers 206 retrieve data from their respective local data stores 208 as specified in the search request. The indexers and their respective data stores can comprise one or more storage devices and typically reside on the same system, though they may be connected via a local network connection.

If the request parameters of the received search request reference an external data collection, which is not accessible to the indexers 206 or under the management of the data intake and query system, then the search head 210 can access the external data collection through an External Result Provider (ERP) process 1110. An external data collection may be referred to as a "virtual index" (plural, "virtual indices"). An ERP process provides an interface through which the search head 210 may access virtual indices.

Thus, a search reference to an index of the system relates to a locally stored and managed data collection. In contrast, a search reference to a virtual index relates to an externally stored and managed data collection, which the search head may access through one or more ERP processes 1110, 1112. FIG. 11 shows two ERP processes 1110, 1112 that connect to respective remote (external) virtual indices, which are indicated as a Hadoop or another system 1114 (e.g., Amazon S3, Amazon EMR, other Hadoop Compatible File Systems (HCFS), etc.) and a relational database management system (RDBMS) 1116. Other virtual indices may include other file organizations and protocols, such as Structured Query Language (SQL) and the like. The ellipses between the ERP processes 1110, 1112 indicate optional additional ERP processes of the data intake and query system 108. An ERP process may be a computer process that is initiated or spawned by the search head 210 and is executed by the search data intake and query system 108. Alternatively or additionally, an ERP process may be a process spawned by the search head 210 on the same or different host system as the search head 210 resides.

The search head 210 may spawn a single ERP process in response to multiple virtual indices referenced in a search request, or the search head may spawn different ERP processes for different virtual indices. Generally, virtual indices that share common data configurations or protocols may share ERP processes. For example, all search query references to a Hadoop file system may be processed by the same ERP process, if the ERP process is suitably configured. Likewise, all search query references to an SQL database may be processed by the same ERP process. In addition, the search head may provide a common ERP process for common external data source types (e.g., a common vendor may utilize a common ERP process, even if the vendor includes different data storage system types, such as Hadoop and SQL). Common indexing schemes also may be handled by common ERP processes, such as flat text files or Weblog files.

The search head 210 determines the number of ERP processes to be initiated via the use of configuration parameters that are included in a search request message. Generally, there is a one-to-many relationship between an external results provider "family" and ERP processes. There is also a one-to-many relationship between an ERP process and corresponding virtual indices that are referred to in a search request. For example, using RDBMS, assume two independent instances of such a system by one vendor, such as one RDBMS for production and another RDBMS used for development. In such a situation, it is likely preferable (but optional) to use two ERP processes to maintain the independent operation as between production and development data. Both of the ERPs, however, will belong to the same family, because the two RDBMS system types are from the same vendor.

The ERP processes 1110, 1112 receive a search request from the search head 210. The search head may optimize the received search request for execution at the respective external virtual index. Alternatively, the ERP process may receive a search request as a result of analysis performed by the search head or by a different system process. The ERP processes 1110, 1112 can communicate with the search head 210 via conventional input/output routines (e.g., standard in/standard out, etc.). In this way, the ERP process receives the search request from a client device such that the search request may be efficiently executed at the corresponding external virtual index.

The ERP processes 1110, 1112 may be implemented as a process of the data intake and query system. Each ERP process may be provided by the data intake and query system, or may be provided by process or application providers who are independent of the data intake and query system. Each respective ERP process may include an interface application installed at a computer of the external result provider that ensures proper communication between the search support system and the external result provider. The ERP processes 1110, 1112 generate appropriate search requests in the protocol and syntax of the respective virtual indices 1114, 1116, each of which corresponds to the search request received by the search head 210. Upon receiving search results from their corresponding virtual indices, the respective ERP process passes the result to the search head 210, which may return or display the results or a processed set of results based on the returned results to the respective client device.

Client devices 1104 may communicate with the data intake and query system 108 through a network interface 1120, e.g., one or more LANs, WANs, cellular networks, intranetworks, and/or internetworks using any of wired, wireless, terrestrial microwave, satellite links, etc., and may include the public Internet.

The analytics platform utilizing the External Result Provider process described in more detail in U.S. Pat. No. 8,738,629, entitled "EXTERNAL RESULT PROVIDED PROCESS FOR RETRIEVING DATA STORED USING A DIFFERENT CONFIGURATION OR PROTOCOL", issued on 27 May 2014, U.S. Pat. No. 8,738,587, entitled "PROCESSING A SYSTEM SEARCH REQUEST BY RETRIEVING RESULTS FROM BOTH A NATIVE INDEX AND A VIRTUAL INDEX", issued on 25 Jul. 2013, U.S. patent application Ser. No. 14/266,832, entitled "PROCESSING A SYSTEM SEARCH REQUEST ACROSS DISPARATE DATA COLLECTION SYSTEMS", filed on 1 May 2014, and U.S. patent application Ser. No. 14/449,144, entitled "PROCESSING A SYSTEM SEARCH REQUEST INCLUDING EXTERNAL DATA SOURCES", filed on 31 Jul. 2014, each of which is hereby incorporated by reference in its entirety for all purposes.

2.14.1. ERP Process Features

The ERP processes described above may include two operation modes: a streaming mode and a reporting mode. The ERP processes can operate in streaming mode only, in reporting mode only, or in both modes simultaneously. Operating in both modes simultaneously is referred to as mixed mode operation. In a mixed mode operation, the ERP at some point can stop providing the search head with streaming results and only provide reporting results thereafter, or the search head at some point may start ignoring streaming results it has been using and only use reporting results thereafter.

The streaming mode returns search results in real time, with minimal processing, in response to the search request. The reporting mode provides results of a search request with processing of the search results prior to providing them to the requesting search head, which in turn provides results to the requesting client device. ERP operation with such multiple modes provides greater performance flexibility with regard to report time, search latency, and resource utilization.

In a mixed mode operation, both streaming mode and reporting mode are operating simultaneously. The streaming mode results (e.g., the raw data obtained from the external data source) are provided to the search head, which can then process the results data (e.g., break the raw data into events, timestamp it, filter it, etc.) and integrate the results data with the results data from other external data sources, and/or from data stores of the search head. The search head performs such processing and can immediately start returning interim (streaming mode) results to the user at the requesting client device; simultaneously, the search head is waiting for the ERP process to process the data it is retrieving from the external data source as a result of the concurrently executing reporting mode.

In some instances, the ERP process initially operates in a mixed mode, such that the streaming mode operates to enable the ERP quickly to return interim results (e.g., some of the raw or unprocessed data necessary to respond to a search request) to the search head, enabling the search head to process the interim results and begin providing to the client or search requester interim results that are responsive to the query. Meanwhile, in this mixed mode, the ERP also operates concurrently in reporting mode, processing portions of raw data in a manner responsive to the search query. Upon determining that it has results from the reporting mode available to return to the search head, the ERP may halt processing in the mixed mode at that time (or some later time) by stopping the return of data in streaming mode to the search head and switching to reporting mode only. The ERP at this point starts sending interim results in reporting mode to the search head, which in turn may then present this processed data responsive to the search request to the client or search requester. Typically the search head switches from using results from the ERP's streaming mode of operation to results from the ERP's reporting mode of operation when the higher bandwidth results from the reporting mode outstrip the amount of data processed by the search head in the streaming mode of ERP operation.

A reporting mode may have a higher bandwidth because the ERP does not have to spend time transferring data to the search head for processing all the raw data. In addition, the ERP may optionally direct another processor to do the processing.

The streaming mode of operation does not need to be stopped to gain the higher bandwidth benefits of a reporting mode; the search head could simply stop using the streaming mode results—and start using the reporting mode results—when the bandwidth of the reporting mode has caught up with or exceeded the amount of bandwidth provided by the streaming mode. Thus, a variety of triggers and ways to accomplish a search head's switch from using streaming mode results to using reporting mode results may be appreciated by one skilled in the art.

The reporting mode can involve the ERP process (or an external system) performing event breaking, time stamping, filtering of events to match the search query request, and calculating statistics on the results. The user can request particular types of data, such as if the search query itself involves types of events, or the search request may ask for statistics on data, such as on events that meet the search request. In either case, the search head understands the query language used in the received query request, which may be a proprietary language. One exemplary query language is Splunk Processing Language (SPL) developed by the assignee of the application, Splunk Inc. The search head typically understands how to use that language to obtain data from the indexers, which store data in a format used by the SPLUNK® Enterprise system.

The ERP processes support the search head, as the search head is not ordinarily configured to understand the format in which data is stored in external data sources such as Hadoop or SQL data systems. Rather, the ERP process performs that translation from the query submitted in the search support system's native format (e.g., SPL if SPLUNK® ENTERPRISE is used as the search support system) to a search query request format that will be accepted by the corresponding external data system. The external data system typically stores data in a different format from that of the search support system's native index format, and it utilizes a different query language (e.g., SQL or MapReduce, rather than SPL or the like).

As noted, the ERP process can operate in the streaming mode alone. After the ERP process has performed the translation of the query request and received raw results from the streaming mode, the search head can integrate the returned data with any data obtained from local data sources (e.g., native to the search support system), other external data sources, and other ERP processes (if such operations were required to satisfy the terms of the search query). An advantage of mixed mode operation is that, in addition to streaming mode, the ERP process is also executing concurrently in reporting mode. Thus, the ERP process (rather than the search head) is processing query results (e.g., performing event breaking, timestamping, filtering, possibly calculating statistics if required to be responsive to the search query request, etc.). It should be apparent to those skilled in the art that additional time is needed for the ERP process to perform the processing in such a configuration. Therefore, the streaming mode will allow the search head to start returning interim results to the user at the client device before the ERP process can complete sufficient processing to start returning any search results. The switchover between streaming and reporting mode happens when the ERP process determines that the switchover is appropriate, such as when the ERP process determines it can begin returning meaningful results from its reporting mode.

The operation described above illustrates the source of operational latency: streaming mode has low latency (immediate results) and usually has relatively low bandwidth (fewer results can be returned per unit of time). In contrast, the concurrently running reporting mode has relatively high latency (it has to perform a lot more processing before returning any results) and usually has relatively high bandwidth (more results can be processed per unit of time). For example, when the ERP process does begin returning report results, it returns more processed results than in the streaming mode, because, e.g., statistics only need to be calculated to be responsive to the search request. That is, the ERP process doesn't have to take time to first return raw data to the search head. As noted, the ERP process could be configured to operate in streaming mode alone and return just the raw data for the search head to process in a way that is responsive to the search request. Alternatively, the ERP process can be configured to operate in the reporting mode only. Also, the ERP process can be configured to operate in streaming mode and reporting mode concurrently, as described, with the ERP process stopping the transmission of streaming results to the search head when the concurrently running reporting mode has caught up and started providing results. The reporting mode does not require the processing of all raw data that is responsive to the search query request before the ERP process starts returning results; rather, the reporting mode usually performs processing of chunks of events and returns the processing results to the search head for each chunk.

For example, an ERP process can be configured to merely return the contents of a search result file verbatim, with little or no processing of results. That way, the search head performs all processing (such as parsing byte streams into events, filtering, etc.). The ERP process can be configured to perform additional intelligence, such as analyzing the search request and handling all the computation that a native search indexer process would otherwise perform. In this way, the configured ERP process provides greater flexibility in features while operating according to desired preferences, such as response latency and resource requirements.

2.14. IT Service Monitoring

As previously mentioned, the SPLUNK® ENTERPRISE platform provides various schemas, dashboards and visualizations that make it easy for developers to create applications to provide additional capabilities. One such application is SPLUNK® IT SERVICE INTELLIGENCE™, which performs monitoring and alerting operations. It also includes analytics to help an analyst diagnose the root cause of performance problems based on large volumes of data stored by the SPLUNK® ENTERPRISE system as correlated to the various services an IT organization provides (a service-centric view). This differs significantly from conventional IT monitoring systems that lack the infrastructure to effectively store and analyze large volumes of service-related event data. Traditional service monitoring systems typically use fixed schemas to extract data from pre-defined fields at data ingestion time, wherein the extracted data is typically stored in a relational database. This data extraction process and associated reduction in data content that occurs at data ingestion time inevitably hampers future investigations, when all of the original data may be needed to determine the root cause of or contributing factors to a service issue.

In contrast, a SPLUNK® IT SERVICE INTELLIGENCE™ system stores large volumes of minimally-processed service-related data at ingestion time for later retrieval and analysis at search time, to perform regular monitoring, or to investigate a service issue. To facilitate this data retrieval process, SPLUNK® IT SERVICE INTELLIGENCE™ enables a user to define an IT operations infrastructure from the perspective of the services it provides. In this service-centric approach, a service such as corporate e-mail may be defined in terms of the entities employed to provide the service, such as host machines and network devices. Each entity is defined to include information for identifying all of the event data that pertains to the entity, whether produced by the entity itself or by another machine, and considering the many various ways the entity may be identified in raw machine data (such as by a URL, an IP address, or machine name). The service and entity definitions can organize event data around a service so that all of the event data pertaining to that service can be easily identified. This capability provides a foundation for the implementation of Key Performance Indicators.

One or more Key Performance Indicators (KPI's) are defined for a service within the SPLUNK® IT SERVICE INTELLIGENCE™ application. Each KPI measures an aspect of service performance at a point in time or over a period of time (aspect KPI's). Each KPI is defined by a search query that derives a KPI value from the machine data of events associated with the entities that provide the service. Information in the entity definitions may be used to identify the appropriate events at the time a KPI is defined or whenever a KPI value is being determined. The KPI values derived over time may be stored to build a valuable repository of current and historical performance information for the service, and the repository, itself, may be subject to search query processing. Aggregate KPIs may be defined to provide a measure of service performance calculated from a set of service aspect KPI values; this aggregate may even be taken across defined timeframes and/or across multiple services. A particular service may have an aggregate KPI derived from substantially all of the aspect KPI's of the service to indicate an overall health score for the service.

SPLUNK® IT SERVICE INTELLIGENCE™ facilitates the production of meaningful aggregate KPI's through a system of KPI thresholds and state values. Different KPI definitions may produce values in different ranges, and so the same value may mean something very different from one KPI definition to another. To address this, SPLUNK® IT SERVICE INTELLIGENCE™ implements a translation of individual KPI values to a common domain of "state" values. For example, a KPI range of values may be 1-100, or 50-275, while values in the state domain may be 'critical,' 'warning,' 'normal,' and 'informational'. Thresholds associated with a particular KPI definition determine ranges of values for that KPI that correspond to the various state values. In one case, KPI values 95-100 may be set to correspond to 'critical' in the state domain. KPI values from disparate KPI's can be processed uniformly once they are translated into the common state values using the thresholds. For example, "normal 80% of the time" can be applied across various KPI's. To provide meaningful aggregate KPI's, a weighting value can be assigned to each KPI so that its influence on the calculated aggregate KPI value is increased or decreased relative to the other KPI's.

One service in an IT environment often impacts, or is impacted by, another service. SPLUNK® IT SERVICE INTELLIGENCE™ can reflect these dependencies. For example, a dependency relationship between a corporate e-mail service and a centralized authentication service can be reflected by recording an association between their respective service definitions. The recorded associations establish a service dependency topology that informs the data or selection options presented in a GUI, for example.

(The service dependency topology is like a "map" showing how services are connected based on their dependencies.) The service topology may itself be depicted in a GUI and may be interactive to allow navigation among related services.

Entity definitions in SPLUNK® IT SERVICE INTELLIGENCE™ can include informational fields that can serve as metadata, implied data fields, or attributed data fields for the events identified by other aspects of the entity definition. Entity definitions in SPLUNK® IT SERVICE INTELLIGENCE™ can also be created and updated by an import of tabular data (as represented in a CSV, another delimited file, or a search query result set). The import may be GUI-mediated or processed using import parameters from a GUI-based import definition process. Entity definitions in SPLUNK® IT SERVICE INTELLIGENCE™ can also be associated with a service by means of a service definition rule. Processing the rule results in the matching entity definitions being associated with the service definition. The rule can be processed at creation time, and thereafter on a scheduled or on-demand basis. This allows dynamic, rule-based updates to the service definition.

During operation, SPLUNK® IT SERVICE INTELLIGENCE™ can recognize so-called "notable events" that may indicate a service performance problem or other situation of interest. These notable events can be recognized by a "correlation search" specifying trigger criteria for a notable event: every time KPI values satisfy the criteria, the application indicates a notable event. A severity level for the notable event may also be specified. Furthermore, when trigger criteria are satisfied, the correlation search may additionally or alternatively cause a service ticket to be created in an IT service management (ITSM) system, such as a systems available from ServiceNow, Inc., of Santa Clara, Calif.

SPLUNK® IT SERVICE INTELLIGENCE™ provides various visualizations built on its service-centric organization of event data and the KPI values generated and collected. Visualizations can be particularly useful for monitoring or investigating service performance. SPLUNK® IT SERVICE INTELLIGENCE™ provides a service monitoring interface suitable as the home page for ongoing IT service monitoring. The interface is appropriate for settings such as desktop use or for a wall-mounted display in a network operations center (NOC). The interface may prominently display a services health section with tiles for the aggregate KPI's indicating overall health for defined services and a general KPI section with tiles for KPI's related to individual service aspects. These tiles may display KPI information in a variety of ways, such as by being colored and ordered according to factors like the KPI state value. They also can be interactive and navigate to visualizations of more detailed KPI information.

SPLUNK® IT SERVICE INTELLIGENCE™ provides a service-monitoring dashboard visualization based on a user-defined template. The template can include user-selectable widgets of varying types and styles to display KPI information. The content and the appearance of widgets can respond dynamically to changing KPI information. The KPI widgets can appear in conjunction with a background image, user drawing objects, or other visual elements, that depict the IT operations environment, for example. The KPI widgets or other GUI elements can be interactive so as to provide navigation to visualizations of more detailed KPI information.

SPLUNK® IT SERVICE INTELLIGENCE™ provides a visualization showing detailed time-series information for multiple KPI's in parallel graph lanes. The length of each lane can correspond to a uniform time range, while the width of each lane may be automatically adjusted to fit the displayed KPI data. Data within each lane may be displayed in a user selectable style, such as a line, area, or bar chart. During operation a user may select a position in the time range of the graph lanes to activate lane inspection at that point in time. Lane inspection may display an indicator for the selected time across the graph lanes and display the KPI value associated with that point in time for each of the graph lanes. The visualization may also provide navigation to an interface for defining a correlation search, using information from the visualization to pre-populate the definition.

SPLUNK® IT SERVICE INTELLIGENCE™ provides a visualization for incident review showing detailed information for notable events. The incident review visualization may also show summary information for the notable events over a time frame, such as an indication of the number of notable events at each of a number of severity levels. The severity level display may be presented as a rainbow chart with the warmest color associated with the highest severity classification. The incident review visualization may also show summary information for the notable events over a time frame, such as the number of notable events occurring within segments of the time frame. The incident review visualization may display a list of notable events within the time frame ordered by any number of factors, such as time or severity. The selection of a particular notable event from the list may display detailed information about that notable event, including an identification of the correlation search that generated the notable event.

SPLUNK® IT SERVICE INTELLIGENCE™ provides pre-specified schemas for extracting relevant values from the different types of service-related event data. It also enables a user to define such schemas.

2.15 Cloud-Based Architecture

As shown in the previous figures, various embodiments may refer to a data intake and query system 108 that includes one or more of a search head 210, an indexer 206, and a forwarder 204. In other implementations, data intake and query system 108 may have a different architecture, but may carry out indexing and searching in a way that is indistinguishable or functionally equivalent from the perspective of the end user. For example, data intake and query system 108 may be re-architected to run in a stateless, containerized environment. In some of these embodiments, data intake and query system 108 may be run in a computing cloud provided by a third party, or provided by the operator of the data intake and query system 108. This type of cloud-based data intake and query system may have several benefits, including, but not limited to, lossless data ingestion, more robust disaster recovery, and faster or more efficient processing, searching, and indexing. A cloud-based data intake and query system as described in this section may provide separately scalable storage resources and compute resources, or separately scalable search and index resources. Additionally, the cloud-based data intake and query system may allow for applications to be developed on top of the data intake and query system, to extend or enhance functionality, through a gateway layer or one or more Application Programming Interfaces (APIs), which may provide customizable access control or targeted exposure to the workings of data intake and query system 108.

In some embodiments, a cloud-based data intake and query system may include an intake system. Such an intake system can include, but is not limited to an intake buffer, such as Apache Kafka® or Amazon Kinesis®, or an extensible compute layer, such as Apache Spark™ or Apache Flink®. In some embodiments, the search function and the index function may be separated or containerized, so that search functions and index functions may run or scale independently. In some embodiments, data that is indexed may be stored in buckets, which may be stored in a persistent storage once certain bucket requirements have been met, and retrieved as needed for searching. In some embodiments, the search functions and index functions run in stateless containers, which may be coordinated by an orchestration platform. These containerized search and index functions may retrieve data needed to carry out searching and indexing from the buckets or various other services that may also run in containers, or within other components of the orchestration platform. In this manner, loss of a single container, or even multiple containers, does not result in data loss, because the data can be quickly recovered from the various services or components or the buckets in which the data is persisted.

In some embodiments, the cloud-based data intake and query system may implement tenant-based and user-based access control. In some embodiments, the cloud-based data intake and query system may implement an abstraction layer, through a gateway portal, an API, or some combination thereof, to control or limit access to the functionality of the cloud-based data intake and query system.

3.0 Overview of Facilitating Capacity Prediction

Generally, an execution environment should be sized to handle the storage and retrieval needs for any expected task. Poorly planned capacity can result in under-provisioning or over-provisioning. Under-provisioning can reduce productivity, and over-provisioning can waste resources. Accurately predicting capacity is an ongoing challenge. In some cases, capacity can be predicted based on testing performed in a lab environment. However, execution environments that are implemented in practice are often complex systems (e.g., large-scale clusters) with complex topologies and configurations, and testing all potential systems is often practically infeasible. Furthermore, hardware that is implemented in practice (e.g., non-standard hardware) is often incapable of being duplicated in a lab environment. In order to accurately predict capacity in a particular execution environment, it may be imperative to account for factors that cannot be directly tested.

Accordingly, embodiments are directed to facilitating an accurate prediction of capacity (e.g., execution platform requirements) in any of a large number of varying execution environments. Generally, two-tier capacity planning can be implemented to leverage benchmark values measured in a limited number of reference execution environments, such as those available in a controlled setting such as a performance lab. Two-tier capacity planning combines benchmark values obtained from reference execution environments with benchmark values obtained from disparate execution environments to improve predictive accuracy for environments that cannot or have not been directly tested.

In one tier, the central or lab tier, benchmark testing is performed to measure benchmark values for different test configurations on different types of reference hardware, and a sizing model is derived for predicting execution platform requirements based on various workload input parameters. In another tier, the deployment or customer tier, a benchmark testing application performs benchmark testing to measure benchmark values for a baseline deployed configuration in each of many execution environments (e.g., execution environments for customers of an application-provider), from which data are collected centrally (e.g., by the application-provider). Collected benchmark values can reflect any type of performance of interest, and can include configuration and measurement data such as runtime metrics, search performance, test scenarios, execution environment configuration, and the like.

Deep learning can be performed over the collected benchmark values to produce a model that can predict performance when supplied with inputs about an execution environment. In some embodiments, the model can predict a performance delta value that represents a measure of relative performance between a customer environment and the lab environment. The performance delta value can be used in conjunction with the central-tier sizing model to produce accurate predictions of capacity (e.g., execution platform requirements) for a particular execution environment (e.g., a particular customer environment, a designed execution environment, etc.). In some embodiments, feedback information can be collected from a deployed environment implementing predicted performance requirements, and the feedback information can be used to validate or tune the model. Using this model, users of a particular execution environment (e.g., customers of an application-provider) can more accurately predict capacity, whether in their current execution environment or a desired execution environment.

3.1 Overview of a Capacity Prediction Tool in a Data Processing Environment

Figure 18:
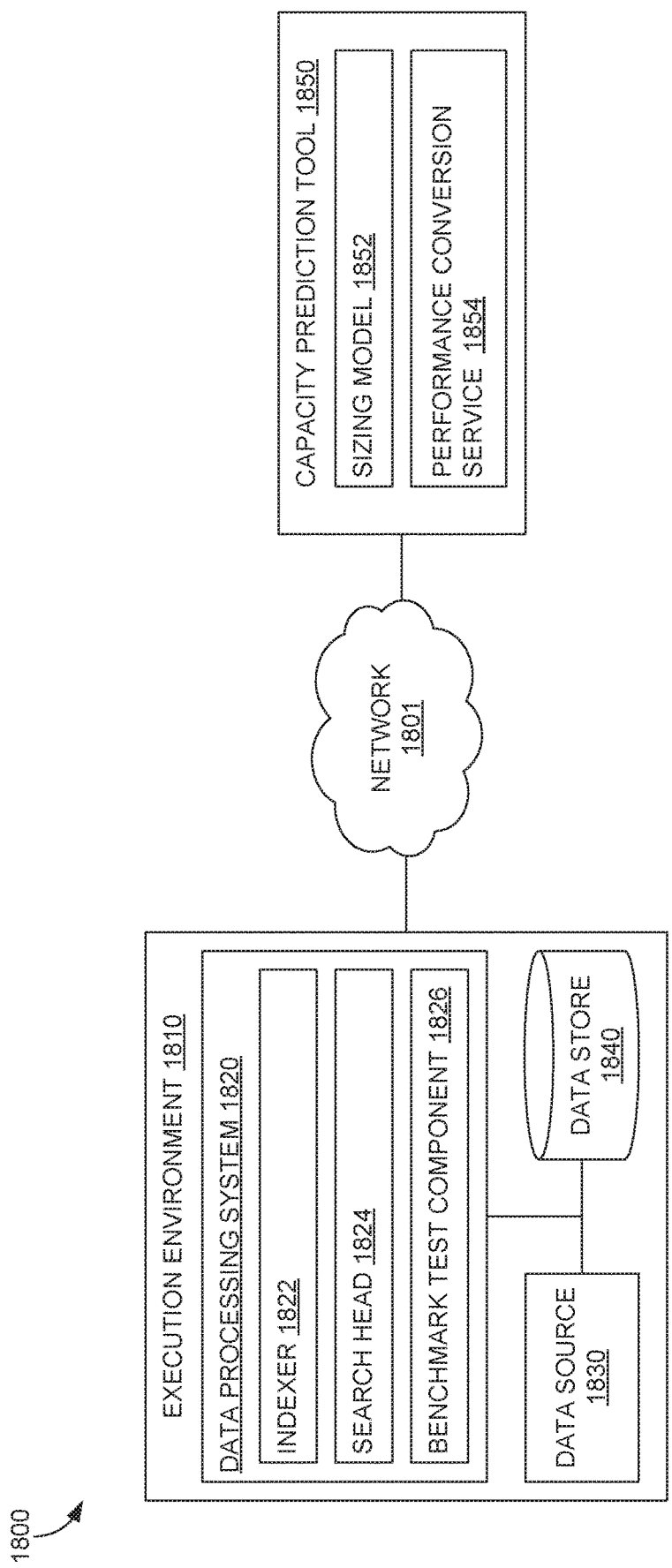
FIG. 18 depicts a block diagram of an example data processing environment.

FIG. 18 illustrates an example data processing environment 1800. In various examples, the data processing environment 1800 refers to an environment that provides for, or enables, the management, storage, retrieval, processing, and/or analysis of data. As shown in FIG. 18, the data processing environment includes a capacity prediction tool 1850 used to predict capacity (e.g., execution platform requirements) for execution environment 1810. At a high level, execution environment 1810 may be configured to perform any number of tasks, such as management, storage, retrieval, processing, and/or analysis of data. To provide optimal provisioning, execution environment 1810 should be sized according to the expected capacity needs for an expected task. More specifically, different types of deployed configurations (e.g., deployments) within an execution environment can produce different levels of performance. Example deployed configurations can include a physical and/or logical component topology (e.g., numbers of search heads, indexers, forwarders, etc.), a software configuration (number of instances), an allocation of software to components (e.g., physical machines, virtual machines, containers, etc.) in an execution environment, and the like. Given a desired set of workload input parameters for execution environment 1810 (e.g. event ingesting volume per day, search number per day, etc.), capacity prediction tool 1850 can predict execution platform requirements for execution environment 1810, such as a recommended deployed configuration (e.g., deployment). As used herein, an execution platform requirement should be understood to include minimum and recommended configurations, specifications, and the like.

In the example illustrated in FIG. 18, capacity prediction tool 1850 includes a sizing model 1852 and a performance conversion service 1854. Although the capacity prediction tool 1850 is illustrated and described herein as a separate component, this is for illustrative purposes. As can be appreciated, the capacity prediction tool 1850, or functions described in association therewith, can be performed at various components, such as a client device, an indexer, a search head, a server, a set of servers, or any other component(s). For example, some functionality described in association with the capacity prediction tool 1850 might be performed at one server, while other functionality described in association with the capacity prediction tool 1850 might be performed at another server. It should be understood that this and other arrangements described herein are set forth only as examples. Other arrangements and elements (e.g., machines, interfaces, functions, orders, groupings of functions, etc.) can be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by one or more entities may be carried out by hardware, firmware, and/or software. For instance, various functions may be carried out by a processor executing instructions stored in memory.

In various examples, sizing model 1852 can predict execution platform requirements given a set of workload input parameters. As explained in more detail below, sizing model 1852 can be generated based on benchmark testing performed on different test configurations on different types of reference hardware. As such, sizing model 1852 may work well for predicting execution platform requirements for reference hardware, but may not account for different hardware capabilities of different execution environments. Accordingly, performance conversion service 1854 can predict a measure of performance based on benchmark values for execution environment 1810 (e.g., hardware specification or other execution environment configuration, runtime metrics, search performance, etc.). For example, performance conversion service 1854 can predict a performance delta value representing a measure of relative performance between a designated (e.g., customer) execution environment and a reference execution environment. The performance delta value can reflect a difference in expected performance of one or more tasks (e.g., search/indexing performance) between the two environments. As such, the performance delta value can be used to adjust the execution platform requirements predicted by sizing model 1852 and tailor the prediction to execution environment 1810.

Sizing model 1852 and performance conversion service 1854 can use benchmark values from various execution environments in various ways. For example, sizing model 1852 and performance conversion service 1854 can be generated from benchmark values from various execution environments. Sizing model 1852 can be trained with benchmark values for different test configurations in a particular execution environment (e.g., a controlled or lab environment) using different types of reference hardware. Performance conversion service 1854 can include a machine learning model that is trained with benchmark values for a baseline deployed configuration on different execution environments with different types of hardware. In operation, benchmark values from any execution environment can be used by performance conversion service 1854 to adjust a prediction of execution platform requirements generated by sizing model 1852 to tailor the prediction to the execution environment. Furthermore, benchmark values for an execution environment implementing predicted execution platform requirements can be used to validate and/or tune sizing model 1852 and/or performance conversion service 1854.

Benchmark values for an execution environment can be generated, determined, or otherwise accessed in any number of ways. In some embodiments, benchmark testing can be performed on an execution environment (e.g., execution environment 1810) to generate the benchmark values. Benchmark testing is performance testing that is performed on a particular deployed configuration and execution environment. Benchmark testing can be performed in various ways. For example, a benchmark test application can be provided to run or otherwise facilitate the benchmark testing. The benchmark test application can be any type of application, can be hosted at least partially by one or more servers (e.g., as a web application), installed and/or operated locally (e.g., as benchmark test component 1826), incorporated or integrated into an application or tool (e.g., an application performance management tool or application) or an add-on or plug-in to an application or tool, some combination thereof, or otherwise. In some embodiments, benchmark testing can be performed through an application programming interface (API), a web service, or some other form of electronic communication.

In some embodiments, the benchmark test application can include a defined and/or pre-loaded benchmark suite. The benchmark suite may be a performance test workload with one or more simulation values. By way of nonlimiting example, the simulation values may include ingestion data volume, sourcetype, data cardinality, search concurrency, search types, search time range, search commands, and/or others. The performance test workload may be designed to approximate an expected usage pattern in order to simulate an expected performance of a target system under test. The performance test workload may include an expected typical workload, multiple workloads, or other scenarios that may reflect different expected usage patterns.

In operation, the benchmark test application may trigger a simulation of a defined performance test workload (e.g., with a defined ingestion data volume, sourcetype, data cardinality, etc.) and may collect one or more defined benchmark values. By way of nonlimiting example, the benchmark test application may be configured to collect benchmark values indicative of indexing performance (e.g., indexing throughput, indexing lag, internal pipeline usage, system resource usage, etc.), and the indexing performance may be used to generate a normalized indexing performance score for the target system under test. Additionally or alternatively, the benchmark test application may be configured to simulate a defined search workload (e.g., with a defined search concurrency, search types, search time range, search command, etc.) and collect benchmark values indicative of search performance (e.g., search throughput, search response time, skip search rate, search quota usage, system resource usage, etc.). In this example, the search performance may be used to generate a normalized search performance score for the target system under test. In some embodiments, the benchmark test application may be configured to adapt one or more simulation values to measure maximum performance. For example, search concurrency may be increased to a maximum concurrency value that coincides with one or more break points (e.g., where search throughput and response time begins to degrade). In some embodiments, the higher the CPU core number of a target system under test, the higher the concurrency value may be pushed. The foregoing are meant simply as examples, and any suitable performance test workload may be simulated, and any suitable benchmark value may be collected.

Benchmark values collected from a particular execution environment and deployed configuration can reflect any type of performance of interest, and can include configuration and measurement data such as runtime metrics, indexing and/or search performance, test scenarios, execution environment configuration, and the like. Test scenarios can include specified and/or simulated values such as data sample type, data volume, search command, search concurrency (e.g., the number of global concurrent searches that a machine can run), etc. Execution environment configuration can include hardware or software specifications of components in the execution environment (e.g., CPU, memory, disk IO, OS, threads, etc.), physical and/or logical component topologies (e.g., search heads, indexers, forwarders, etc.), software configurations (e.g., number of instances), an allocation of software (e.g., instances, logical components, etc.) to components (e.g., physical machines, virtual machines, containers, etc.) in the execution environment, resources allocated to software (e.g., CPU, memory, disk IO, OS, threads, etc.), and the like. Runtime metrics can include resource usage or characteristics during a particular test scenario (e.g., CPU/GPU performance, hard drive performance, RAM size, latency, disk IO measurements, throughput and response times, etc.). Indexing and/or search performance can include indexing and/or search throughput, max search number per day, time duration for any step, one or more normalized scores, and/or the like. These are simply meant as examples, and another other type of benchmark values can be collected from a particular execution environment and deployed configuration.

In some embodiments, benchmark values are collected for a baseline deployed configuration, such as a designated physical and/or logical component topology (e.g., one indexer and one search head), a designated software configuration (e.g., one instance of a software application), and/or a designated allocation of software to components (e.g., one instance operating on one machine). For example, where the software application is Splunk® Enterprise, the baseline deployed configuration can be a single instance of the application, which serves as both an indexer and a search head, where the single instance can be fed data from any number of forwarders. Many types of deployed configurations are possible, whether or not used as a baseline. For example, some deployed configurations may involve some other software configuration, such as multiple instances of an application. Continuing the example above, where the software application is Splunk® Enterprise, multiple instances can be deployed in any number of ways (e.g., separate instances on separate physical machines, virtual machines, clusters, etc.). The multiple instances can implement any type of topology (e.g., single search head with multiple indexers, search head cluster with multiple indexers, indexer cluster with groups of indexers configured to replicate each others' data, etc.). The multiple instances can be fed data from any number of forwarders. These and other variations will be understood by those of ordinary skill in the art.

In the embodiment illustrated in FIG. 18, a baseline deployed configuration is implemented with one indexer 1822 and one search head 1824 operating on a data processing system 1820, and indexer 1822 and search head 1824 are fed by data source 1830, which may include a forwarder. Data processing system 1820 can be implemented as a client device, a server, a set of servers, a cloud service, some combination therefore, and the like. Benchmark test component 1826 runs benchmark testing to collect benchmark values for the deployed configurations. In some embodiments, the collected benchmark values includes runtime metrics and/or search performance of the deployed configurations in execution environment 1810. The runtime metrics and/or search performance can be generated based on observations of behaviors of the components in execution environment 1810 (e.g., indexer 1822, search head 1824, data source 1830, data store 1840), or interactions between the components, when managing, storing, retrieving, processing, and/or analyzing data.

In one example, data can be collected and stored in the data store 1840 via an event-processing implementation. In such a case, data source 1830 may be a source of incoming data being fed into an event-processing system. A data source 1830 can be or include one or more external data sources, such as web servers, application servers, databases, firewalls, routers, operating systems, and software applications that execute on computer systems, mobile devices, sensors, and/or the like. Data source 1830 may be located remote from an event-processing system. For example, a data source 1830 may be defined on an agent computer operating remote from an event-processing system, such as on-site at a customer's location, that transmits data to an event-processing system via a communications network (e.g., network 1808).

The data from a data source 1830 can be a stream or set of data fed to a component of the event-processing system, such as a forwarder or an indexer. In some embodiments, the data can be machine-generated data received from various data sources 1830, such as servers, databases, applications, networks, and/or the like. The obtained data may include, for example raw data, such as server log files, activity log files, configuration files, messages, network packet data, performance measurements, sensor measurements, and/or the like. For example, the data may include log data generated by a server during the normal course of operation (e.g. server log data). In some embodiments, the data may be minimally processed to generate minimally processed data. For example, the data may be received from a data source 1830, such as a server. The data may then be subjected to a small amount of processing to break the data into events. An event generally refers to a portion, or a segment of the data, that is associated with a time. And, the resulting events may be indexed (e.g., stored in a raw data file associated with an index file). In some embodiments, indexing the data may include additional processing, such as compression, replication, and/or the like.

As can be appreciated, data might be structured data or unstructured data. Structured data has a predefined format, wherein specific data items with specific data formats reside at predefined locations in the data. For example, data contained in relational databases and spreadsheets may be structured data sets. In contrast, unstructured data does not have a predefined format. This means that unstructured data can comprise various data items having different data types that can reside at different locations.

An indexer of the event-processing system can receive the data, for example, from a forwarder or the data source 1830, and apportion the data into events. An indexer may be a component of the event-processing system that indexes data, transforming data into events and placing the results into a data store 1840, or index. An indexer may also search data store(s) 1840 in response to requests or queries. An indexer may perform other functions, such as data input and search management. In some cases, forwarders (not shown) handle data input, and forward the data to the indexers for indexing.

During indexing, and at a high-level, the indexer can facilitate taking data from its origin in sources, such as log files and network feeds, to its transformation into searchable events that encapsulate valuable knowledge. The indexer may acquire a raw data stream (e.g., data) from its source (e.g., data source 1830), break it into blocks (e.g., 64K blocks of data), and/or annotate each block with metadata keys. After the data has been input, the data can be parsed. This can include, for example, identifying event boundaries, identifying event timestamps (or creating them if they don't exist), masking sensitive event data (such as credit card or social security numbers), applying custom metadata to incoming events, and/or the like. Accordingly, the raw data may be data broken into individual events. The parsed data (also referred to as "events") may be written to a data store, such as an index or data store 1840.

The data store 1840 may include a medium for the storage of data thereon. For example, data store 1840 may include non-transitory computer-readable medium storing data thereon that is accessible by components of the environment 1800, such as capacity prediction tool 1850. As can be appreciated, the data store 1840 may store data in any manner. In some implementations, the data may include one or more indexes including one or more buckets, and the buckets may include an index file and/or raw data file (e.g., including parsed, time-stamped events). In some embodiments, each data store is managed by a given indexer that stores data to the data store and/or performs searches of the data stored on the data store. Although certain embodiments are described with regard to a single data store 1840 for purposes of illustration, embodiments may include employing multiple data stores 1840, such as a plurality of distributed data stores 1840.

In various examples, data may be stored in the form of events within the data store 1840, which may be represented by a data structure that is associated with a certain point in time and includes a portion of raw machine data (e.g., a portion of machine-generated data that has not been manipulated). An event may include, for example, a line of data that includes a time reference (e.g., a timestamp), and one or more other values. Some events may be associated with default values, such as a host value, a source value, a source type value and/or a time value. A default value may be common to some of all events of a set of source data.

Although utilization of an event-processing system has been described as one implementation for collecting data, observed data can be obtained in any number of ways and is not limited to such an implementation.

As such, benchmark test component 1826 can generate benchmark values based on observations of the components in execution environment 1810 managing, storing, retrieving, processing, and/or analyzing data. The benchmark values can be sent to capacity prediction tool 1850 via one or more networks, such as network 1801. Network 1801 may include an element or system that facilitates communication between the components of the environment 1800. Network 1801 may include an electronic communications network, such as the Internet, a local area network (LAN), a wide area network (WAN), a wireless local area network (WLAN), a cellular communications network, and/or the like. In some embodiments, network 1801 can include a wired or a wireless network. In some embodiments, network 1801 can include a single network or a combination of networks.

Figure 19:
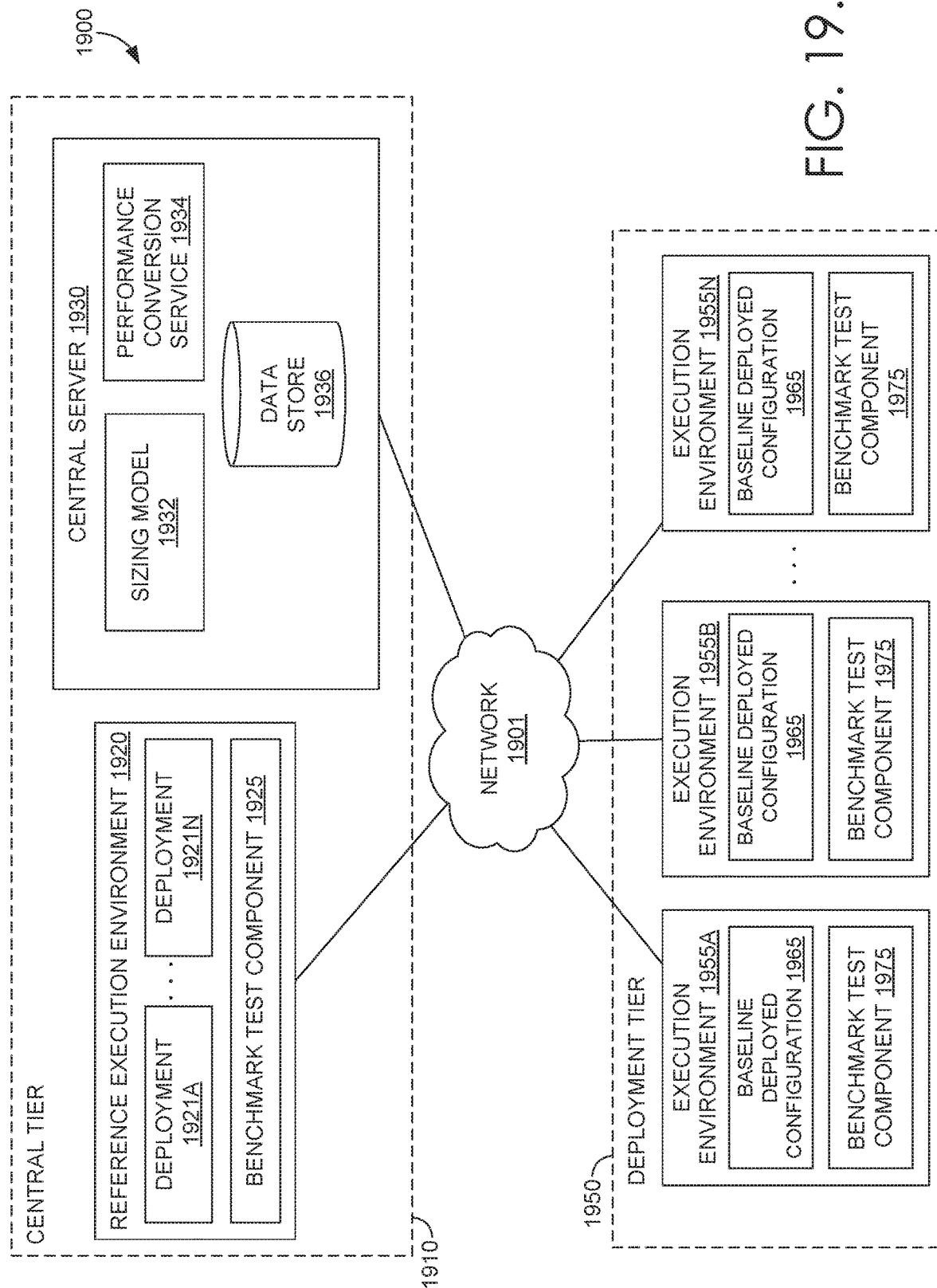
FIG. 19 depicts a block diagram of an example data processing environment.

FIG. 19 illustrates an example data processing environment 1900. In various examples, the data processing environment 1900 refers to an environment that provides for, or enables, the generation of a sizing model and a performance model for a performance conversion service. As shown in FIG. 19, the data processing environment includes a central tier 1910 and a deployment tier 1950. In central tier 1910, benchmark testing is performed on different test configurations in a reference execution environment 1920 to produce central-tier benchmark values. Sizing model 1932 is derived from the central-tier benchmark values to predict execution platform requirements based on various workload input parameters. In deployment tier 1950, benchmark testing is performed on a baseline deployed configuration in each of many execution environments (e.g., customer execution environments) to produce deployment-tier benchmark values. Performance conversion service 1934 includes a performance model derived from the deployment-tier benchmark values to predict a performance delta value for a particular execution environment using benchmark values for that environment as execution platform input parameters. The performance delta value can be used to adjust the predicted execution platform requirements and tailor them to the particular execution environment.

In various examples, central-tier testing is performed on various test configurations (e.g., expected deployed configurations) in a reference execution environment 1920, which may be a controlled environment, a lab setting, or some other reference environment comprising reference hardware, which may be standard, off-the-shelf hardware. Reference execution environment 1920 can include can include any number of hardware setups. Benchmark test component 1925 can perform benchmark testing on various test configurations (e.g., deployments 1921A through 1921N) to generate central-tier benchmark values, as explained in more detail above. The central-tier benchmark values can be stored in a data store 1936 and used to derive sizing model 1932.

For example, sizing model 1932 can be trained to predict execution platform requirements given a set of workload input parameters. The sizing model accepts desired workload input parameters (e.g., event ingesting volume per day, search number per day, etc.), and outputs the execution platform requirements that can handle the workload input parameters. The predicted execution platform requirements can take the form of a recommended computing configuration, such as a deployed configuration and/or an execution environment configuration (e.g. the number of indexers, the CPU needs, etc.). More specifically, the predicted execution platform requirements may include one or more projection values representing a measure of performance or capacity of a recommended computing configuration. For example, the projection values may comprise one or more hardware and/or software specifications or requirements, a physical and/or logical component topology (number of search heads, indexers, forwarders, clusters, etc.), a software configuration (number of instances, version, etc.), an allocation of software to components (number of physical machines, virtual machines, containers, etc.) in an execution environment, and the like. By using benchmark values for different deployed configurations to derive the sizing model, the sizing model can predict different types of deployed configurations (e.g., software configurations, component topologies, etc.). However, since the sizing model is derived based on benchmark testing conducted in a controlled environment, the model may not adequately account for hardware variations in the actual execution environments that will host the deployed configurations.

To account for potential performance variations in execution environments (e.g., customer hardware), a performance model can be learned based on benchmark values from different execution environments in the deployment tier 1950. The execution environments in the deployment tier may include non-standard hardware, complex topologies, or other configurations that have not been directly tested in the central tier. Benchmark test component 1975 can perform benchmark testing on a baseline deployed configuration 1965 in each of many execution environments 1955A through 1955N to generate deployment-tier benchmark values, as explained in more detail above. A data store 1936 for the benchmark values can be placed on, or otherwise made accessible to, a centralized server 1930, and the deployment-tier benchmark values can be sent to the data store 1936 via network 1901. Data store 1936 can be populated with deployment-tier benchmark values for many execution environments and central-tier benchmark values for a reference execution environment, and the benchmark values can be used to derive a performance model for performance conversion service 1934.

In some embodiments, deep learning is performed over the benchmark values to produce a performance model that predicts a performance delta value representing a measure of relative performance (e.g., search/indexing performance) between a particular execution environment and a reference execution environment, when supplied with benchmark values for the particular execution environment as execution platform input parameters. A performance model can be implemented using any type of machine learning model. In an example architecture, the performance model is a deep neural network (e.g., with three or more hidden layers having 62, 128, and 256 nodes, or another number of nodes). Training data can be generated from benchmark values from the deployment tier (e.g., baseline deployed configurations in each of many execution environments) and from the central tier (e.g., any number of test configurations on any number of reference hardware setups in a reference execution environment).

Collected benchmark values can be normalized into a suitable format for training. For example, configuration and/or measurement data of interest from the collected benchmark values (e.g., runtime metrics, search performance such as search response time and search throughput, execution environment configuration, test scenarios, and the like) can be encoded into an encoding vector for the input to the model. In some embodiments, the encoding vector can include one or more elements corresponding to the hardware specifications for the execution environment in which the benchmark testing was performed.

Ground truth labels can be generated by comparing benchmark values for a particular execution environment with corresponding benchmark values for a reference execution environment. The comparison can involve one or more arithmetic comparisons (e.g., differences in measured or encoded values), statistical comparisons (e.g., differences in mean, distribution spread, distribution shape, etc.), comparisons of gaps or outliers, and the like. By comparing benchmark values for a particular execution environment with corresponding benchmark values for a reference execution environment, a performance delta value can be determined reflecting a measure of relative performance between the two environments. In some embodiments, the performance delta value can take the form of a performance capacity percentage reflecting the relative performance between the hardware in a particular execution environment (e.g., a customer's hardware) and reference hardware in a reference execution environment. For example, if the performance delta value is 80%, the customer's hardware has 80% performance capacity of the closest reference hardware.

In various examples, a performance delta value can be designed to adjust the prediction generated by the sizing model. The sizing model accepts desired workload input parameters (e.g. event ingesting volume per day, search number per day) and outputs predicted execution platform requirements that may comprise one or more projection values. In some embodiments, a performance delta value can be learned for adjusting the predicted execution platform requirements to generate one or more adjusted projection values. Continuing with the example above, if a performance delta value is 80%, the predicted execution platform requirements can be divided by 0.8 and optionally rounded up. For example, for a given workload, if the closest reference hardware needs a cluster with 100 nodes, a customer's hardware with an 80% performance delta value will need a cluster with 125 nodes. Additionally or alternatively to the performance delta value being applied to the output of the sizing model, a performance delta value can be learned for adjusting an input to the sizing model (e.g. the workload input parameters). It will be understood that any type of performance delta value can be learned for a desired implementation. Accordingly, the performance model can be trained to predict a performance delta value for adjusting the prediction generated by the sizing model.

Figure 20:
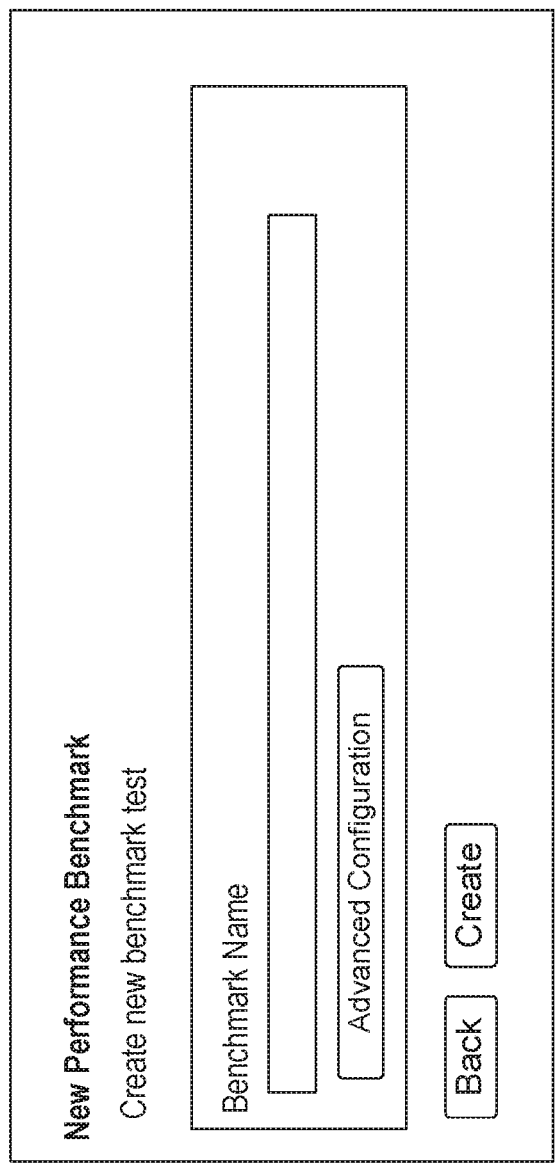
FIG. 20 depicts an example user interface that allows a user to create a performance benchmark.

FIGS. 20-24 depict illustrative user interfaces that may be used to initiate and view a prediction of capacity (e.g., execution platform requirements) for an execution environment. Generally, a user can interact with such interfaces via various input or interaction mechanisms. In some embodiments, the user can interact with the interfaces to initiate or enable benchmark testing or some other process to access or collect benchmark values. For example, a user may select an option via a selectable interaction element (e.g., button, dropdown list, checkbox, radio button, list box, toggle, text field, etc.), which may cause display of an interface such as interface 2000 of FIG. 20. FIG. 20 depicts an example user interface that allows a user to create a performance benchmark by running a benchmark test to access or collect benchmark values. In some embodiments, the user can create a name for the performance benchmark and configure any number of parameters for the benchmark test, for example, by specifying configuration and measurement data such as test scenarios, execution environment configuration, runtime metrics to measure, search performance to measure, and the like. Although some embodiments involve a user manually initiating benchmark testing, in some embodiments, benchmark testing or some other process to access or collect benchmark values may occur without requiring a manual initiation. Any number of performance benchmarks may be generated, for example, at different times, under different loading conditions, for different execution environment configurations, different test scenarios, and the like.

Figure 21:
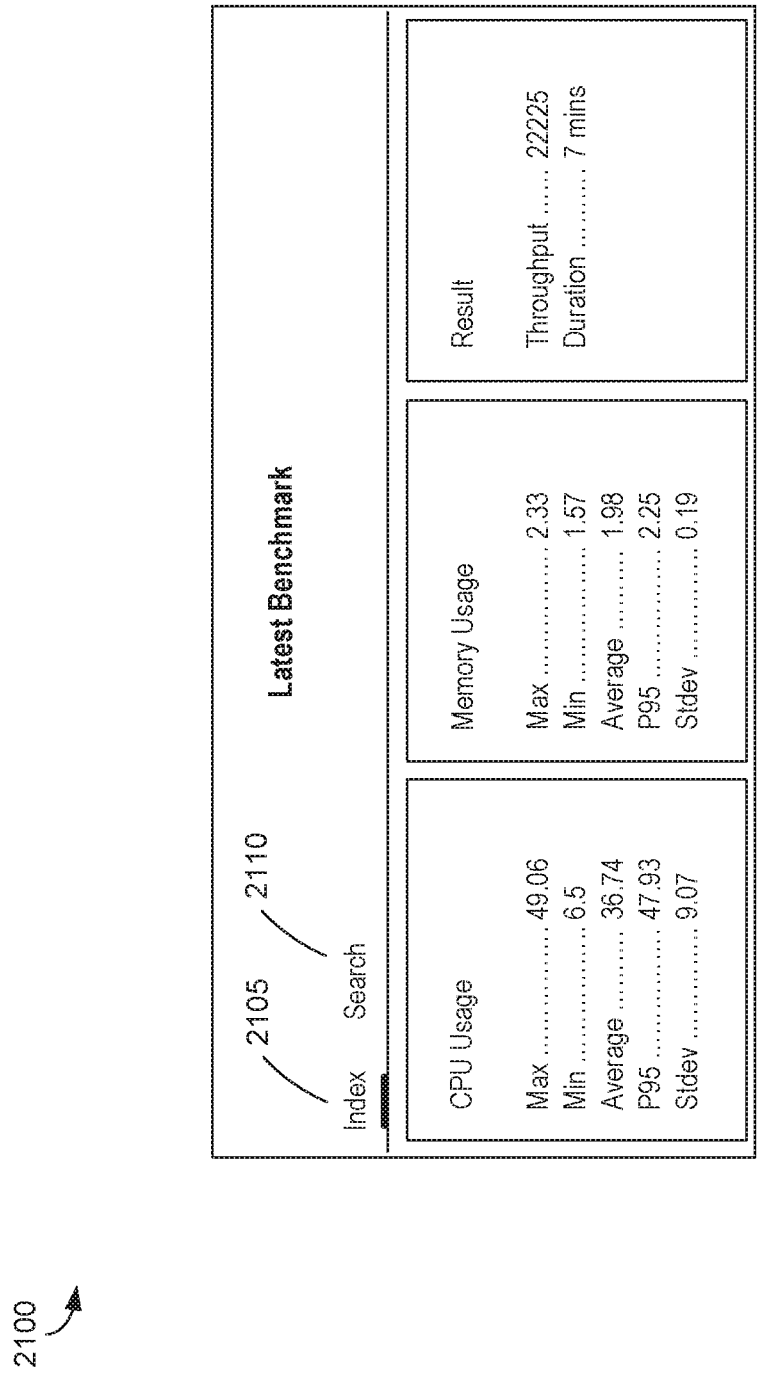
FIG. 21 depicts an example user interface presenting benchmark values for a performance benchmark.

FIG. 21 depicts an example user interface 2100 presenting benchmark values for a most recently generated performance benchmark. User interface 2100 can be presented as part of a benchmark test application, a performance management tool, or some other application or tool. User interface 2100 displays indexing benchmark values accessed or collected during benchmark testing for the performance benchmark. In the embodiment illustrated in FIG. 21, user interface 2100 displays indexing benchmark values including CPU usage, memory usage, and indexing throughput and response time. The benchmark values can be organized in any way, such as by category. For example, in the embodiment illustrated in FIG. 21, index and search tabs 2105 and 2010 can be selectable to display benchmark values corresponding to indexing and search performance, respectively. The benchmark values depicted in FIG. 21 is meant merely as an example, as any type of benchmark values may be collected, whether or not it is displayed.

Figure 22:
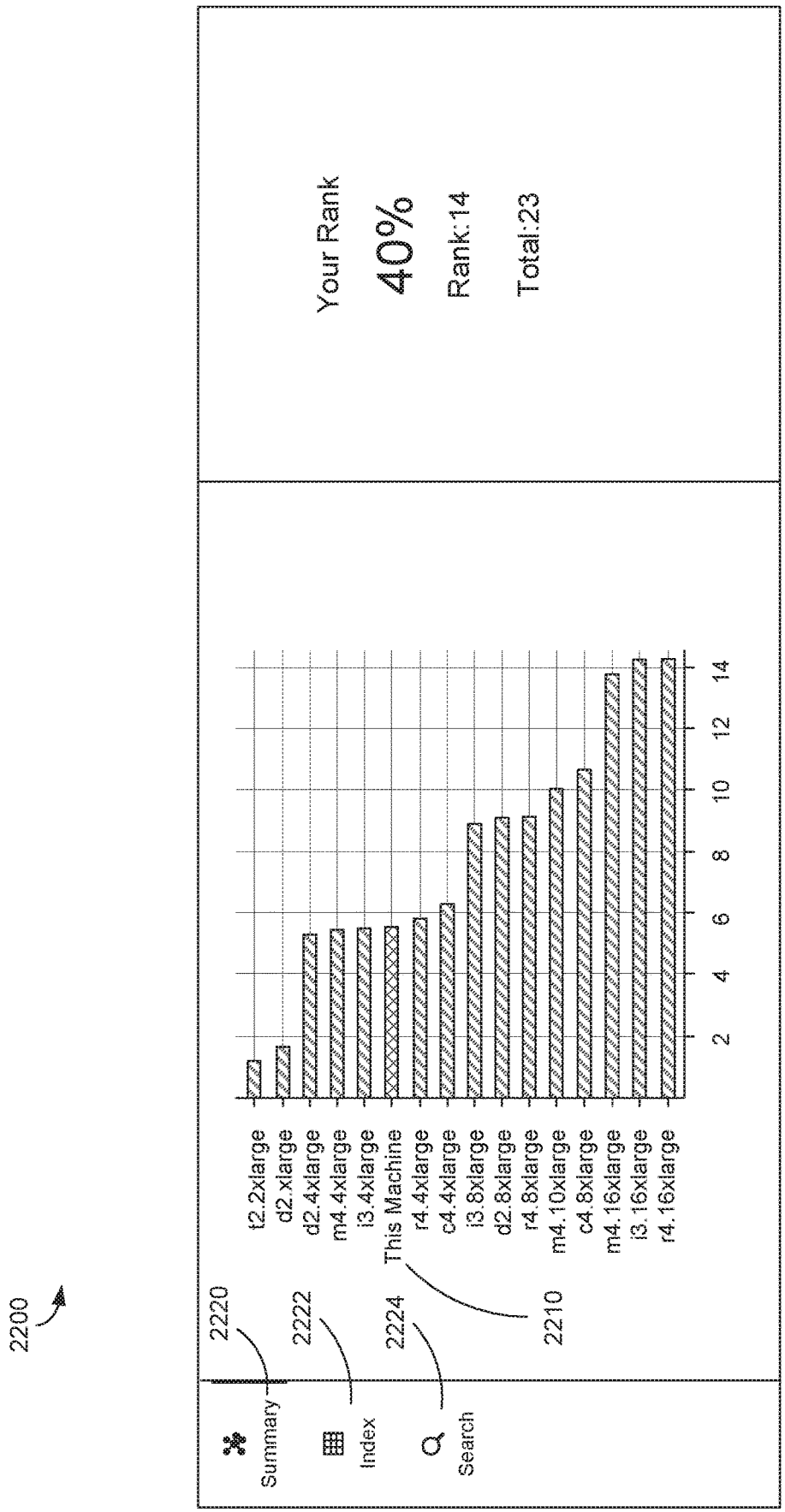
FIG. 22 depicts an example user interface presenting a comparison of benchmark test results.

FIG. 22 depicts an example user interface 2200 presenting a comparison of benchmark test results for a particular execution environment (machine 2210) with benchmark test results for a reference execution environment. The comparison can be presented as part of a benchmark test application, a performance management tool, or some other application or tool. A performance score reflecting the performance of the particular execution environment relative to various reference hardware can be determined from corresponding benchmark values using any suitable metric. The performance score can be normalized, calibrated, or otherwise. In the embodiment illustrated in FIG. 22, user interface 2200 presents a bar graph depicting normalized performance scores for the machine under test 2210 and for various reference hardware used to generate a sizing model. In the embodiment illustrated in FIG. 22, the reference hardware that best approximates the performance of the machine under test 2210 is i3.4xlarge. Performance scores can be computed using any suitable metric, and different performance scores can be computed, for example, for different categories of performance. For example, in the embodiment illustrated in FIG. 22, an overall measure of relative performance can be computed and presented based on a selection of summary icon 2220, a measure of relative indexing performance can be computed and presented based on a selection of index icon 2222, and a measure of relative search performance can be computed and presented based on a selection of search icon 2224. These are meant merely as examples, and any measure of relative performance may be computed, whether or not it is displayed.

In some embodiments, a user can interact with a user interface to initiate or enable a prediction of capacity (e.g., execution platform requirements) for an execution environment. For example, a user may select an option via a selectable interaction element (e.g., button, dropdown list, checkbox, radio button, list box, toggle, text field, etc.), which may cause display of an interface such as interface 2300 of FIG. 23. FIG. 23 depicts an example user interface that allows a user to predict a performance delta value and/or execution platform requirements for an execution environment based on benchmark values for the execution environment. The benchmark values can be obtained from a performance benchmark, benchmark test, and/or benchmark values that is specified by the user, automatically identified, or otherwise. For example, the user may select a most recent performance benchmark, and in response, fields of user interface 2300 can be populated with benchmark values for the performance benchmark (e.g., benchmark values 2310). In some embodiments, hardware specifications for the execution environment can be automatically detected (e.g., from benchmark values from benchmark testing, by performing a scan to detect the hardware specifications, etc.). For example, specifications 2320 may be automatically populated based on a customer's existing hardware capabilities. In some embodiments, a user may modify the benchmark values used for the prediction, for example, to predict performance for upgraded hardware. For example, one or more of specifications 2320 may be configurable using an interaction element (e.g., button, dropdown list, checkbox, radio button, list box, toggle, text field, etc.). Once the desired benchmark values has been selected, a user can select button 2330 to predict a performance delta value and/or execution platform requirements based on the selected benchmark values.

FIG. 24 depicts an example user interface 2400 presenting inputs and outputs for a sizing calculator. In this example, pane 2410 presents different categories of workload input parameters, including server specifications, daily ingestion volume, search workload, clustering and storage options, and parallelization configuration. Selection of any of the categories in pane 2410 can cause a presentation of a configurable workload input parameters for a selected category. For example, selection of the server specifications category can cause a presentation of pane 2420, which allows a user to configure workload input parameters for server specifications. In the embodiment illustrated in FIG. 24, the configurable workload input parameters include hardware specifications for a search head and indexer (e.g., physical CPU cores, memory size, max input/output operations per second, and effective storage) and desired headroom. One of the configurable workload input parameters may be a designation of reference hardware having specifications that best approximate the input server specifications. Continuing with the example discussed above with respect to FIG. 22, the closest reference hardware for machine under test 2210 is i3.4xlarge. In some embodiments, an initial designation may be automatically determined by default. Another possible configurable workload input parameter illustrated in FIG. 24 is server hardware calibration 2425. The server hardware calibration can be the performance delta value that was predicted using user interface 2300 and may be initially designated by default. In this example, the performance delta value is 102%, which indicates that the selected execution environment (e.g., the customer's hardware) performs 2% better than the selected reference execution environment.

Once the user has selected the desired workload input parameters, the user can select button 2335 to predict execution platform requirements based on the selected workload input parameters. In the example illustrated in FIG. 24, the predict execution platform requirements are presented in pane 2430 and include 1 search head and 3 indexers. Generally, the sizing calculator can predict the execution platform requirements that can handle the workload input parameters. For example, the predicted execution platform requirements can include one or more hardware and/or software specifications or requirements, a physical and/or logical component topology (search heads, indexers, forwarders, clusters, etc.), a software configuration (number of instances), an allocation of software to components (physical machines, virtual machines, containers, etc.) in an execution environment, and the like.

3.2 Illustrative Capacity Prediction Operations

Figure 25:
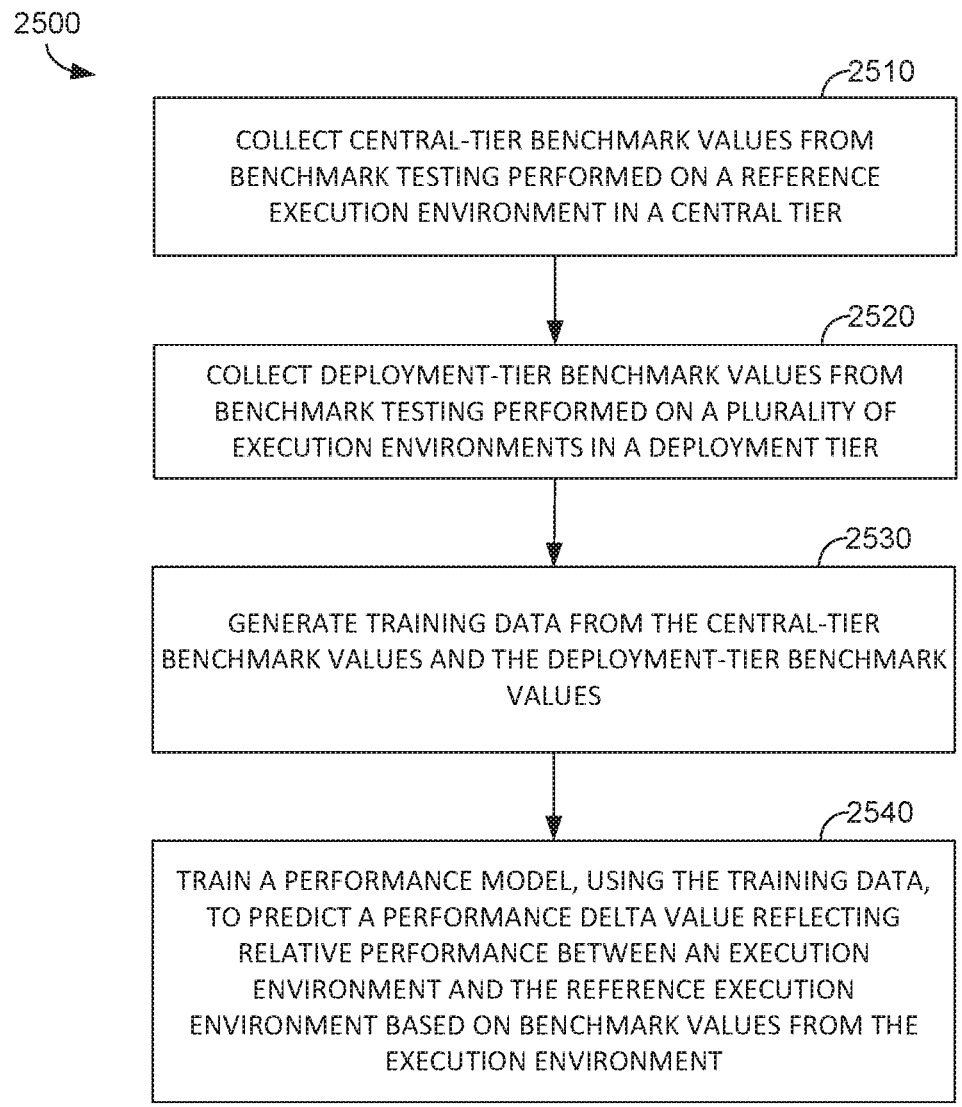
FIG. 25 is a flow diagram depicting an illustrative method of deriving a performance model.
Figure 26:
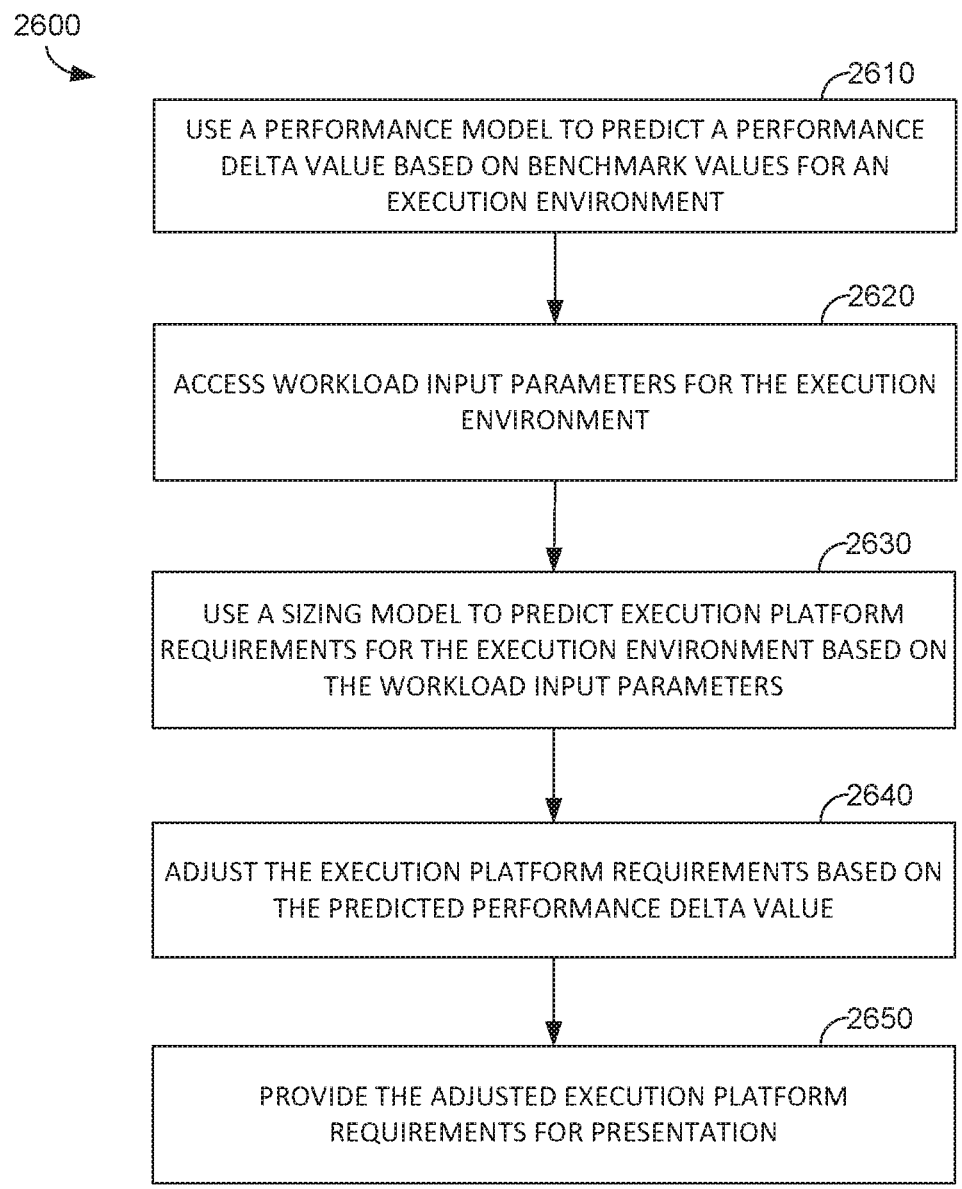
FIG. 26 is a flow diagram depicting another illustrative method of predicting execution platform requirements.
Figure 27:
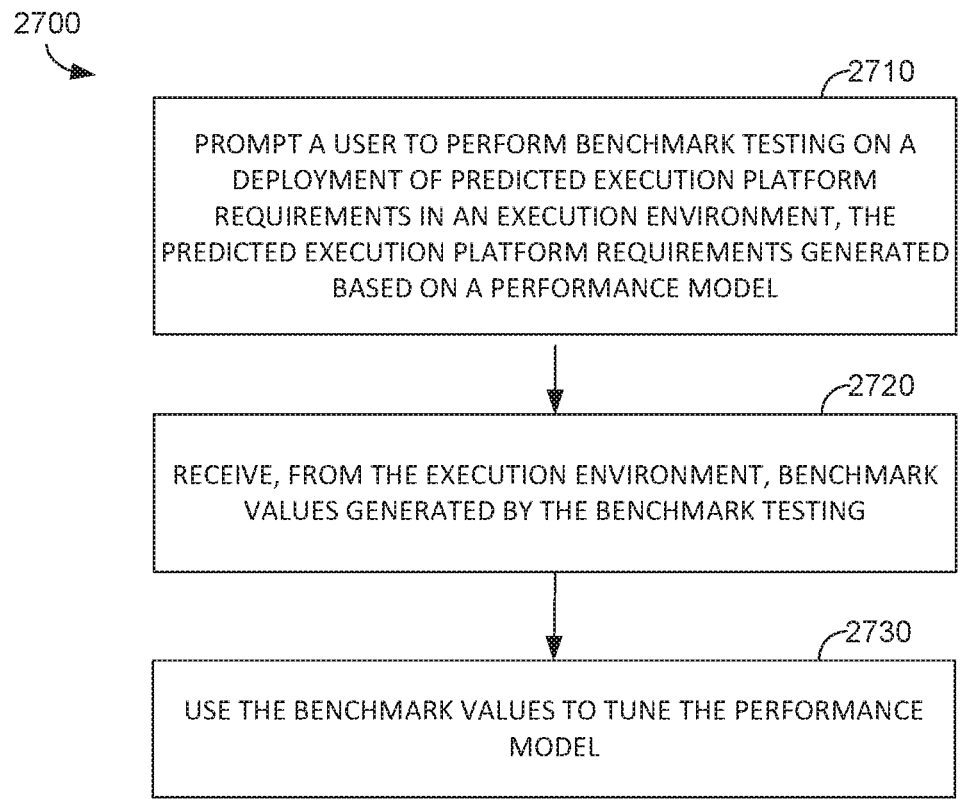
FIG. 27 is a flow diagram depicting yet another illustrative method of providing feedback for tuning a performance model.

FIGS. 25-27 illustrate examples of various methods for. Although the method 2500 of FIG. 25, the method 2600 of FIG. 26, and the method 2700 of FIG. 27 are provided as separate methods, the methods, or aspects thereof, can be combined into a single method or combination of methods. As can be appreciated, additional or alternative steps may also be included in different embodiments.

With initial reference to FIG. 25, FIG. 25 illustrates a method of deriving a performance model. Such a method may be performed, for example, at central server 1930 of FIG. 19. Initially, at block 2510, central-tier benchmark values are collected from benchmark testing performed on a reference execution environment in a central tier. Generally, the reference execution environment may be a controlled environment, a lab setting, or some other reference environment. The reference execution environment includes reference hardware, which may be standard, off-the-shelf hardware, and can include can include any number of hardware setups. Benchmark testing in the central-tier can be performed on any number of test configurations across the reference hardware (e.g., a single instance of an application under test, multiple instances across any type of topology, etc.).

At block 2520, deployment-tier benchmark values are collected from benchmark testing performed on a plurality of execution environments in a deployment tier. For example, the deployment tier may comprise different execution environments for different customers of an application provider, and the central tier may comprise a lab environment operated by the application provider. The execution environments in the deployment tier may include non-standard hardware, complex topologies, or other configurations that have not been directly tested in the central tier. In some embodiments, the benchmark testing performed in the deployment tier is performed on a baseline deployed configuration (e.g., a single instance of an application under test) in each of the plurality of execution environments.

At block 2530, training data is generated from the central-tier benchmark values and the deployment-tier benchmark values. For context, a sizing model that predicts execution platform requirements for performing a particular task can be learned based on the central-tier benchmark values, but may not adequately account for differences between the reference hardware used to generate the sizing model and an execution environment (e.g., a customer's hardware) in which the task is to be performed. Training data can be generated for learning a performance model that predicts a performance delta value from a set of execution platform input parameters (e.g., an encoding vector reflecting a desired set of benchmark values from an execution environment). The performance delta value can be designed to reflect the relative performance between the execution environment (e.g., the customer's hardware) and the reference environment (e.g., the reference hardware) used to generate the sizing model, such that a predicted performance delta value can be used to adjust the execution platform requirements predicted by the sizing model to account for differences between the two environments. At block 2540, the performance model is trained, using the training data, to predict a performance delta value reflecting relative performance between an execution environment and the reference execution environment using benchmark values from the execution environment.

Turning now to FIG. 26, FIG. 26 illustrates a method of predicting execution platform requirements. Such a method may be performed, for example, at central server 1930 of FIG. 19. Initially, at block 2610, a performance model is used to predict a performance delta value using benchmark values for an execution environment (e.g., for a customer of an application provider). The benchmark values can come from the results of benchmark testing performed on the execution environment. In some embodiments, a user can provide hardware specifications, or other benchmark values, that differs from the benchmark values for the execution environment in which benchmark testing was performed. The identified benchmark values can be encoded into an encoding vector and used as execution platform input parameters for the performance model. At block 2620, workload input parameters for the execution environment can be accessed. For example, a user can provide the workload input parameters based on a desired workload. At block 2630, a sizing model is used to predict execution platform requirements for the execution environment based on the specified workload input parameters. At block 2640, the execution platform requirements are adjusted based on the predicted performance delta value. For example, if a performance delta value is 80%, the execution platform requirements can be divided by 0.8 and optionally rounded up. Thus, for a given workload, if the closest reference hardware needs a cluster with 100 nodes, a customer's hardware with an 80% performance delta value will need a cluster with 125 nodes. At block 2650, the adjusted execution platform requirements are provided for presentation.

With respect to FIG. 27, FIG. 27 illustrates a method of providing feedback for tuning a performance model. Such a method may be performed, for example, at central server 1930 of FIG. 19. Initially, at block 2710, a user (e.g., a customer of an application provider) is prompted to perform benchmark testing on a deployment of predicted execution platform requirements in an execution environment. The predicted execution platform requirements were generated based on a performance model. For example, a performance delta value predicted by the performance model can be used to adjust an initial set of execution platform requirements to generate the predicted execution platform requirements. The deployment under test (deployed configuration) may be a baseline or partial deployment (e.g., a single instance of an application under test, a cluster of nodes with each running an instance, etc.) operating with a representative subset of the predicted execution platform requirements (e.g., a predicted logical component topology such as a number of search heads, indexers, forwarders, etc.). In this manner, benchmark testing can be performed on less than a full size predicted execution platform, thereby requiring fewer resources for testing. At block 2720, benchmark values generated by the benchmark testing is receiving from the execution environment. At block 2730, the benchmark values are used to tune the performance model. For example, a training data point can be generated from the benchmark values, and the performance model can be trained with the data point. In this manner, the performance model can be continually improved over time. Additionally or alternatively, the benchmark values generated by the benchmark testing of the predicted execution platform requirements can be used to predict an updated performance delta value and/or execution platform requirements. The process of predicting and testing may be repeated, as desired, to optimize performance.

Over time, the accuracy of the performance model should improve. Eventually, once the model has been trained with enough benchmark values from benchmark testing performed in the deployment tier such that the training data has enough coverage for all (or almost all) hardware types, subsequent benchmark testing in the deployment tier may be ceased in some or all cases. In one nonlimiting example, a user may decide to skip benchmark testing in the deployment tier, instead simply providing hardware specifications (or having them automatically detected and input) into a model to predict benchmark values for a performance benchmark, which may be input into the performance model to predict a performance delta value without running any testing. These and other variations for predicting a performance delta value are contemplated within the present disclosure.

3.3 Illustrative Hardware System

The systems and methods described above may be implemented in a number of ways. One such implementation includes computer devices having various electronic components. For example, components of the system in FIGS. 18 and 19 may, individually or collectively, be implemented with devices having one or more Application Specific Integrated Circuits (ASICs) adapted to perform some or all of the applicable functions in hardware. Alternatively, the functions may be performed by one or more other processing units (or cores), on one or more integrated circuits or processors in programmed computers. In other embodiments, other types of integrated circuits may be used (e.g., Structured/Platform ASICs, Field Programmable Gate Arrays (FPGAs), and other Semi-Custom ICs), which may be programmed in any manner known in the art. The functions of each unit may also be implemented, in whole or in part, with instructions embodied in a memory, formatted to be executed by one or more general or application-specific computer processors.

Figure 28:
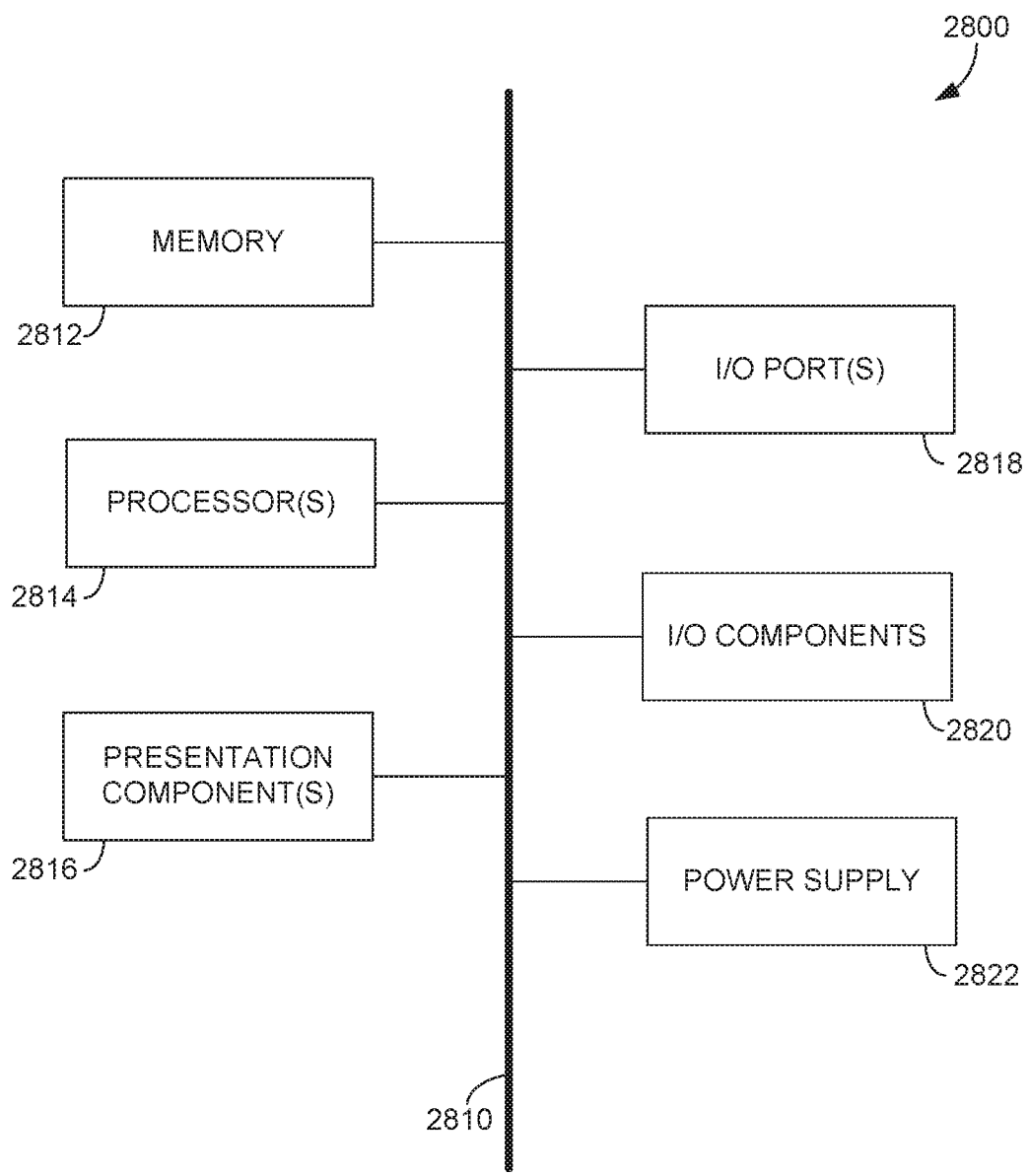
FIG. 28 is a block diagram of an example computing device.

An example operating environment is described below in order to provide a general context for the various examples described herein. Referring to FIG. 28, an illustrative operating environment is shown and designated generally as computing device 2800. Computing device 2800 is but one example of a suitable operating environment and is not intended to suggest any limitation as to the scope of use or functionality of the various examples described herein. Neither should the computing device 2800 be interpreted as having any dependency or requirement relating to any one or combination of components illustrated.

The examples discussed herein may be described in the general context of computer code or machine-useable instructions, including computer-executable instructions such as program modules, being executed by a computer or other machine, such as a personal data assistant or other handheld device. Generally, program modules including routines, programs, objects, components, data structures, etc., refer to code that perform particular tasks or implement particular abstract data types. The examples discussed herein may be practiced in a variety of system configurations, including handheld devices, consumer electronics, general-purpose computers, more specialized computing devices, etc. The examples discussed herein may also be practiced in distributed computing environments where tasks are performed by remote-processing devices that are linked through a communications network.

With reference to FIG. 28, computing device 2800 includes a bus 2810 that directly or indirectly couples the following devices: memory 2812, one or more processors 2814, one or more presentation components 2816, input/output (I/O) ports 2818, I/O components 2820, and an illustrative power supply 2822. Bus 2810 represents what may be one or more busses (such as, for example, an address bus, data bus, or combination thereof). Although depicted in FIG. 28, for the sake of clarity, as delineated boxes that depict groups of devices without overlap between these groups of devices, in reality, this delineation is not so clear cut and a device may well fall within multiple ones of these depicted boxes. For example, one may consider a display to be one of the one or more presentation components 2816 while also being one of the I/O components 2820. As another example, processors have memory integrated therewith in the form of cache; however, there is no overlap depicted between the one or more processors 2814 and the memory 2812. A person of skill in the art will readily recognize that such is the nature of the art, and it is reiterated that the diagram of FIG. 28 merely depicts an illustrative computing device that can be used in connection with the various examples described herein. It should also be noticed that distinction is not made between such categories as "workstation," "server," "laptop," "handheld device," etc., as all such devices are contemplated to be within the scope of computing device 2800 of FIG. 28 and any other reference to "computing device," unless the context clearly indicates otherwise.

Computing device 2800 typically includes a variety of computer-readable media. Computer-readable media can be any available media that can be accessed by computing device 2800 and includes both volatile and nonvolatile media, and removable and non-removable media. By way of example, and not limitation, computer-readable media may comprise computer storage media and communication media. Computer storage media includes both volatile and nonvolatile, removable and non-removable media implemented in any method or technology for storage of information such as computer-readable instructions, data structures, program modules, or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by computing device 2800. Computer storage media does not comprise signals per se, such as, for example, a carrier wave. Communication media typically embodies computer-readable instructions, data structures, program modules, or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above should also be included within the scope of computer-readable media.

Memory 2812 includes computer storage media in the form of volatile and/or nonvolatile memory. The memory may be removable, non-removable, or a combination thereof. Typical hardware devices may include, for example, solid-state memory, hard drives, optical-disc drives, etc. Computing device 2800 includes one or more processors 2814 that read data from various entities such as memory 2812 or I/O components 2820. Presentation component(s) 2816 present data indications to a user or other device. Illustrative presentation components include a display device, speaker, printing component, vibrating component, etc.

I/O ports 2818 allow computing device 2800 to be logically coupled to other devices including I/O components 2820, some of which may be built in. Illustrative components include a keyboard, mouse, microphone, joystick, game pad, satellite dish, scanner, printer, wireless device, etc. The I/O components 2820 may provide a natural user interface (NUI) that processes air gestures, voice, or other physiological inputs generated by a user. In some instances, inputs may be transmitted to an appropriate network element for further processing. An NUI may implement any combination of speech recognition, stylus recognition, facial recognition, biometric recognition, gesture recognition both on screen and adjacent to the screen, air gestures, head and eye tracking, and touch recognition (as described elsewhere herein) associated with a display of the computing device 2800. The computing device 2800 may be equipped with depth cameras, such as stereoscopic camera systems, infrared camera systems, RGB camera systems, touchscreen technology, and combinations of these, for gesture detection and recognition. Additionally, the computing device 2800 may be equipped with accelerometers or gyroscopes that enable detection of motion.

As can be understood, implementations of the present disclosure provide for various approaches to data processing. Various examples have been described in relation to particular embodiments, which are intended in all respects to be illustrative rather than restrictive. Alternative embodiments will become apparent to those of ordinary skill in the art to which the various examples described herein pertain without departing from its scope.

From the foregoing, it will be seen that examples discussed herein are well adapted to attain all the ends and objects set forth above, together with other advantages which are obvious and inherent to the system and method. It will be understood that certain features and subcombinations are of utility and may be employed without reference to other features and subcombinations. This is contemplated by and is within the scope of the claims.

What is claimed is:

1. A computer-implemented method comprising: generating a performance delta value representing a predicted performance difference between hardware in a particular execution environment and reference hardware in a reference execution environment, by processing an encoded representation of a plurality of benchmark values representing observed performance measurements of the particular execution environment in a trained performance model;
   generating one or more execution platform requirements that size the reference execution environment to handle one or more workload input parameters by processing an encoded representation of the one or more workload input parameters in a trained sizing model;
   generating one or more adjusted execution platform requirements for the particular execution environment by adjusting the one or more execution platform requirements for the reference execution environment with the performance delta value; and
   executing an operation in the particular execution environment, wherein the particular execution environment is configured using the one or more adjusted execution platform requirements.

2. The computer-implemented method of claim 1, the trained sizing model trained based on first benchmark testing on a plurality of test configurations deployed on the reference hardware in the reference execution environment, the one or more benchmark values generated based on second benchmark testing on a baseline deployed configuration deployed on the hardware of the particular execution environment distinct from the reference execution environment, wherein the performance delta value reflects a difference between performance by the reference hardware and the hardware of the particular execution environment.

3. The computer-implemented method of claim 1, the trained sizing model trained based on first benchmark testing on a plurality of test configurations deployed in the reference execution environment in a central tier, the trained performance model trained based on second benchmark testing on a plurality of deployed configurations deployed in a deployment tier comprising a plurality of execution environments distinct from the reference execution environment.

4. The co mputer-implemented method of claim 1, the trained performance model trained based on benchmark testing on a plurality of deployed configurations comprising a baseline deployed configuration deployed in each of a plurality of execution environments distinct from the reference execution environment.

5. The co mputer-implemented method of claim 1, the trained performance model trained based on benchmark testing on a baseline deployed configuration comprising a single instance of an application operating as a search head and an indexer.

6. The computer-implemented method of claim 1, the trained performance model trained based on benchmark testing performed by a benchmark test application provided by an application-provider that operates the reference execution environment.

7. The computer-implemented method of claim 1, the one or more benchmark values collected by a benchmark test application configured to trigger a simulation of a defined performance test workload and collect the one or more benchmark values based on the simulation.

8. The computer-implemented method of claim 1, the one or more benchmark values representing indexing performance value and search performance of the particular execution environment.

9. The computer-implemented method of claim 1, the one or more benchmark values collected by a benchmark test application configured to trigger a simulation and adapt at least one simulation value of the simulation to coincide with one or more break points of the particular execution environment.

10. The computer-implemented method of claim 1, wherein executing the operation comprises:
prompting an option to perform benchmark testing on a deployed configuration implementing the one or more adjusted execution platform requirements in the particular execution environment;
receiving, from the particular execution environment, one or more subsequent benchmark values representing one or more subsequent observed performance measures of the particular execution environment generated by the benchmark testing; and
using the one or more sub sequent benchmark values to tune the trained performance model.

11. The computer-implemented method of claim 1, the one or more observed performance measures comprising at least one of indexing throughput or a search count observed during benchmark testing of the particular execution environment.

12. The computer-implemented method of claim 1, wherein generating the performance delta value is further based on applying a representation of hardware specifications for the particular execution environment and the representation of the one or more benchmark values to the trained performance model.

13. One or more computer-readable storage media having instructions stored thereon, wherein the instructions, when executed by a computing device, cause the computing device to perform operations comprising:
generating a performance delta value representing a predicted performance difference between hardware in a particular execution environment and reference hardware in a reference execution environment, by processing an encoded representation of a plurality of benchmark values representing observed performance measurements of the particular execution environment in a trained performance model;
generating one or more execution platform requirements that size the reference execution environment to handle one or more workload input parameters, by processing an encoded representation of the one or more workload input parameters in a trained sizing model;
generating one or more adjusted execution platform requirements for the particular execution environment by adjusting the one or more execution platform requirements for the reference execution environment with the performance delta value; and
executing an operation in the particular execution environment, wherein the particular execution environment is configured using the one or more adjusted execution platform requirements.

14. The one or more computer-readable storage media of claim 13, the trained sizing model trained based on first benchmark testing on a plurality of test configurations deployed on the reference hardware in the reference execution environment, the one or more benchmark values generated based on second benchmark testing on a baseline deployed configuration deployed on the hardware of the particular execution environment distinct from the reference execution environment, wherein the performance delta value reflects a difference between performance by the reference hardware and the hardware of the particular execution environment.

15. The one or more computer-readable storage media of claim 13, the trained sizing model trained based on first benchmark testing on a plurality of test configurations deployed in the reference execution environment in a central tier, the trained performance model trained based on second benchmark testing on a plurality of deployed configurations deployed in a deployment tier comprising a plurality of execution environments distinct from the reference execution environment.

16. The one or more computer-readable storage media of claim 13, the trained performance model trained based on benchmark testing on a plurality of deployed configurations comprising a baseline deployed configuration deployed in each of a plurality of execution environments distinct from the reference execution environment.

17. The one or more computer-readable storage media of claim 13, the trained performance model trained based on benchmark testing on a baseline deployed configuration comprising a single instance of an application configured to operate as a search head and an indexer.

18. The one or more computer-readable storage media of claim 13, the trained performance model trained based on benchmark testing performed by a benchmark test application provided by an application-provider that operates the reference execution environment.

19. The one or more computer-readable storage media of claim 13, wherein executing the operation comprises:
prompting an option to perform benchmark testing on a deployed configuration implementing the one or more adjusted execution platform requirements in the particular execution environment;
receiving, from the particular execution environment, one or more subsequent benchmark values representing one or more subsequent observed performance measures of the particular execution environment generated by the benchmark testing; and
using the one or more sub sequent benchmark values to tune the trained performance model.

20. The one or more computer-readable storage media of claim 13, the one or more observed performance measures comprising at least one of indexing throughput or a search count observed during benchmark testing of the particular execution environment.

21. The one or more computer-readable storage media of claim 13, wherein generating the performance delta value is further based on applying a representation of hardware specifications for the particular execution environment and the representation of the one or more benchmark values to the trained performance model.

22. A computing device comprising:
one or more hardware processors; and a memory coupled with the one or more hardware processors, the memory having instructions stored thereon, wherein the instructions, when executed by the one or more hardware processors, cause the computing device to perform operations comprising:
  generating a performance delta value representing a predicted performance difference between hardware in a particular execution environment and reference hardware in a reference execution environment, by processing an encoded representation of a plurality of benchmark values representing observed performance measurements of the particular execution environment in a trained performance model;
  generating one or more execution platform requirements that size the reference execution environment to handle one or more workload input parameters by processing an encoded representation of the one or more workload input parameters in a trained sizing model;
  generating one or more adjusted execution platform requirements for the particular execution environment by adjusting the one or more execution platform requirements for the reference execution environment with the performance delta value; and
  executing an operation in the particular execution environment, wherein the particular execution environment is configured using the one or more adjusted execution platform requirements.

23. The computing device of claim 22, the trained sizing model trained based on first benchmark testing on a plurality of test configurations deployed on the reference hardware in the reference execution environment, the one or more benchmark values generated based on secondbenchmark testing on a baseline deployed configuration deployed on the hardware of the particular execution environment distinct from the reference execution environment, wherein the performance delta value reflects a difference between performance by the reference hardware and the hardware of the particular execution environment.

24. The computing device of claim 22, the trained sizing model trained based on first benchmark testing on a plurality of test configurations deployed in the reference execution environment in a central tier, the trained performance model trained based on second benchmark testing on a plurality of deployed configurations deployed in a deployment tier comprising a plurality of execution environments distinct from the reference execution environment.

25. The computing device of claim 22, the trained performance model trained based on benchmark testing on a plurality of deployed configurations comprising a baseline deployed configuration deployed in each of a plurality of execution environments distinct from the reference execution environment.

26. The computing device of claim 22, the trained performance model trained based on benchmark testing on a baseline deployed configuration comprising a single instance of an application configured to operate as a search head and an indexer.

27. The computing device of claim 22, the trained performance model trained based on benchmark testing performed by a benchmark test application provided by an application-provider that operates the reference execution environment.

28. The computing device of claim 22, wherein executing the operation comprises:
  prompting an option to perform benchmark testing on a deployed configuration implementing the one or more adjusted execution platform requirements in the particular execution environment;
  receiving, from the particular execution environment, one or more subsequent benchmark values representing one or more subsequent observed performance measures of the particular execution environment generated by the benchmark testing; and
  using the one or more sub sequent benchmark values to tune the trained performance model.

29. The computing device of claim 22, the one or more observed performance measures comprising at least one of indexing throughput or a search count observed during benchmark testing of the particular execution environment.

30. The computing device of claim 22, wherein generating the performance delta value is further based on applying a representation of hardware specifications for the particular execution environment and the representation of the one or more benchmark values to the trained performance model.

* * * * *